(12) United States Patent
Jin et al.

(10) Patent No.: US 9,240,366 B2
(45) Date of Patent: Jan. 19, 2016

(54) SEMICONDUCTOR DEVICE, SEMICONDUCTOR PACKAGE, AND ELECTRONIC SYSTEM

(71) Applicant: Samsung Electronics Co., Ltd., Suwon-si, Gyeonggi-do (KR)

(72) Inventors: Jeong-Gi Jin, Osan-si (KR); Ho-Joon Lee, Seoul (KR); Ji-Woong Sue, Yongin-si (KR); Joo-Hee Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/168,317

(22) Filed: Jan. 30, 2014

(65) Prior Publication Data

US 2014/0312491 A1    Oct. 23, 2014

(30) Foreign Application Priority Data

Apr. 22, 2013    (KR) .................. 10-2013-0044439

(51) Int. Cl.
*H01L 23/00* (2006.01)
*H01L 23/48* (2006.01)
(Continued)

(52) U.S. Cl.
CPC .......... *H01L 23/481* (2013.01); *H01L 23/3677* (2013.01); *H01L 23/5225* (2013.01); *H01L 24/06* (2013.01); *H01L 24/14* (2013.01); *H01L 25/0657* (2013.01); *H01L 23/3128* (2013.01); *H01L 23/522* (2013.01); *H01L 23/562* (2013.01); *H01L 24/03* (2013.01); *H01L 24/05* (2013.01); *H01L 24/13* (2013.01); *H01L 24/16* (2013.01);

(Continued)

(58) Field of Classification Search
CPC ....... H01L 23/481; H01L 24/14; H01L 24/06; H01L 23/5225; H01L 25/0657; H01L 23/3677; H01L 24/16
See application file for complete search history.

(56) References Cited

U.S. PATENT DOCUMENTS 6,281,844 B1 * 8/2001 Kodim et al. .......... 343/700 MS
8,080,870 B2    12/2011 Hu
(Continued)

FOREIGN PATENT DOCUMENTS

JP        3289858       4/1995
JP     2001-093863      4/2001
(Continued)

OTHER PUBLICATIONS

"Modeling of elastic deformation of miltilayers due to residual stresses and external bending"; issued on Jun. 15, 2013 in Journal of Applied Phyics.

(Continued)

*Primary Examiner* — William Coleman
(74) *Attorney, Agent, or Firm* — EIPG, PLLC

(57) ABSTRACT

Provided are a semiconductor device, a semiconductor package, and an electronic system. The device includes a substrate having a front side and a back side disposed opposite the front side. An internal circuit is disposed on or near to the front side of the substrate. Signal I/O through-via structures are disposed in the substrate. Back side conductive patterns are disposed on the back side of the substrate and electrically connected to the signal I/O through-via structures. A back side conductive structure is disposed on the back side of the substrate and spaced apart from the signal I/O through-via structures. The back side conductive structure includes parallel supporter portions.

23 Claims, 30 Drawing Sheets

(51) Int. Cl.
  H01L 23/367 (2006.01)
  H01L 25/065 (2006.01)
  *H01L 23/31* (2006.01)
  *H01L 23/522* (2006.01)

(52) U.S. Cl.
  CPC ............ *H01L 24/32* (2013.01); *H01L 24/73* (2013.01); *H01L 24/81* (2013.01); *H01L 2224/0346* (2013.01); *H01L 2224/0362* (2013.01); *H01L 2224/0401* (2013.01); *H01L 2224/0557* (2013.01); *H01L 2224/05082* (2013.01); *H01L 2224/05147* (2013.01); *H01L 2224/05155* (2013.01); *H01L 2224/05166* (2013.01); *H01L 2224/05176* (2013.01); *H01L 2224/05181* (2013.01); *H01L 2224/05184* (2013.01); *H01L 2224/05552* (2013.01); *H01L 2224/05568* (2013.01); *H01L 2224/05611* (2013.01); *H01L 2224/05644* (2013.01); *H01L 2224/05647* (2013.01); *H01L 2224/05655* (2013.01); *H01L 2224/06051* (2013.01); *H01L 2224/06136* (2013.01); *H01L 2224/06181* (2013.01); *H01L 2224/06517* (2013.01); *H01L 2224/06519* (2013.01); *H01L 2224/131* (2013.01); *H01L 2224/16145* (2013.01); *H01L 2224/16225* (2013.01); *H01L 2224/17517* (2013.01); *H01L 2224/17519* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01); *H01L 2225/06513* (2013.01); *H01L 2225/06517* (2013.01); *H01L 2225/06537* (2013.01); *H01L 2225/06541* (2013.01); *H01L 2225/06565* (2013.01); *H01L 2225/06589* (2013.01); *H01L 2924/10253* (2013.01); *H01L 2924/10271* (2013.01); *H01L 2924/10272* (2013.01); *H01L 2924/13091* (2013.01); *H01L 2924/14* (2013.01); *H01L 2924/15311* (2013.01); *H01L 2924/3511* (2013.01)

(56) References Cited

U.S. PATENT DOCUMENTS

| | | | |
|---|---|---|---|
| 2006/0176219 | A1* | 8/2006 | Lu et al. ............... 343/700 MS |
| 2007/0087529 | A1 | 4/2007 | Chung et al. |
| 2008/0296754 | A1 | 12/2008 | Hua et al. |
| 2009/0091402 | A1* | 4/2009 | Cho ............................ 333/26 |
| 2010/0320576 | A1 | 12/2010 | Hu |
| 2011/0031596 | A1 | 2/2011 | Gruenhagen et al. |
| 2011/0037255 | A1 | 2/2011 | Roussie |
| 2012/0262254 | A1* | 10/2012 | Dremelj et al. ............. 333/24 R |
| 2012/0319913 | A1* | 12/2012 | Tsutsumi et al. ............ 343/788 |
| 2013/0036821 | A1* | 2/2013 | Belkerdid et al. ............. 73/627 |
| 2014/0183684 | A1* | 7/2014 | Sadygov et al. ............. 257/443 |

FOREIGN PATENT DOCUMENTS

| | | |
|---|---|---|
| JP | 2002-151692 | 5/2002 |
| JP | 2003-324170 | 11/2003 |
| JP | 2009-238957 | 10/2009 |
| KR | 2005-0120138 | 12/2005 |
| KR | 2006-0075431 | 7/2006 |
| KR | 2012-0007645 | 1/2012 |

OTHER PUBLICATIONS

US 8,097,533, 01/2012, Matsumura et al. (withdrawn)

* cited by examiner

SEMICONDUCTOR DEVICE, SEMICONDUCTOR PACKAGE, AND ELECTRONIC SYSTEM

CROSS-REFERENCE TO RELATED APPLICATIONS

This application claims the benefit of priority under 35 U.S.C. §119 from Korean Patent Application No. 10-2013-0044439 filed on Apr. 22, 2013, the disclosure of which is hereby incorporated by reference in its entirety.

BACKGROUND

1. Field

Embodiments of the present general inventive concept provide a semiconductor device, a semiconductor package, and an electronic device and electronic system adopting the same.

2. Description of the Related Art

With a growing tendency toward lightweight, thin, and small-sized electronic devices, research into a technique of mounting thin semiconductor chips in a package has been conducted.

SUMMARY

Embodiments of the inventive concept provide a semiconductor device having through-via structures.

Other embodiments of the inventive concept provide a semiconductor device having supporter portions capable of preventing deformation, such as warpage of semiconductor chips.

Other embodiments of the inventive concept provide a semiconductor device having a stack chip structure.

Other embodiments of the inventive concept provide a semiconductor package including a plurality of chips.

Other embodiments of the inventive concept provide a semiconductor package including a plurality of chips, in which a supporter portion capable of preventing warpage of the chips is provided on any one of the chips.

Other embodiments of the inventive concept provide an electronic device and electronic system including the semiconductor device having supporter portions.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor device including a substrate having a front side and a back side disposed opposite the front side. An internal circuit is disposed on or near to the front side of the substrate. Signal input/output (I/O) through-via structures are disposed in the substrate. Back side conductive patterns are disposed on the back side of the substrate and electrically connected to the signal I/O through-via structures. A back side conductive structure is disposed on the back side of the substrate and spaced apart from the signal I/O through-via structures disposed in the substrate. The back side conductive structure includes parallel supporter portions.

In some embodiments, the back side conductive structure may be formed of the same material and thickness as the back side conductive patterns.

In other embodiments, the parallel supporter portions of the back side conductive structure may have a greater size than the back side conductive patterns.

In other embodiments, the back side conductive patterns may be disposed between the parallel supporter portions of the back side conductive structure.

In other embodiments, the parallel supporter portions of the back side conductive structure may be parallel to opposite side surfaces of the substrate.

Also, the parallel supporter portions of the back side conductive structure may be interposed between the back side conductive patterns and the side surfaces of the substrate.

In other embodiments, the back side conductive structure may further include a middle supporter portion interposed between the parallel supporter portions.

The middle supporter portion may pass between the back side conductive patterns.

The middle supporter portion may be interposed between middle portions of the parallel supporter portions.

The foregoing and/or other features and utilities of the present general inventive concept may also be achieved by providing a semiconductor device including a substrate having a front side and a back side disposed opposite the front side. An internal circuit is disposed on or near to the front side of the substrate. Signal I/O through-via structures are disposed in the substrate. Front signal I/O connection patterns are disposed on the front side of the substrate and electrically connected to the signal I/O through-via structures. Back side conductive patterns and a back side conductive structure are disposed on the back side of the substrate. The back side conductive patterns are electrically connected to the signal I/O through-via structures. The back side conductive structure is electrically insulated from the signal I/O through-via structures and formed of the same material and thickness as the back side conductive patterns.

In some embodiments, the back side conductive structure may include a first portion having a bar or line shape.

In other embodiments, the first portion of the back side conductive structure may be interposed between opposite first and second side surfaces of the substrate. The first portion of the back side conductive structure may pass between a middle portion of the first side surface and a middle portion of the second side surface.

In other embodiments, the back side conductive structure may include a first portion disposed parallel to opposite first and second side surfaces of the substrate, a second portion disposed perpendicular to the first portion, and a third portion disposed perpendicular to the first portion and parallel to the second portion.

The first portion may be interposed between the second and third portions.

In other embodiments, the substrate may include a semiconductor substrate having a front side and a back side, a front side insulating layer disposed on the front side of the semiconductor substrate, and a first back side insulating layer and a second back side insulating layer sequentially stacked on the back side of the semiconductor substrate.

The through-via structures may penetrate the semiconductor substrate and penetrate the first back side insulating layer, and the back side conductive patterns and the back side conductive structure may be interposed between the first back side insulating layer and the second back side insulating layer.

The semiconductor device may further include back side signal I/O connection patterns disposed on the second back side insulating layer. The back side signal I/O connection patterns may be electrically connected to the back side conductive patterns.

In other embodiments, the semiconductor device may further include a ground through-via structure disposed in the substrate. The ground through-via structure may be connected to the back side conductive structure and spaced apart from the signal I/O through-via structures The back side conductive structure may include a ground portion electrically connected to the ground through-via structure and a supporter portion disposed parallel to any one of side surfaces of the substrate. The ground portion and the supporter portion of the back side conductive structure may be electrically connected.

The foregoing and/or other features and utilities of the present general inventive concept may also be achieved by providing a semiconductor package including a first semiconductor chip disposed on a package substrate and having a first front side and a first back side disposed opposite the first front side. A second semiconductor chip is disposed on the first semiconductor chip. The second semiconductor chip has a second front side facing the first semiconductor chip and a second back side disposed opposite the second front side. An inter-chip bump is interposed between the first semiconductor chip and the second semiconductor chip. The first semiconductor chip includes a signal I/O through-via structure disposed in the first semiconductor chip, a back side conductive pattern disposed on the first back side of the first semiconductor chip and electrically connected to the signal I/O through-via structure, and a back side conductive structure disposed on the first back side of the first semiconductor chip and spaced apart from the signal I/O through-via structure. The second semiconductor chip includes a front side conductive pattern disposed on the second front side of the second semiconductor chip, the front side conductive pattern facing the back side conductive pattern. The inter-chip bump is interposed between the front side conductive pattern and the back side conductive pattern.

In some embodiments, the back side conductive structure may be formed of the same material and thickness as the back side conductive pattern.

In other embodiments, the back side conductive structure may include a pair of supporter portions disposed parallel to one another, the supporter portions having the same length.

In other embodiments, the semiconductor package may further include a plurality of front side dummy patterns disposed on the second front side of the second semiconductor chip.

The semiconductor package may further include buffer bumps interposed between the plurality of front side dummy patterns and the back side conductive structure. The back side conductive structure may face the plurality of front side dummy patterns, and the buffer bumps may physically connect the plurality of front side dummy patterns and the back side conductive structure.

The back side conductive structure may have a greater width than the front side dummy patterns.

The foregoing and/or other features and utilities of the present general inventive concept may also be achieved by providing an electronic system including a board and a semiconductor package disposed on the board. The semiconductor package includes a package substrate, and a semiconductor chip having a front side facing the package substrate and a back side disposed opposite the front side. The semiconductor chip includes a signal I/O through-via structure disposed in the semiconductor chip having the front side facing the package substrate and the back side disposed opposite the front side, and a back side I/O connection pattern and a back side conductive structure disposed on the back side of the semiconductor chip. The back side I/O connection pattern is electrically connected to the signal I/O through-via structure, and the back side conductive structure is spaced apart from the signal I/O through-via structure.

In some embodiments, the back side conductive structure may have a bar-shaped or line-shaped portion disposed parallel to any one of side surfaces of the semiconductor chip.

The foregoing and/or other features and utilities of the present general inventive concept may also be achieved by providing a method of forming a semiconductor device, comprising forming a plurality of through-via structures in a substrate, forming a plurality of first conductive patterns in electrical communication with the plurality of through-via structures on a first side of the substrate, forming a plurality of second conductive patterns in electrical communication with the plurality of through-via structures on a second side of the substrate opposite to the first side of the substrate, and forming a conductive structure on the second side of the substrate isolated from the plurality of second conductive patterns.

The method may further comprise forming a ground through-via structure in the substrate, wherein the conductive structure comprises a ground portion electrically connected to the ground through-via structure.

The method may further comprise forming a plurality of dummy conductive patterns on the first side of the substrate isolated from the plurality of first conductive patterns and the plurality of through-via structures.

The conductive structure may comprise parallel supporter portions.

The plurality of second conductive patterns may be disposed between the parallel support portions of the conductive structure.

A portion of the plurality of second conductive patterns may be disposed between the parallel support portions and the remainder of the plurality of second conductive patterns may be disposed outside of the parallel support portions.

The foregoing and/or other features and utilities of the present general inventive concept may also be achieved by providing a semiconductor package, including a first chip having a plurality of through-via structures electrically connected to a first plurality of conductive patterns on a first side of the first chip and to a second plurality of conductive patterns on a second side of the first chip, and further having a conductive structure formed on the second side of the first chip isolated from the second plurality of conductive patterns, wherein the conductive structure includes a portion contacting a third side of the first chip and extending to contact an opposite fourth side of the first chip, and a second chip having a third plurality of conductive patterns on a first side of the second chip, wherein the third plurality of conductive patterns is electrically connected to the second plurality of conductive patterns.

At least one of the plurality of through-via structures may be connected to ground and connected to the conductive structure.

The semiconductor package may further comprise a thermal interface material (TIM) layer in contact with the third and fourth sides of the first chip such that the TIM layer is in contact with the conductive structure.

The semiconductor package may further comprise a heat spreader in contact with the TIM layer.

BRIEF DESCRIPTION OF THE DRAWINGS

The foregoing and other features and advantages of the inventive concepts will be apparent from the more particular description of the embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE PREFERRED EMBODIMENTS

Figure 1A:
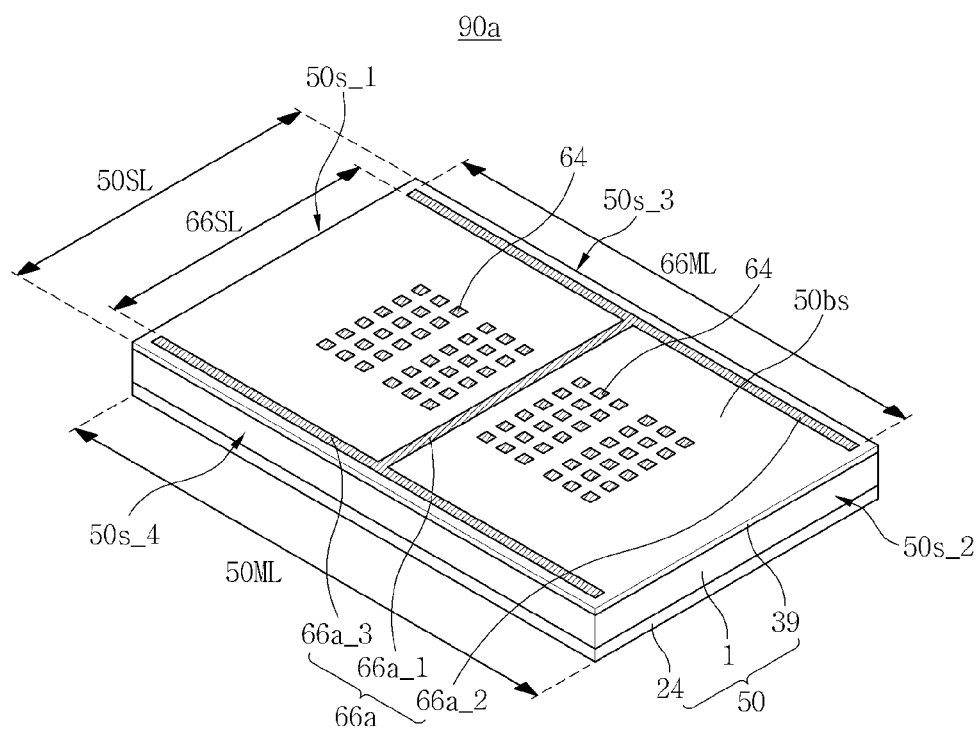
FIG. 1A is a perspective view of a semiconductor device according to exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

This present general inventive concept may be embodied in different forms and should not be construed as limited to the embodiments set forth herein. Rather, these embodiments are provided so that this disclosure will be thorough and complete and fully convey the scope of the inventive concept to those skilled in the art.

The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

The terminology used herein is for the purpose of describing particular embodiments only and is not intended to be limiting of the present general inventive concept. As used herein, the singular forms "a", "an" and "the" are intended to include the plural forms as well, unless the context clearly indicates otherwise. It will be further understood that the terms "comprises" and/or "comprising,", when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the term "and/or" includes any and all combinations of one or more of the associated listed items.

Spatially relative terms, such as "below", "beneath", "lower", "above", and "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the present general inventive concept are described herein with reference to cross-section and/or plan illustrations that are schematic illustrations of idealized embodiments of the inventive concept. In the drawings, the thicknesses of layers and regions are exaggerated for clarity. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

The same or similar numbers may be described with reference to other drawings even if they are neither mentioned nor described in the corresponding drawing. Also, even elements that are not denoted by reference numbers may be described with reference to other drawings.

In the present specification, relative terms, such as "front side" and "back side" and "upper side or top side" and "lower side or bottom side", may be used herein for ease of description to describe the present general inventive concept. For example, a front side or top side could be termed a first side, and a back side or bottom side could be termed a second side. Conversely, a back side or bottom side could be termed a first side, and a front side or top side could be termed a second side. However, to avoid confusion, the terms "front side" and "back side" are not used in the same sense or context.

In the present specification, a term "near" indicates that any one of at least two components having symmetric concepts is disposed nearer to another specific component than the others thereof. For instance, when a first end is near to a first side, it may be inferred that the first end is nearer to the first side than a second end or that the first end is nearer to the first side than a second side.

Figure 1B:
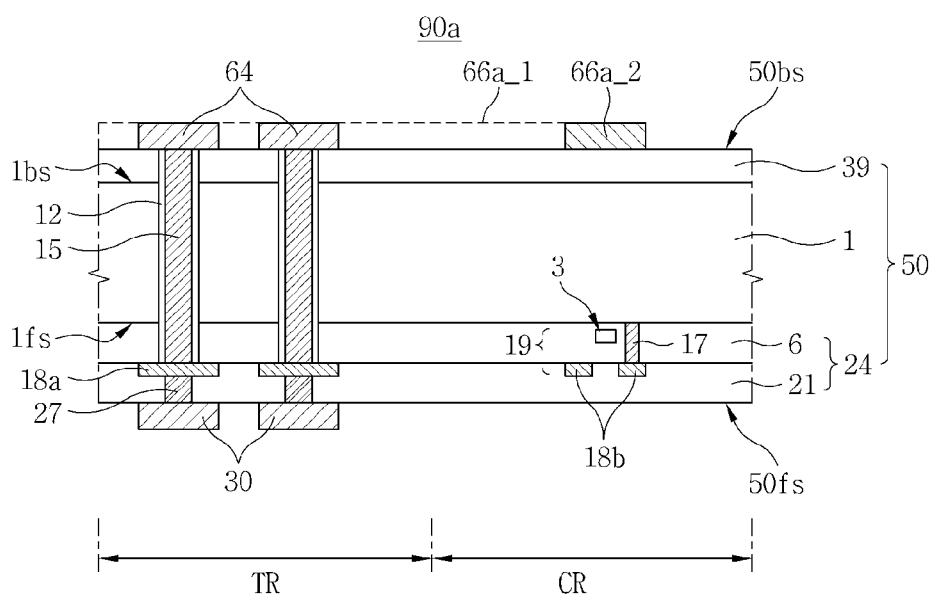
FIG. 1B is a conceptual cross-sectional view of the semiconductor device shown in FIG. 1A.

FIG. 1A is a perspective view of a semiconductor device according to exemplary embodiments of the present general inventive concept, and FIG. 1B is a conceptual cross-sectional view of the example of the semiconductor device shown in FIG. 1A.

Referring to FIGS. 1A and 1B, a semiconductor device according to the exemplary embodiment of the present general inventive concept may include a semiconductor chip 90a. The semiconductor chip 90a may include a substrate 50 having a front side 50fs and a back side 50bs disposed opposite the front side 50fs, front side conductive patterns 30 disposed on the front side 50fs of the substrate 50, and back side conductive patterns 64 and a back side conductive structure 66a disposed on the back side 50bs of the substrate 50. The back side conductive structure 66a may prevent occurrence of deformation, such as warpage of the semiconductor chip 90a. Also, the back side conductive structure 66a may radiate heat generated in the semiconductor chip 90a.

The substrate 50 may include an internal circuit region CR and a through electrode region TR. From a plan view, the substrate 50 may have a tetragonal shape. The substrate 50 may include first and second side surfaces $50s\_1$ and $50s\_2$, which may be disposed opposite each other, and third and fourth side surfaces $50s\_3$ and $50s\_4$, which may be perpendicular to the first and second side surfaces $50s\_1$ and $50s\_2$. The substrate 50 may include a semiconductor substrate 1, a front side insulating layer 24, a back side insulating layer 39, through-via structures 15, and an internal circuit 19.

The semiconductor substrate 1 may be, for example, a single crystalline silicon substrate, a silicon substrate including a silicon carbide (SiC) layer or a silicon germanium (SiGe) layer, or a silicon on insulator (SOI) substrate including an insulating layer. The semiconductor substrate 1 may have a front side 1fs and a back side 1bs disposed opposite the front side 1fs.

The front side insulating layer 24 may be disposed on the front side 1fs of the semiconductor substrate 1. The front side insulating layer 24 may include a lower front side insulating layer 6 and an upper front side insulating layer 21 sequentially stacked on the front side 1fs of the semiconductor substrate 1. The back side insulating layer 39 may be disposed on the back side 1bs of the semiconductor substrate 1.

The through-via structures 15 may penetrate the semiconductor substrate 1. The through-via structures 15 may include signal input/output (I/O) through-via structures.

In some embodiments, the through-via structures 15 may penetrate the semiconductor substrate 1 and also penetrate the back side insulating layer 39.

In some embodiments, the through-via structures 15 may penetrate the back side insulating layer 39 and the semiconductor substrate 1 and also penetrate the lower front side insulating layer 6 of the front side insulating layer 24.

Via insulating patterns 12 may be disposed to surround side surfaces of the through-via structures 15. The via insulating patterns 12 may insulate the through-via structures 15 from the semiconductor substrate 1.

The internal circuit 19 may include a unit element 3 disposed on the front side 1fs of the semiconductor substrate 1 and a line structure electrically connected to the unit element 3. The line structure may include a contact plug 17 and an internal line 18b. The unit element 3 may include an element such as a transistor, a diode, and/or a resistor, etc., constituting the internal circuit 19. The contact plug 17 may be formed through the lower front side insulating layer 6 and electrically connected to the unit element 3. The internal line 18b may be formed on the lower insulating layer 6, overlap the contact plug 17, and be electrically connected to the contact plug 17.

Via pads 18a may be disposed to cover the through-via structures 15 formed through the lower front side insulating layer 6. The via pads 18a may be electrically connected to the through-via structures 15. The via pads 18a may be formed of the same material and the same thickness as the internal line 18b. Internal vias 27 may be disposed through the upper front side insulating layer 21 and electrically connected to the via pads 18a.

The front side conductive patterns 30 may be disposed on the upper front side insulating layer 21 and cover the internal vias 27. The front side conductive patterns 30 may include front signal I/O connection patterns.

The back side conductive patterns 64 may cover the through-via structures 15 and be electrically connected to the through-via structures 15. The back side conductive patterns 64 may include back side signal input/output (I/O) connection patterns. The back side conductive patterns 64, the through-via structures 15, the via pads 18a, the internal vias 27, and the front side conductive patterns 30 may be arranged in a vertical direction and electrically connected. The back side conductive patterns 64 may be pads or bumps.

The back side conductive structure 66a may be spaced apart from the back side conductive patterns 64 including the back side signal I/O connection patterns. The back side conductive structure 66a may be spaced apart from the through-via structures 15 including the signal I/O through-via structures. The back side conductive structure 66a may be formed of the same material and thickness as the back side conductive patterns 64. For example, the back side conductive patterns 64 and the back side conductive structure 66a may include nickel (Ni), gold (Au), copper (Cu), tin silver (SnAg), tin (Sn), or a combination thereof.

The back side conductive patterns 64 may be disposed on the through electrode region TR of the substrate 50, and the back side conductive structure 66a may be disposed on the internal circuit region CR of the substrate 50. The back side conductive patterns 64 may overlap the through electrode region TR of the substrate 50, while the back side conductive structure 66a may overlap the internal circuit region CR of the substrate 50.

The back side conductive structure 66a may include a middle supporter portion 66a_1. The back side conductive structure 66a may include parallel side supporter portions 66a_2 and 66a_3.

Herein, the terms "middle" and "side" may be used for ease of description to describe one element's relationship to another element as illustrated in the figures, and positions of elements constituting the "back side conductive structure 66a" are not limited by the terms. For example, the term "middle supporter portion" could be termed a "first supporter portion," and the term "side supporter portions" could be termed "second and third supporter portions." Alternatively, the term "side supporter portions" could be termed "first and second supporter portions," and the term "middle supporter portion" could be termed "a third supporter portion."

The middle supporter portion 66a_1 of the back side conductive structure 66a may be parallel to the first and second side surfaces 50s_1 and 50s_2 of the substrate 50. The middle supporter portion 66a_1 may be disposed in a middle portion between the first side surface 50s_1 and the second side surface 50s_2 of the substrate 50. The middle supporter portion 66a_1 may pass between the back side conductive patterns 64. The middle supporter portion 66a_1 may have, for example, a bar or line shape. The middle supporter portion 66a_1 may have a length 66SL equal to at least about 10% of a length 50SL of the first and second side surfaces 50s_1 and 50s_2. The middle supporter portion 66a_1 may have a length 66SL equal to about 10% to about 95% of the length 50SL of the first and second side surfaces 50s_1 and 50s_2.

The side supporter portions 66a_2 and 66a_3 of the back side conductive structure 66a may be parallel to the third and fourth side surfaces 50s_3 and 50s_4 of the substrate 50. The side supporter portions 66a_2 and 66a_3 may include a first side supporter portion 66a_2 interposed between the back side conductive patterns 64 and the third side surface 50s_3 and a second side supporter portion 66a_3 interposed between the back side conductive patterns 64 and the fourth side surface 50s_4. The back side conductive patterns 64 may be interposed between the side supporter portions 66a_2 and 66a_3.

The first and second side supporter portions 66a_2 and 66a_3 may be parallel to each other and formed to have the same length, thickness, and width. Each of the first and second side supporter portions 66a_2 and 66a_3 may have a bar or line shape. The first and second side supporter portions 66a_2 and 66a_3 may have a length 66ML equal to at least about 10% of the length 50ML of the third and fourth side surfaces 50s_3 and 50s_4 of the substrate 50. The first and second side supporter portions 66a_2 and 66a_3 may have a length 66ML equal to about 10% to about 95% of the length 50ML of the third and fourth side surfaces 50s_3 and 50s_4 of the substrate 50.

The middle supporter portion 66a_1 may be disposed between the first and second side supporter portions 66a_2 and 66a_3. The middle supporter portion 66a_1 and the first and second side supporter portions 66a_2 and 66a_3 may be integrally connected. The middle supporter portion 66a_1 may be disposed between a middle portion of the first side supporter portion 66a_2 and a middle portion of the second side supporter portion 66a_3. The back side conductive structure 66a may have an H shape. The back side conductive structure 66a may prevent deformation, such as warpage of the semiconductor chip 90a, and serve to radiate heat, thereby improving reliability of the device.

Figure 2A:
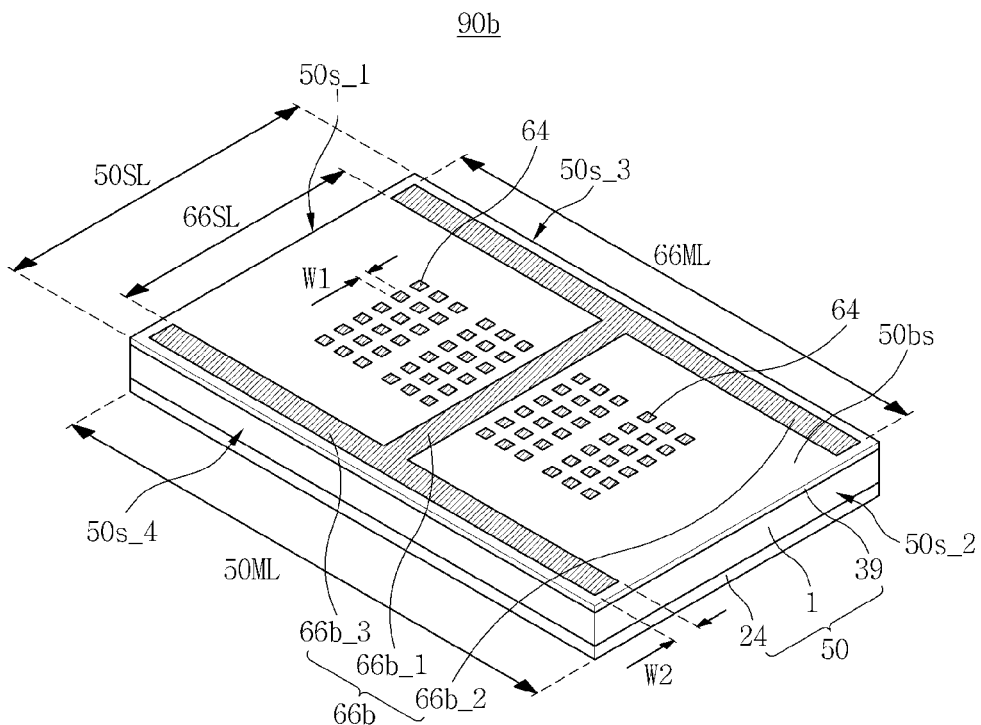
FIG. 2A is a perspective view of another semiconductor device according to exemplary embodiments of the present general inventive concept.
Figure 2B:
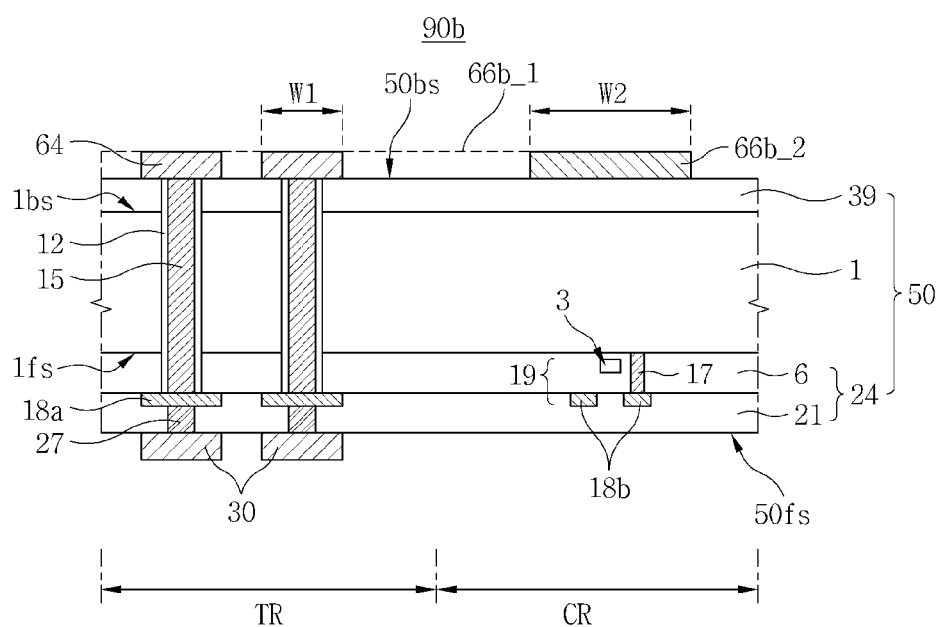
FIG. 2B is a conceptual cross-sectional view of the semiconductor device shown in FIG. 2A.

FIG. 2A is a perspective view of another semiconductor device according to exemplary embodiments of the present general inventive concept, and FIG. 2B is a conceptual cross-sectional view of the example of the semiconductor device shown in FIG. 2A.

Referring to FIGS. 2A and 2B, a semiconductor device according to an exemplary embodiment of the present general inventive concept may include a semiconductor chip 90b. As in FIGS. 1A and 1B, the semiconductor chip 90b may include a substrate 50 having a front side 50fs and a back side 50bs, front side conductive patterns 30 disposed on the front side 50fs of the substrate 50, and back side conductive patterns 64 disposed on the back side 50bs of the substrate 50. As described with reference to FIGS. 1A and 1B, the substrate 50 may include a semiconductor substrate 1, front side insulating layer 24, back side insulating layer 39, through-via structures 15, and internal circuit 19.

The semiconductor chip 90b may include a back side conductive structure 66b disposed on the back side 50bs of the substrate 50. The back side conductive structure 66b may be formed of the same material and thickness as the back side conductive patterns 64. The back side conductive structure 66b may prevent deformation, such as warpage of the semiconductor chip 90b. The back side conductive structure 66b may include a portion having a width W2 greater than a width W1 of the back side conductive patterns 64. The back side conductive structure 66b may have the same shape as the back side conductive structure 66a described with reference to FIG. 1. Accordingly, like the back side conductive structure 66a of FIG. 1A, the back side conductive structure 66b may include parallel side supporter portions 66b_2 and 66b_3 and a middle supporter portion 66b_1 interposed between the parallel side supporter portions 66b_2 and 66b_3. At least one of the parallel side supporter portions 66b_2 and 66b_3 and the middle supporter portion 66b_1 may have a width W2 greater than a width W1 of the back side conductive patterns 64. Here, the parallel side supporter portions 66b_2 and 66b_3 may have the same size.

Figure 2C:
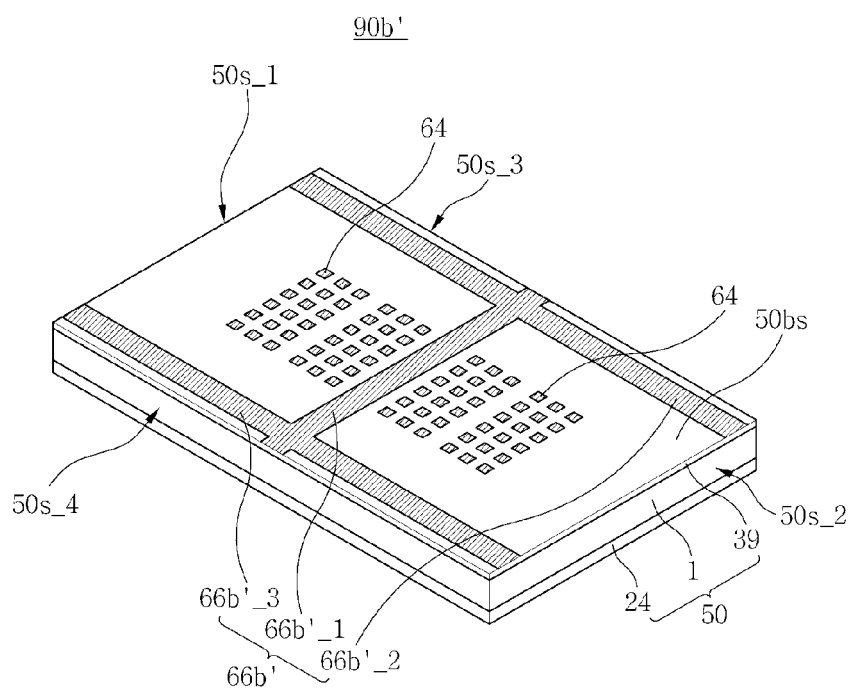
FIG. 2C is a perspective view of another semiconductor device according to exemplary embodiments of the present general inventive concept.

A shape of the back side conductive structure 66b is not limited to that shown in FIGS. 2A and 2B. A modified example of the back side conductive structure 66b will now be described with reference to FIGS. 2C and 2D. FIG. 2C is a perspective view of a modified example of the back side conductive structure 66b, and FIG. 2D is a schematic cross-sectional view of the modified example of the back side conductive structure 66b shown in FIG. 2C.

Figure 2D:
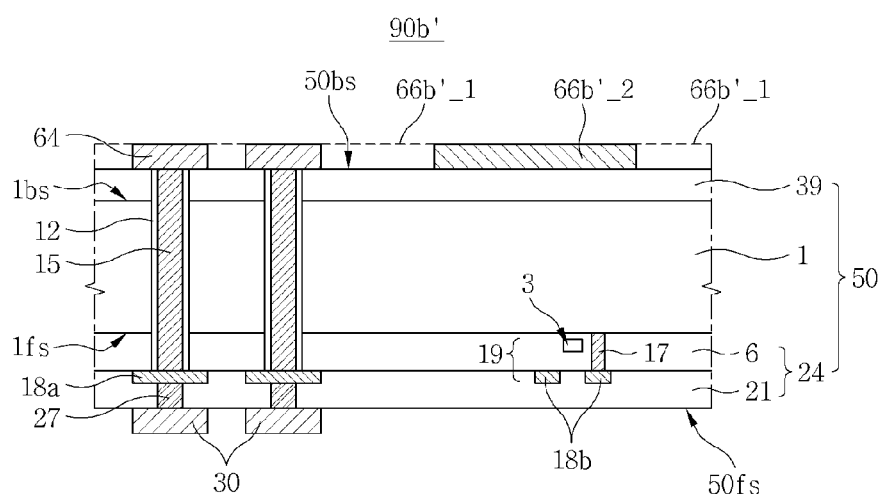
FIG. 2D is a conceptual cross-sectional view of the semiconductor device shown in FIG. 2C.

Referring to FIGS. 2C and 2D, a semiconductor device according to an exemplary embodiment of the present general inventive concept may include a semiconductor chip 90b'. The semiconductor chip 90b' may include a back side conductive structure 66b', which may prevent occurrence of deformation, such as warpage of the semiconductor chip 90b', and serve to radiate heat.

The back side conductive structure 66b' may be disposed on a back side 50bs of a substrate 50 and formed of the same material and thickness as back side conductive patterns 64. The back side conductive structure 66b' may be disposed on the back side 50bs of the substrate 50 and include a portion extending to at least one side surface of side surfaces 50s_1, 50s_2, 50s_3, and 50s_4 of the substrate 50.

The back side conductive structure 66b' may include a middle supporter portion 66b'_1, which may be parallel to the opposite first and second side surfaces 50s_1 and 50s_2 of the substrate 50 and extend from the third side surface 50s_3 of the substrate 50 to the fourth side surface 50s_4 thereof. The middle supporter portion 66b'_1 may have substantially the same length as the first and second side surfaces 50s_1 and 50s_2.

The back side conductive structure 66b' may include side supporter portions 66b'_2 and 66b'_3, which may be parallel to the third and fourth side surfaces 50s_3 and 50s_4 of the substrate 50 and extend from the first side surface 50s_1 of the substrate 50 to the second side surface 50s_2 thereof. The side supporter portions 66b'_2 and 66b'_3 may have substantially the same length as the third and fourth side surfaces 50s_3 and 50s_4. The side supporter portions 66b'_2 and 66b'_3 may be parallel to each other. The middle supporter portion 66b'_1 may cross the side supporter portions 66b'_2 and 66b'3.

Figure 3A:
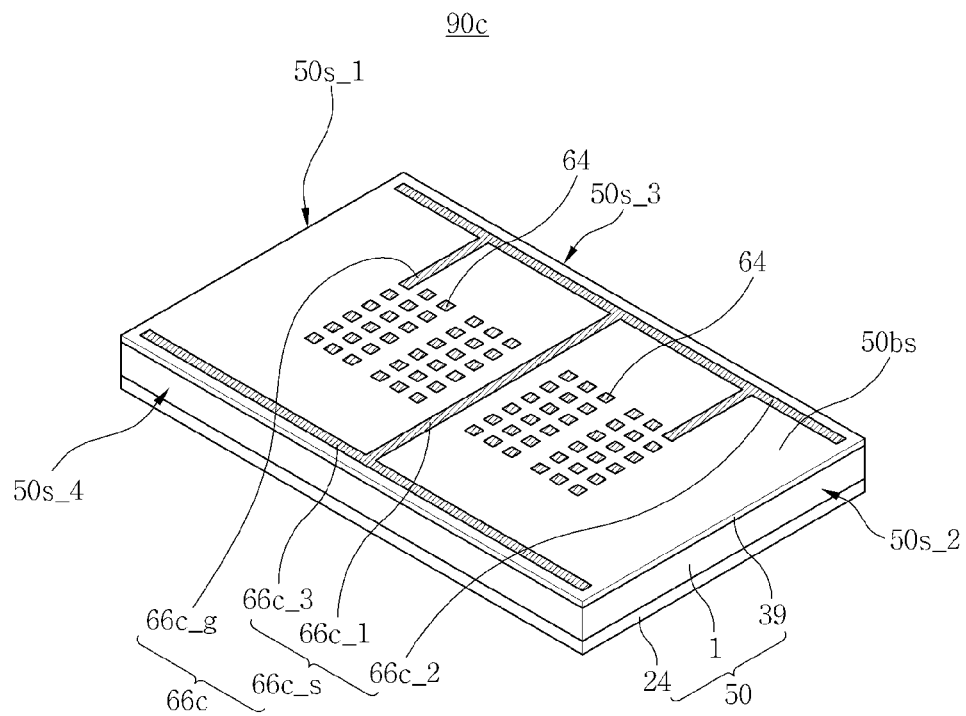
FIG. 3A is a perspective view of another semiconductor device according to exemplary embodiments of the present general inventive concept.
Figure 3B:
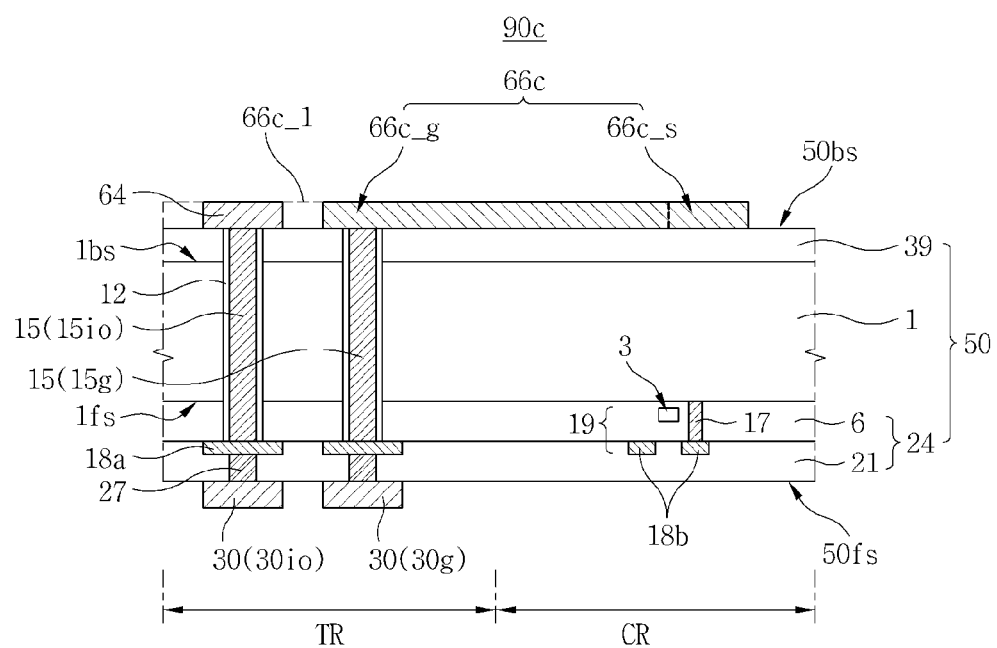
FIG. 3B is a conceptual cross-sectional view of the semiconductor device shown in FIG. 3A.

FIG. 3A is a perspective view of another example of a semiconductor device according to exemplary embodiments of the present general inventive concept, and FIG. 3B is a conceptual cross-sectional view of the example of the semiconductor device shown in FIG. 3A. Referring to FIGS. 3A and 3B, a semiconductor device according to an exemplary embodiment of the present general inventive concept may include a semiconductor chip 90c. As in FIGS. 1A and 1B, the semiconductor chip 90c may include a substrate 50 having a front side 50fs and a back side 50bs, front side conductive patterns 30 disposed on the front side 50fs of the substrate 50, and back side conductive patterns 64 disposed on the back side 50bs of the substrate 50. As described with reference to FIGS. 1A and 1B, the substrate 50 may include a semiconductor substrate 1, a front side insulating layer 24, a back side insulating layer 39, through-via structures 15, and an internal circuit 19.

The through-via structures 15 may include a through-via structure 15io configured to transmit input/output (I/O) signals and a through-via structure 15g configured to ground the semiconductor device. Among the through-via structures 15, a through-via structure configured to transmit the I/O signals of the semiconductor device may be defined as a signal I/O through-via structure 15io, while a through-via structure configured to ground the semiconductor device may be defined as a ground through-via structure 15g. The front side conductive patterns 30 may include a front side signal I/O connection pattern 30io electrically connected to the signal I/O through-via structures 15io and a front side ground connection pattern 30g electrically connected to the ground through-via structure 15g. The back side conductive patterns 64 may include back side signal I/O connection patterns electrically connected to the signal I/O through-via structures 15io.

The semiconductor chip 90c may include a back side conductive structure 66c disposed on the back side 50bs of the substrate 50. The back side conductive structure 66c may be formed of the same material and thickness as the back side conductive patterns 64. The back side conductive structure 66c may include a supporter portion 66c_s and a ground portion 66c_g. In the back side conductive structure 66c, the supporter portion 66c_s and the ground portion 66c_g may be electrically connected. In the back side conductive structure 66c, the supporter portion 66c_s may prevent occurrence of deformation, such as warpage of the substrate 50, and the ground portion 66c_g may be electrically connected to the ground through-via structure 15g and serve to radiate heat. The ground portion 66c_g may overlap the ground through-via structure 15g and be physically connected to the ground through-via structure 15. The back side conductive structure 66c may be grounded, prevent occurrence of deformation, such as warpage of the semiconductor chip 90c, and serve to radiate heat. The back side conductive structure 66c may include the ground portion 66c_g physically connected to the ground through-via structure 15g so that heat radiation of the semiconductor chip 90c can be increased and noise between metal lines or patterns configured to transmit signals can be removed or reduced.

Like the back side conductive structure 66a of FIGS. 1A and 1B, the supporter portion 66c_s may include first and second side supporter portions 66c_2 and 66c_3, which may be parallel to each other, and a middle supporter portion 66c_1 interposed between the first and second side supporter portions 66c_2 and 66c_3. The supporter portion 66c_s may have an H shape as in the back side conductive structure 66a of FIGS. 1A and 1B.

The ground portion 66c_g may extend from any one portion of the supporter portion 66c_s and overlap the ground through-via structure 15. As in FIG. 3A, the ground portion 66c_g may extend from the first side supporter portion 66c_s. However, the present general inventive concept is not limited thereto. For example, the ground portion 66c_g may extend from the second side supporter portion 66c_3 and/or the middle supporter portion 66c_1.

Figure 3C:
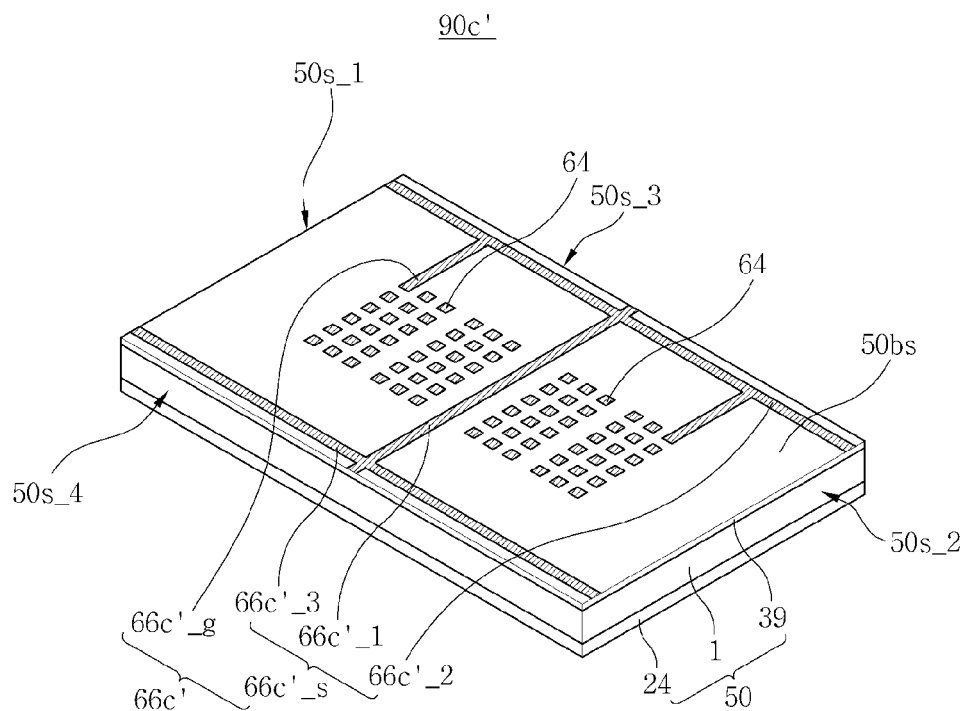
FIG. 3C is a perspective view of another semiconductor device according to exemplary embodiments of the present general inventive concept.

A shape of the back side conductive structure 66c is not limited to that shown in FIGS. 3A and 3B. A modified example of the back side conductive structure 66c will be described with reference to FIGS. 3C and 3D. FIG. 3C is a perspective view of a modified example of the back side conductive structure 66c, and FIG. 3D is a schematic cross-sectional view of the modified example of the back side conductive structure 66c shown in FIG. 3C.

Figure 3D:
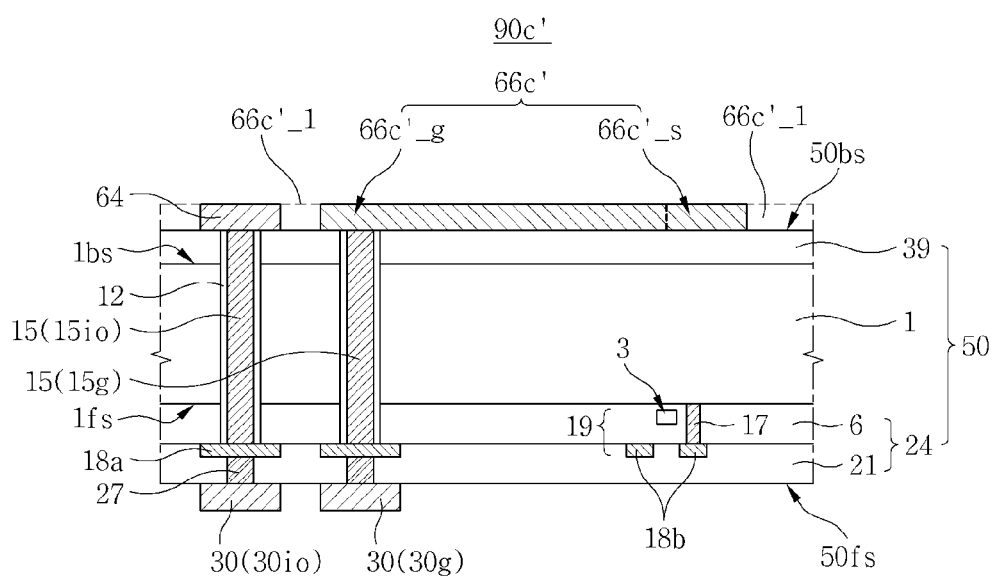
FIG. 3D is a conceptual cross-sectional view of the semiconductor device shown in FIG. 3C.

Referring to FIGS. 3C and 3D, a semiconductor device according to an exemplary embodiment of the present general inventive concept may include a semiconductor chip 90c'. The semiconductor chip 90c' may include a back side conductive structure 66c'. The back side conductive structure 66c' may be disposed on a back side 50bs of a substrate 50, electrically connected to a ground through-via structure 15g formed in the substrate 50, and formed of the same material and thickness as back side conductive patterns 64. The back side conductive structure 66c' may prevent occurrence of deformation, such as warpage of the semiconductor chip 90c' and serve to radiate heat. Also, the back side conductive structure 66c' may be grounded and serve to remove or reduce noise between metal lines or patterns configured to transmit signals.

The back side conductive structure 66c' may include a portion, which may be parallel to any one of side surfaces 50s_1, 50s_2, 50s_3, 50s_4 of the substrate 50 and cross the back side 50bs of the substrate 50. The back side conductive structure 66c' may include a supporter portion 66c'_s and a ground portion 66c'_g. The supporter portion 66c'_s may include a middle supporter portion 66c'_1 and side supporter portions 66c'_2 and 66c'_3.

The middle supporter portion 66c'_1 may be disposed parallel to the opposite first and second side surfaces 50s_1 and 50s_2 of the substrate 50, extend from the third side surface 50s_3 of the substrate 50 to the fourth side surface 50s_4 thereof, and cross the back side 50bs of the substrate 50. The middle supporter portion 66c'_1 may have substantially the same length as the first and second side surfaces 50s_1 and 50s_2.

The side supporter portions 66c'_2 and 66c'_3 may be disposed parallel to the third and fourth side surfaces 50s_3 and 50s_4 of the substrate 50, extend from the first side surface 50s_1 of the substrate 50 to the second side surface 50s_2 thereof, and cross the back side 50bs of the substrate 50. The side supporter portions 66c'_2 and 66c'_3 may cross the middle supporter portions 66c'_1.

The ground portion 66c'_g may extend from any one of the middle supporter portion 66c'_1 and the side supporter portions 66c'_2 and 65c'_3 and be electrically connected to the ground through-via structure 15g. The ground portion 66c'_g may be physically connected to the ground through-via structure 15g and increase heat radiation of the semiconductor chip 90c.

Figure 4A:
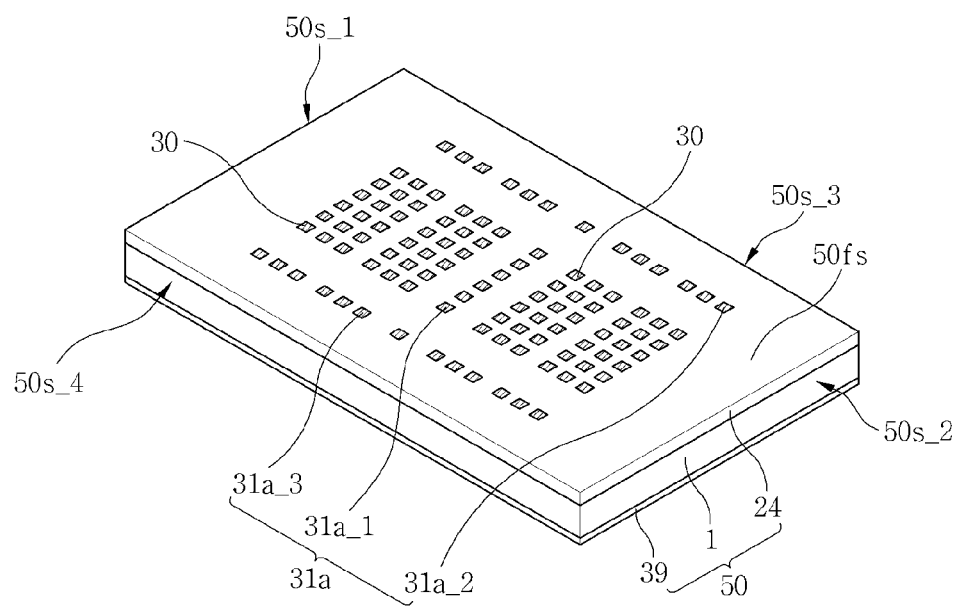
FIG. 4A is a perspective view of another semiconductor device according to exemplary embodiments of the present general inventive concept.
Figure 4B:
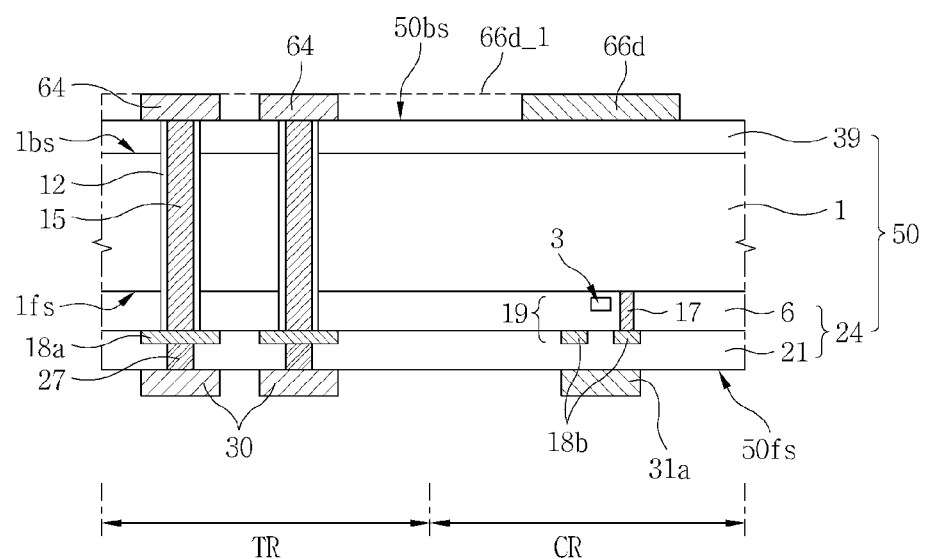
FIG. 4B is a conceptual cross-sectional view of the semiconductor device shown in FIG. 4A.

FIG. 4A is a perspective view of another example of a semiconductor device according to exemplary embodiments of the present general inventive concept, and FIG. 4B is a conceptual cross-sectional view of the example of the semiconductor device shown in FIG. 4A.

Referring to FIGS. 4A and 4B, a semiconductor device according to an exemplary embodiment of the present general inventive concept may include a semiconductor chip 90d. As in FIGS. 1A and 1B, the semiconductor chip 90d may include a substrate 50 having a front side 50fs and a back side 50bs, front side conductive patterns 30 disposed on the front side 50fs of the substrate 50, and back side conductive patterns 64 disposed on the back side 50bs of the substrate 50. As described with reference to FIGS. 1A and 1B, the substrate 50 may include a semiconductor substrate 1, a front side insulating layer 24, a back side insulating layer 39, through-via structures 15, and an internal circuit 19.

The semiconductor chip 90d may include a back side conductive structure 66d disposed on the back side 50bs of the substrate 50. The back side conductive structure 66d may be formed of the same material and thickness as the back side conductive patterns 64. The back side conductive structure 66d may prevent occurrence of deformation, such as warpage of the semiconductor chip 90d, and serve to radiate heat.

The back side conductive structure 66d may have the same shape and size as the back side conductive structure 66b described with reference to FIGS. 2A and 2B, having a middle supporter portion 66d_1, which may be parallel to the opposite first and second side surfaces 50s_1 and 50s_2 of the substrate 50, or may have the shape and size of the back side conductive structure 66b' described with reference to FIGS. 2C and 2D. However, the present general inventive concept is not limited thereto, and the back side conductive structure 66d may have, for example, the same shape and size as the back side conductive structure 66a described with reference to FIGS. 1A and 1B, the back side conductive structure 66c described with reference to FIGS. 3A and 3B, or the back side conductive structure 66c' described with reference to FIGS. 3C and 3D.

The semiconductor chip 90d may include front side dummy patterns 31a disposed on the front side 50fs of the substrate 50. The front side dummy patterns 31a may be formed of the same material and thickness as the front side conductive patterns 30. The front side dummy patterns 31a may be electrically insulated from the through-via structures 15. The front side dummy patterns 31a may be arranged opposite the back side conductive structure 66d across the substrate 50. The front side dummy patterns 31a may include side front side dummy patterns 31a_2 and 31a_3 disposed opposite side supporter portions of the back side conductive structure 66d, and middle front side dummy patterns 31a_1 disposed opposite a middle supporter portion of the back side conductive structure 66d.

Figure 5A:
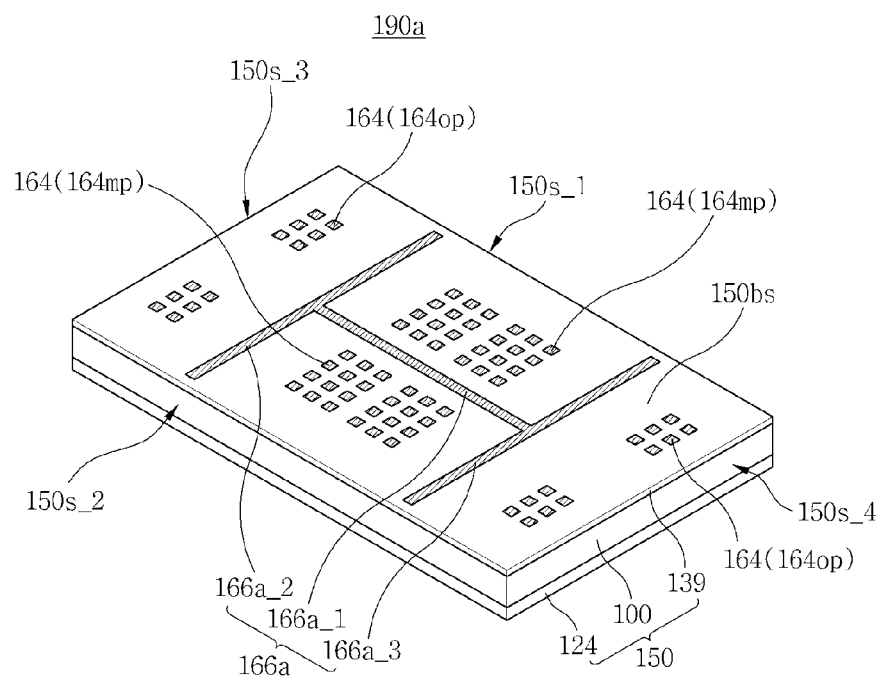
FIG. 5A is a perspective view of another semiconductor device according to exemplary embodiments of the present general inventive concept.
Figure 5B:
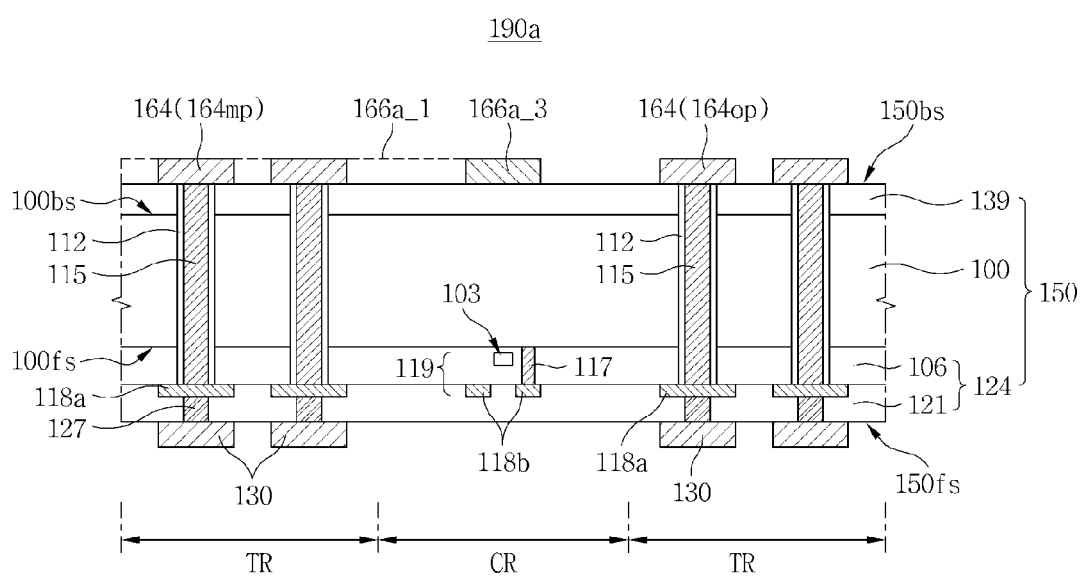
FIG. 5B is a conceptual cross-sectional view of the semiconductor device shown in FIG. 5A.

FIG. 5A is a perspective view of another example of a semiconductor device according to exemplary embodiments of the present general inventive concept, and FIG. 5B is a conceptual cross-sectional view of the example of the semiconductor device shown in FIG. 5A.

Referring to FIGS. 5A and 5B, a semiconductor device according to an exemplary embodiment of the present general inventive concept may include a semiconductor chip 190a. The semiconductor chip 190a may include a substrate 150 having a front side 150fs and a back side 150bs disposed opposite the front side 150fs, front side conductive patterns 130 disposed on the front side 150fs of the substrate 150, and back side conductive patterns 164 disposed on the back side 150bs of the substrate 150.

As in FIGS. 1A and 1B, the substrate 150 may include a semiconductor substrate 100 having a front side 100fs and a back side 100bs disposed opposite the front side 100fs, a front side insulating layer 124 disposed on the front side 100fs of the semiconductor substrate 100, and a back side insulating layer 139 disposed on the back side 100bs of the semiconductor substrate 100. The substrate 150 may include parallel first and second side surfaces 150s_1 and 150s_2 and third and fourth side surfaces 150s_3 and 150s_4 perpendicular to the first and second side surfaces 150s_1 and 150s_2. The substrate 150 may have a tetragonal shape.

As in FIGS. 1A and 1B, the front side insulating layer 124 may include a lower front side insulating layer 106 and an upper front side insulating layer 121 sequentially stacked on the front side 100fs of the semiconductor substrate 100. The substrate 150 may include an internal circuit region CR and a through electrode region TR. The internal circuit 119 may be disposed in the internal circuit CR of the substrate 150. As described with reference to FIG. 1B, the internal circuit 119 may include a unit element 103 disposed on the front side 100fs of the semiconductor substrate 100 and a plug 117 and an internal line 118b electrically connected to the unit element 103.

The substrate 150 may include through-via structures 115 formed through the semiconductor substrate 100 in the through electrode region TR. The through-via structures 115 may penetrate the semiconductor substrate 100 and also penetrate the back side insulating layer 139. The through-via structures 115 may penetrate the semiconductor substrate 100 and also penetrate the lower front side insulating layer 106 of the front side insulating layer 124. A via insulating pattern 112 may be disposed to surround side surfaces of the through-via structures 115. Like the via pads 18a and the internal vias 27 described with reference to FIG. 1B, via pads 118a and internal vias 127 may be disposed to be electrically connected to the through-via structures 115 and the front side conductive patterns 130.

The semiconductor chip 190a may include a back side conductive structure 166a disposed on the back side 150bs of the substrate 150. The back side conductive structure 166a may be formed of the same material and thickness as the back side conductive patterns 164. The back side conductive structure 166a may prevent occurrence of deformation, such as warpage of the semiconductor chip 90b, and serve to radiate heat.

The back side conductive structure 166a may include a middle supporter portion 166a_1 and parallel side supporter portions 166a_2 and 166a_3. The middle supporter portion 166a_1 may be parallel to the first and second side surfaces 150s_1 and 150s_2 of the substrate 150 and disposed in a middle portion between the first side surface 150s_1 and the second side surface 150s_2 of the substrate 150. The side supporter portions 166a_2 and 166a_3 may be parallel to third and fourth side surfaces 150s_3 and 150s_4 of the substrate 150. The side supporter portions 166a_2 and 166a_3 may include a first side supporter portion 166a_2 disposed near to the third side surface 150s_3 of the substrate 150 and a second side supporter portion 166a_3 disposed near to the fourth side surface 150s_4 of the substrate 150. The middle supporter portion 166a_1 may be perpendicular to the side supporter portions 166a_2 and 166a_3 and disposed between the side supporter portions 166a_2 and 166a_3. The middle supporter portion 166a_1 may be disposed between a middle portion of the first side supporter portion 166a_2 and a middle portion of the second side supporter portion 166a_3. The back side conductive structure 166a may have, for example, an "H" shape.

The back side conductive patterns 164 may be disposed on the back side insulating layer 139 and cover the through-via structures 115. The back side conductive patterns 164 may be pads or bumps. The back side conductive patterns 164 may include back side signal I/O connection patterns, back side ground connection patterns, and back side power connection patterns. The back side conductive patterns 164 may include back side middle conductive patterns 164mp and back side outer conductive patterns 164op. The back side middle conductive patterns 164mp may be disposed between the first side supporter portion 166a_2 and the second side supporter portion 166a_3 of the back side conductive structure 166a. The back side outer conductive patterns 164op may be disposed between the side supporter portions 166a_2 and 166a_3 and the third and fourth side surfaces 150s_3 and 150s_4 of the substrate 150. The middle supporter portion 166a_1 may be disposed to pass between the back side middle conductive patterns 164mp, while the side supporter portions 166a_2 and 166a_3 may be disposed to pass between the back side middle conductive patterns 164mp and the back side outer conductive patterns 164op. The present general inventive concept is not limited to the shape of the back side conductive structure 166a shown in FIG. 5A. For example, a portion of the back side conductive structure 166a may extend to at least one of side surfaces of the substrate 150, similar to the conductive structure 66b' described with reference to FIGS. 2C and 2D.

Figure 5C:
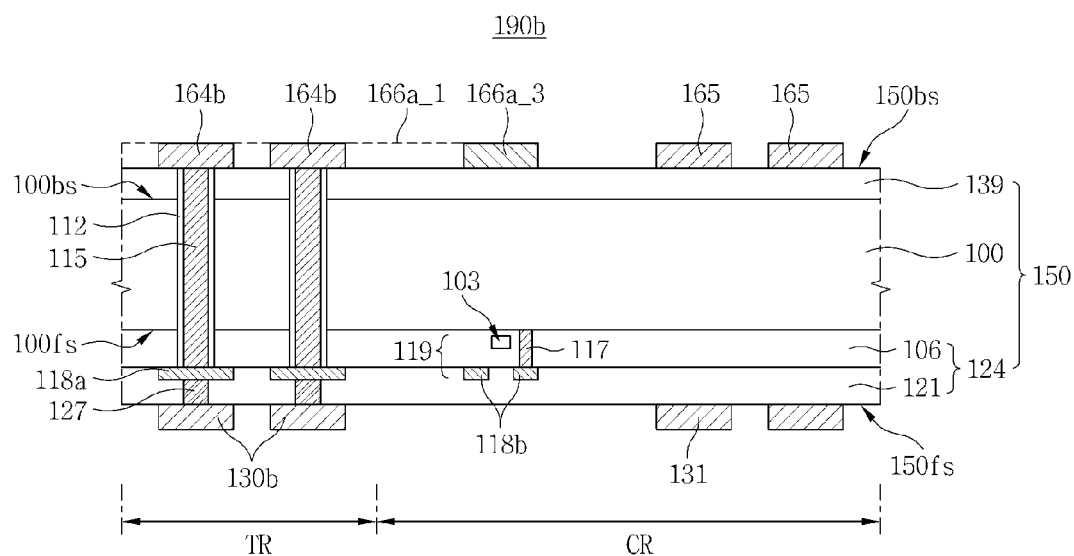
FIG. 5C is a conceptual cross-sectional view of another semiconductor device according to exemplary embodiments of the present general inventive concept.

FIG. 5C is a conceptual cross-sectional view of another modified example of a semiconductor device according to exemplary embodiments of the present general inventive concept.

Referring to FIG. 5C, a semiconductor device according to an exemplary embodiment of the present general inventive concept may include a semiconductor chip 190b. The semiconductor chip 190b may include a substrate 150 and a back side conductive structure 166a, which are the same as described with reference to FIGS. 5A and 5B. Also, the semiconductor chip 190b may include back side conductive patterns 164b corresponding to the back side middle conductive patterns 164mp described with reference to FIGS. 5A and 5B, and front side conductive patterns 130b disposed on a front side 150fs of the substrate 150 to correspond one-to-one to the back side conductive patterns 164b.

The semiconductor chip 190b may include back side dummy patterns 165, which may be disposed on the back side 150bs of the substrate 150 and in positions corresponding to the back side outer conductive patterns 166op described with reference to FIGS. 5A and 5B and electrically insulated from through-via structures 115, and front side dummy patterns 131 disposed on the front side 150fs of the substrate 150 and opposite the back side dummy patterns 165.

A shape of the back side conductive structure 166a described with reference to FIGS. 5A and 5B is not limited to that shown in FIGS. 5A and 5B. Hereinafter, a modified example of the back side conductive structure 166a will be described with reference to each of FIGS. 6 through 10.

To begin with, an exemplary embodiment of the back side conductive structure 166a described with reference to FIGS. 5A and 5B will be described with reference to FIG. 6.

Figure 6:
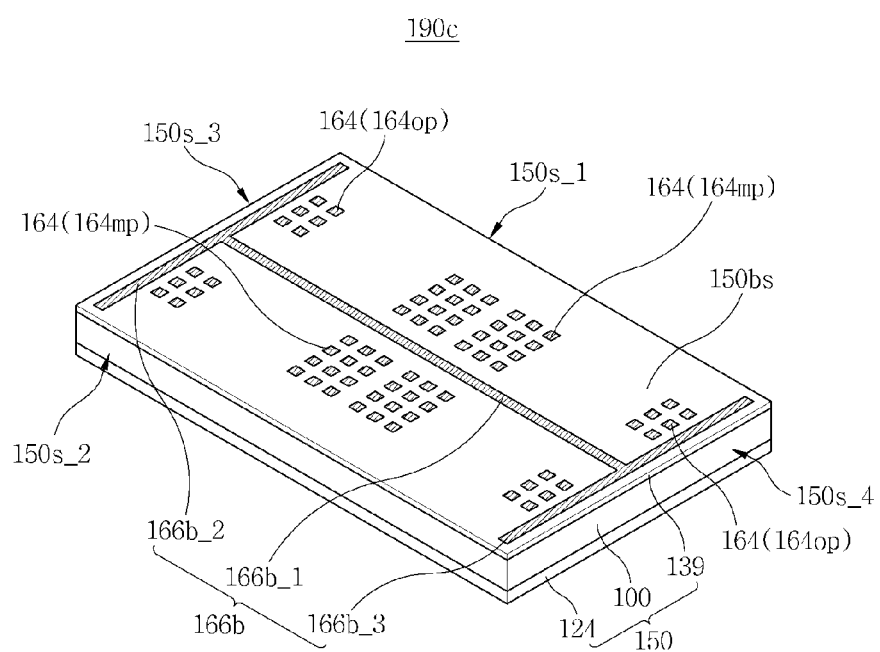
FIGS. 6 through 10 are respectively perspective views of a back side conductive structure according to exemplary embodiments of the present general inventive concept.

Referring to FIG. 6, a semiconductor device according to an exemplary of the present general inventive concept may include a semiconductor chip 190c. The semiconductor chip 190c may include a back side conductive structure 166b.

Like the back side conductive structure 166a described with reference to FIGS. 5A and 5B, the back side conductive structure 166b may be disposed on a back side 150bs of a substrate 150 and formed of the same material and thickness as back side conductive patterns 164. Also, the back side conductive structure 166b may prevent deformation of the semiconductor chip 190c and serve to radiate heat. The back side conductive structure 166b may include a middle supporter portion 166b_1 crossing between the back side conductive patterns 164 and first and second side supporter portions 166b_2 and 166b_3, both perpendicular to the middle supporter portion 166b. One end portion of the middle supporter portion 166b_1 may be nearer to the third side surface 150s_3 of the substrate 150 than the back side conductive patterns 164, while the other end portion thereof may be nearer to the fourth side surface 150s_4 of the substrate 150 than the back side conductive patterns 164. The back side conductive patterns 164 may be disposed between the first and second side supporter portions 166b_2 and 166b_3. The first side supporter portion 166b_2 may be nearer to the third side surface 150s_3 of the substrate 150 than the back side conductive patterns 164. The second side supporter portion 166b_3 may be nearer to the fourth side surface 150s_4 of the substrate 150 than the back side conductive patterns 164.

Next, another exemplary embodiment of the back side conductive structure 166a described with reference to FIGS. 5A and 5B will be described with reference to FIG. 7.

Figure 7:
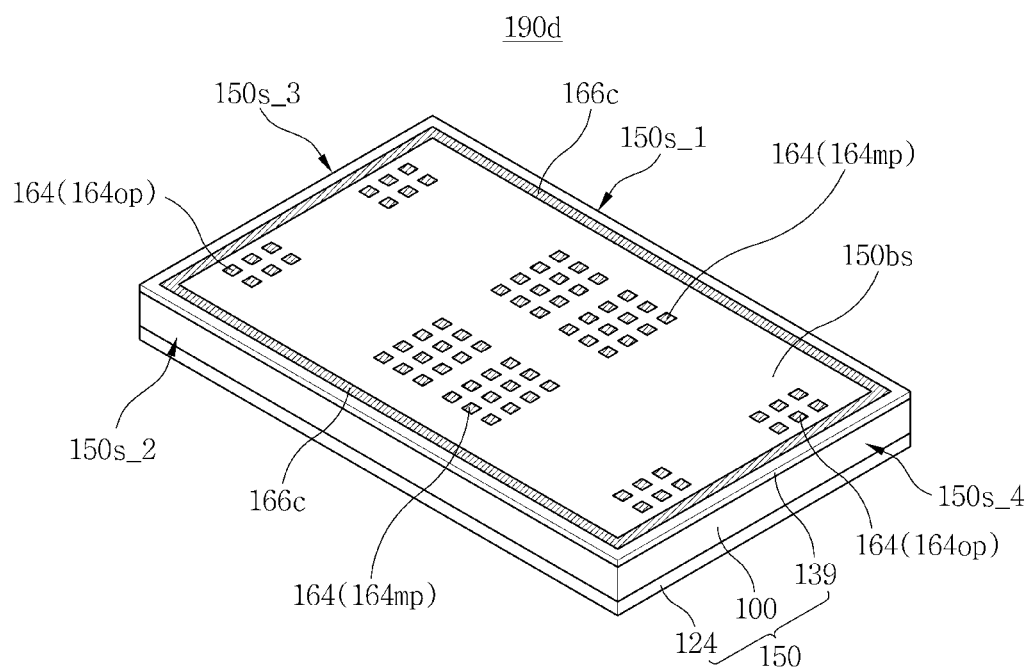

Referring to FIG. 7, a semiconductor device according to an exemplary embodiment of the present general inventive concept may include a semiconductor chip 190d. The semiconductor chip 190d may include a back side conductive structure 166c, which may be disposed on a back side 150bs of a substrate 150 and surround back side conductive patterns 164. The back side conductive structure 166c may be spaced apart from the back side conductive patterns 164. The back side conductive structure 166c may be nearer to side surfaces 150s_1, 150s_2, 150s_3, and 150s_4 of the substrate 150 than the back side conductive patterns 164. The back side conductive structure 166c may prevent deformation, such as warpage of the substrate 150, and serve to radiate heat. The back side conductive structure 166c may have a tetragonal shape.

Next, another exemplary embodiment of the back side conductive structure 166a described with reference to FIGS. 5A and 5B will be described with reference to FIG. 8.

Figure 8A:
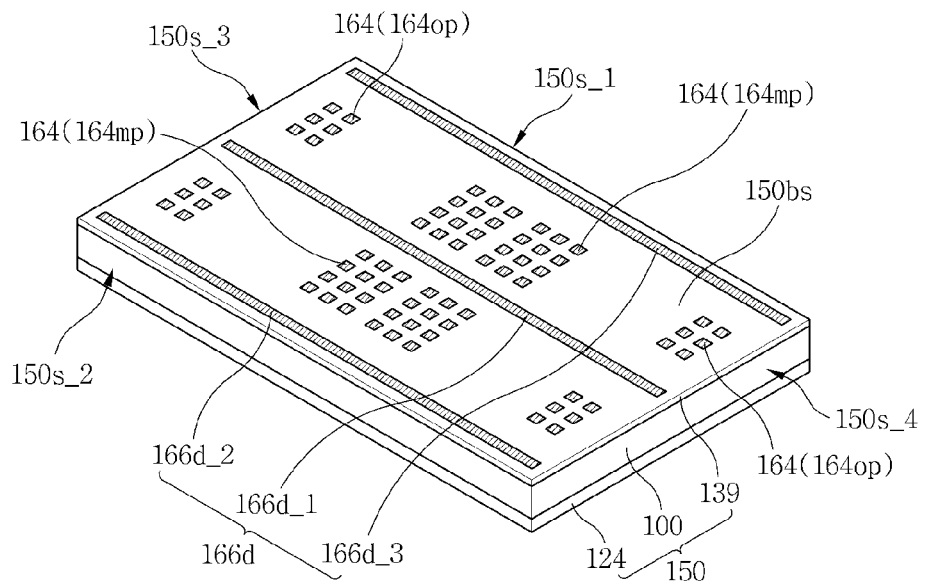

Referring to FIG. 8, a semiconductor device according to an exemplary embodiment of the present general inventive concept may include a semiconductor chip 190e. The semiconductor chip 190e may include a back side conductive structure 166d, which may be disposed on a back side 150bs of a substrate 150 and parallel to first and second side surfaces 150s_1 and 150s_2 of the substrate 150.

The back side conductive structure 166d may include a plurality of supporter portions 166d_1, 166d_2, and 166d_3 parallel to the opposite first side surface 150s_1 and second side surface 150s_2 of the substrate 150.

The back side conductive structure 166d may include first and second side supporter portions 166d_2 and 166d_3 and a middle supporter portion 166d_1 interposed between the first and second side supporter portions 166d_2 and 166d_3. The middle supporter portion 166d_1 may pass between the back side conductive patterns 164. The middle supporter portion 166d_1 may be disposed in a middle portion between the first and second side surfaces 150s_1 and 150s_2 of the substrate 150. The first side supporter portion 166d_2 may be interposed between the back side conductive patterns 164 and the second side surface 150s_2, while the second side supporter portion 166d_3 may be interposed between the back side conductive patterns 164 and the first side surface 150s_1. The supporter portions 166d_1, 166d_2 and 166d_3 may have bar or line shapes parallel to one another.

Figure 8B:
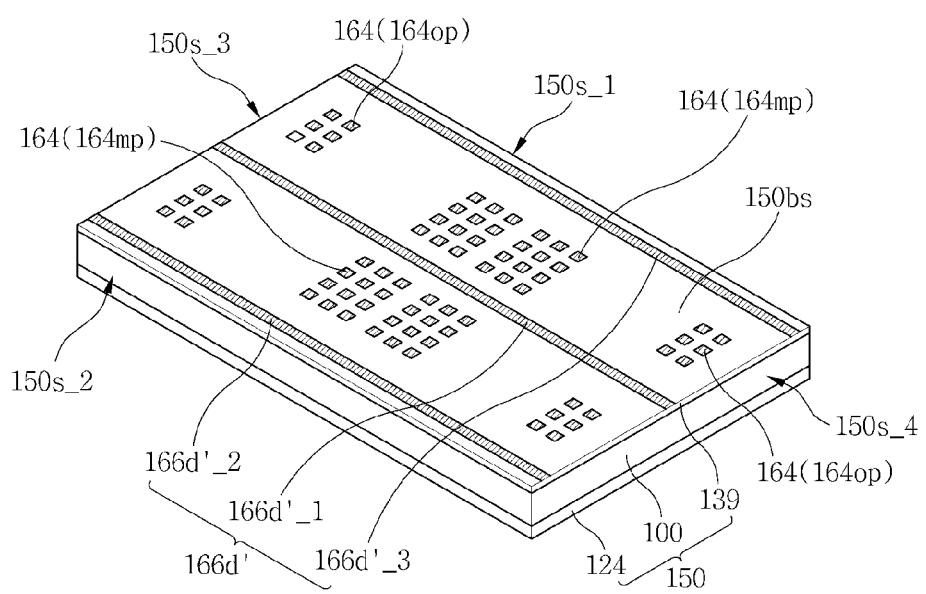

A shape of the back side conductive structure 166d is not limited to that shown in FIG. 8. A modified example of the back side conductive structure 166d extending to at least one side surface of the substrate 150 will be described with reference to FIG. 8B, however, similar modifications of extension to at least one side surface of the substrate 150 could be made to back conductive side structures 166b, 166c, 166e, 166f, and 166g of FIGS. 6, 7, 9, 10, and 11A, respectively. Since one of ordinary skill in the art could readily comprehend applying the modification as such, in the interest of brevity the modification will only be described regarding back side conductive structure 166d.

Referring to FIG. 8B, a semiconductor device according to an exemplary embodiment of the present general inventive concept may include a semiconductor chip 190e'. The semiconductor chip 190e' may include a back side conductive structure 166d', which may prevent occurrence of deformation, such as warpage of the semiconductor chip 1903', and serve to radiate heat. The back side conductive structure 166d' may be disposed on a back side 150bs of a substrate 150, parallel to first and second side surfaces 150s_1 and 150s_2 of the substrate 150, and include a portion extending to at least one side surface of side surfaces 150s_3 and 150s_4 of the substrate 150.

The back side conductive structure 166d' may include first and second side supporter portions 166d_2' and 166d_3' and a middle supporter portion 166d_1' interposed between the first and second side supporter portions 166d_2' and 166d_3'. The middle supporter portion 166d_1' may pass between the back side conductive patterns 164. The middle supporter portion 166d_1' may be disposed in a middle portion between the first and second side surfaces 150s_1 and 150s_2 of the substrate 150. The first side supporter portion 166d_2' may be interposed between the back side conductive patterns 164 and the second side surface 150s_2, while the second side supporter portion 166d_3' may be interposed between the back side conductive patterns 164 and the first side surface 150s_1. The supporter portions 166d_1', 166d_2' and 166d_3' may have bar or line shapes parallel to one another.

Next, another exemplary embodiment of the back side conductive structure 166a described with reference to FIGS. 5A and 5B will be described with reference to FIG. 9.

Figure 9:
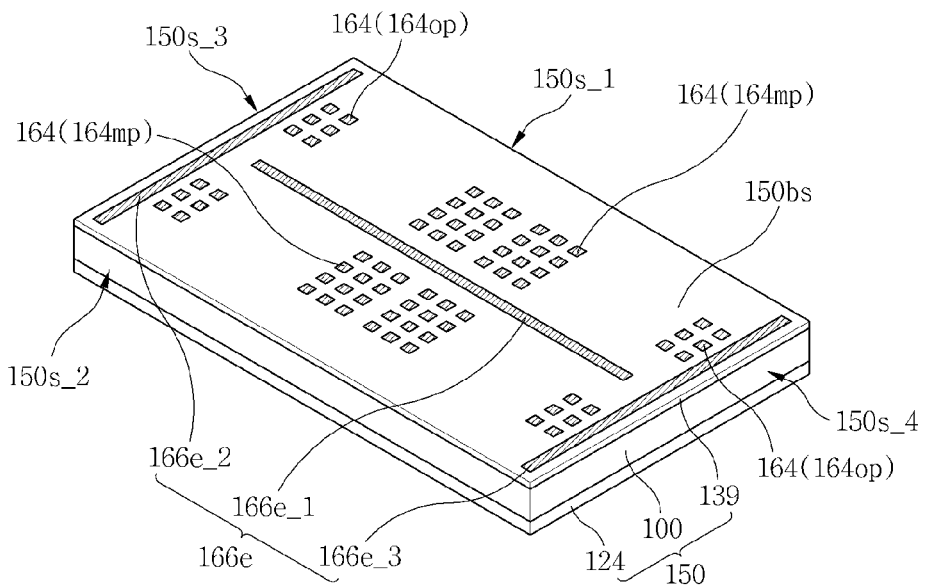

Referring to FIG. 9, a semiconductor device according to an exemplary embodiment of the present general inventive concept may include a semiconductor chip 190f. The semiconductor chip 190f may include a back side conductive structure 166e disposed on a back side 150bs of a substrate 150. The back side conductive structure 166e may include a middle supporter portion 166e_1 disposed parallel to first and second side surfaces 150s_1 and 150s_2 of the substrate 150, a first side supporter portion 166e_2 interposed between back side conductive patterns 164 and a third side surface 150s_3 of the substrate 150, and a second side supporter portion 166e_3 interposed between the back side conductive patterns 164 and a fourth side surface 150s_4 of the substrate 150. In the back side conductive structure 166e, the supporter portions 166e_1, 166e_2 and 166e_3 may be spaced apart from one another. Each of the supporter portions 166e_1, 166e_2 and 166e_3 may have a bar or line shape. The middle supporter portion 166e_1 may be perpendicular to the first and second side supporter portions 166e_2 and 166e_3.

Next, another exemplary embodiment of the back side conductive structure 166a described with reference to FIGS. 5A and 5B will be described with reference to FIG. 10.

Figure 10:
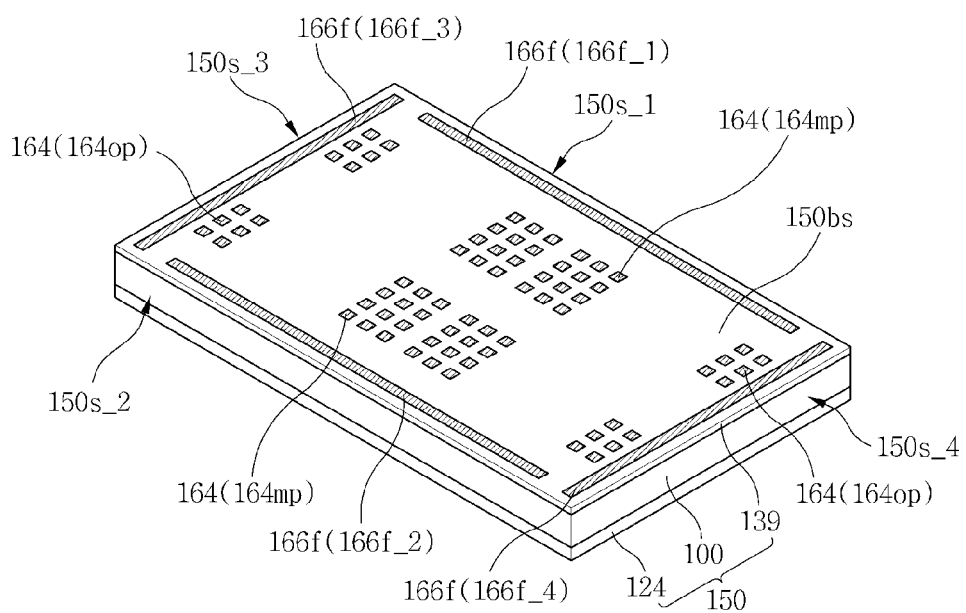

Referring to FIG. 10, a semiconductor device according to an exemplary embodiment of the present general inventive concept may include a semiconductor chip 190g. The semiconductor chip 190g may include a back side conductive structure 166f, which may include a first supporter portion 166f_1 interposed between back side conductive patterns 164 and first side surface 150s_1 of a substrate 150, a second supporter portion 166f_2 interposed between the back side conductive patterns 164 and a second side surface 150s_2 of the substrate 150, a third supporter portion 166f_3 interposed between the back side conductive patterns 164 and a third side surface 150s_3 of the substrate 150, and a fourth supporter portion 166f_4 interposed between the back side conductive patterns 164 and a fourth side surface 150s_4 of the substrate 150. Each of the first and second supporter portions 166f_1 and 166f_2 may have a bar or line shape parallel to the first and second side surfaces 150s_1 and 150s_2. Each of the third and fourth supporter portions 166f_3 and 166f_4 may have a bar or line shape parallel to the third and fourth side surfaces 150s_3 and 150s_4. The first through fourth supporter portions 166f_1, 166f_2, 166f_3 and 166f_4 may be spaced apart from one another.

Figure 11A:
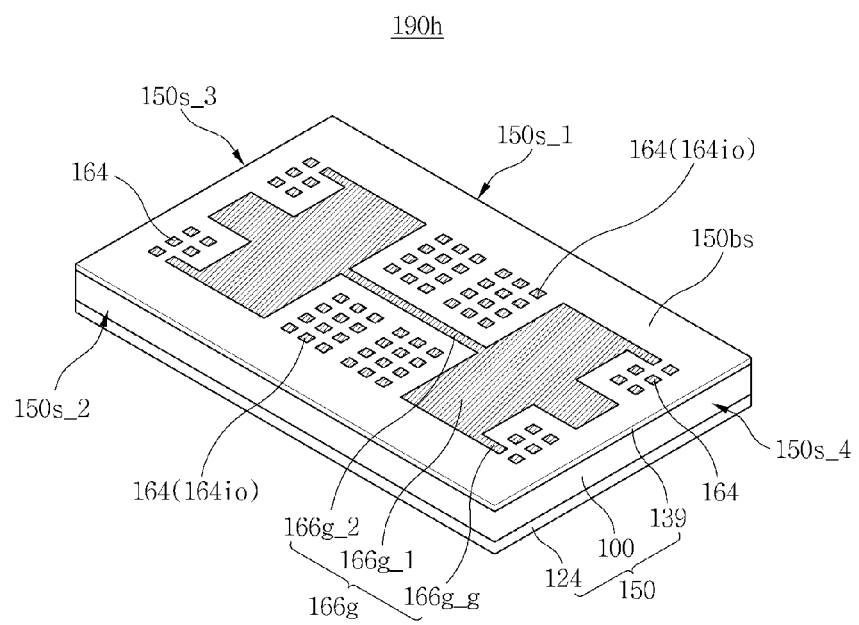
FIG. 11A is a perspective view of another semiconductor device according to exemplary embodiments of the present general inventive concept.
Figure 11B:
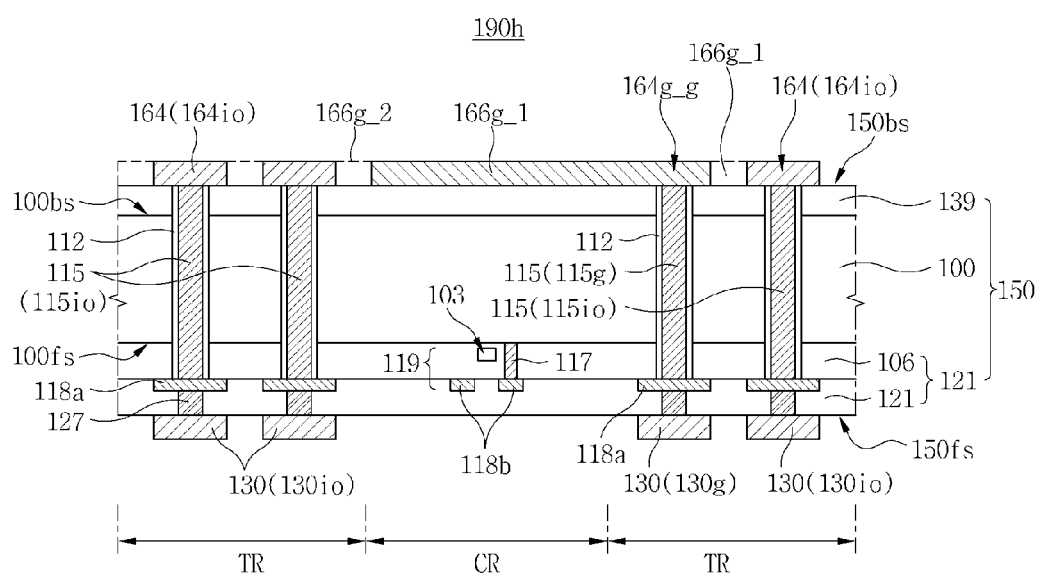
FIG. 11B is a conceptual cross-sectional view of semiconductor device shown in FIG. 11A.

FIG. 11A is a perspective view of another modified example of a semiconductor device according to exemplary embodiments of the present general inventive concept, and FIG. 11B is a conceptual cross-sectional view of the modified example of the semiconductor device shown in FIG. 11A.

Referring to FIGS. 11A and 11B, a semiconductor device according to an exemplary embodiment of the present general inventive concept may include a semiconductor chip 190h. The semiconductor chip 190h may include a substrate 150 as described with reference to FIGS. 5A and 5B. As shown in FIGS. 5A and 5B, the substrate 150 may include a semiconductor substrate 100, a front side insulating layer 124, a back side insulating layer 139, through-via structures 115, and an internal circuit 119.

The through-via structures 115 of the substrate 150 may include signal I/O through-via structures 115io configured to transmit signals to a semiconductor device and a ground through-via structure 115g configured to ground the semiconductor device. Front side conductive patterns 130 disposed on a front side 150fs of the substrate 150 may include front side signal I/O connection patterns 130io electrically connected to the signal I/O through-via structures 115io and a front side ground connection pattern 130g electrically connected to the ground through-via structure 115g. The back side conductive patterns 164 disposed on a back side 150bs of the substrate 150 may include back side signal I/O connection patterns 164io electrically connected to the signal I/O through-via structures 115io.

A back side conductive structure 166g may be provided on the back side 150bs of the substrate 150 and have a portion overlapping an internal circuit region CR of the substrate 150.

The back side conductive structure 166g may prevent deformation, such as warpage of the semiconductor chip 190h. The back side conductive structure 166g may function to radiate heat generated by the internal circuit 119 of the semiconductor chip 190h. Also, the back side conductive structure 166g may be grounded and serve to shield electromagnetic waves.

The back side conductive structure 166g may include a supporter portion 166g_1 and 166g_2 and a ground portion 166g_g. The ground portion 166g_g and the supporter portion 166g_1 and 166g_2 may be continuously connected. The ground portion 166g_g may overlap the ground through-via structure 115g and be electrically connected to the ground through-via structure 115g. The supporter portion 166g_1 and 166g_2 may overlap the internal circuit region CR of the substrate 150. The supporter portion 166g_1 and 166g_2 may cover the unit element 103 of the internal circuit 119 disposed in the substrate 150. The supporter portion 166g_1 and 166g_2 may include a portion 166g_1 having a greater width than the back side conductive patterns 164. The supporter portion 166g_1 and 166g_2 may include a portion 166g_1 parallel to the opposite first and second side surfaces 150s_1 and 150s_2 of the substrate 150. The front side signal I/O connection patterns 130io, the signal I/O through-via structures 115io, and the back side signal I/O connection patterns 134io may be vertically electrically connected. The front side ground connection pattern 130g, the ground through-via structure 115g, and the ground portion 166g_g of the back side conductive structure 166g may be vertically electrically connected.

The back side conductive structure 166g may be electrically connected to the ground through-via structure 115g and grounded. Thus, the grounded back side conductive structure 166g may serve to remove or reduce noise between lines configured to transmit signals to the internal circuit 119 or noise between lines constituting the internal circuit 119 and also serve to radiate heat, thereby improving reliability of a device.

Figure 12:
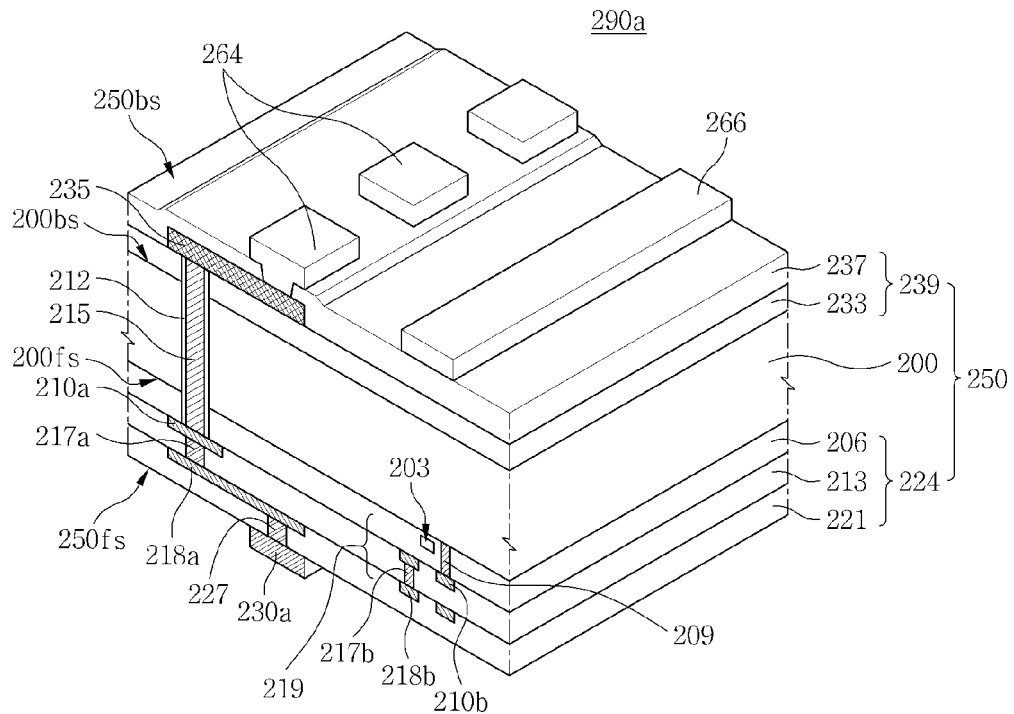
FIG. 12 is a perspective view of another semiconductor device according to exemplary embodiments of the present general inventive concept.

FIG. 12 is a perspective view of another modified example of a semiconductor device according to exemplary embodiments of the present general inventive concept.

Referring to FIG. 12, a semiconductor device according to an exemplary embodiment of the present general inventive concept may include a semiconductor chip 290a. The semiconductor chip 290a may include a substrate 250 having a front side 250fs and a back side 250fs and a front side conductive pattern 230a disposed on the front side 250fs of the substrate 250. The substrate 250 may include a semiconductor substrate 200 having a front side 200fs and a back side 200bs, a front side insulating layer 224 disposed on the front side 200fs of the semiconductor substrate 200, and a back side insulating layer 239 disposed on the back side 200bs of the semiconductor substrate 200.

The semiconductor chip 290a may include a through-via structure 215 formed through the semiconductor substrate 200. The through-via structure 215 may penetrate the semiconductor substrate 200 and extend into the front side insulating layer 224. The through-via structure 224 may penetrate the semiconductor substrate 200 and extend into the back side insulating layer 239. A via insulating pattern 212 may be disposed to surround a side surface of the through-via structure 215.

The semiconductor chip 290a may include an internal circuit 219 formed on or adjacent to the front side 250fs of the substrate 250. The internal circuit 219 may include unit elements 203 and a line structure configured to connect the unit elements 203. The line structure may include a contact plug 209, a line plug 217b, and internal lines 210b and 218b. The front side insulating layer 224 may include a lower front side insulating layer 206, a middle front side insulating layer 213, and an upper front side insulating layer 221 sequentially stacked on the front side 200fs of the semiconductor substrate 200. The lower front side insulating layer 206 of the front side insulating layer 224 may cover the unit elements 203. A via pad 210a and a first internal line 210b may be disposed on the lower front side insulating layer 206. The contact plug 209 may penetrate the lower front side insulating layer 206 and electrically connect the unit elements 203 and the first internal line 210b. A front side via redistribution line 218a and a second internal line 218b may be disposed on the middle front side insulating layer 213. A pad plug 217a may penetrate the middle front side insulating layer 213 and electrically connect the front side via redistribution line 218a and the via pad 210a. A line plug 217b may penetrate the middle front side insulating layer 213 and electrically connect the second internal line 218b and the first internal line 210b. The front side conductive pattern 230a may be disposed on the upper front side insulating layer 221. A redistribution via 227 may penetrate the upper front side insulating layer 221 and electrically connect the front side via redistribution line 218a and the front side conductive pattern 230a. The back side insulating layer 239 may include a first back side insulating layer 233 and a second back side insulating layer 237 sequentially stacked on the back side 200bs of the semiconductor substrate 200. The through-via structure 215 may penetrate the semiconductor substrate 200 and also penetrate the lower front side insulating layer 206 and the first back side insulating layer 233.

The semiconductor chip 290a may include back side conductive patterns disposed on the back side 200bs of the semiconductor substrate 200. The back side conductive patterns may include a first back side conductive pattern 235 disposed on the first back side insulating layer 233 and a second back side conductive pattern 264 disposed on the second back side insulating layer 237. A portion of the first back side conductive pattern 235 may overlap the through-via structure 215 and be electrically connected to the through-via structure 215. The first back side conductive pattern 235 may be a conductive pattern for a redistribution. The second back side conductive pattern 264 may include a portion, which may penetrate the second back side insulating layer 237 and be electrically connected to the first back side conductive pattern 235. The second back side conductive pattern 264 may be a back side signal I/O connection pattern serving as a pad or bump configured to electrically connect the semiconductor chip 290a with another chip or device.

The semiconductor chip 290a may include a back side conductive structure 266 disposed on the second back side insulating layer 237. The back side conductive structure 266 may prevent deformation, such as warpage of the semiconductor chip 290a. The back side conductive structure 266 may be formed of the same material and thickness as the second back side conductive pattern 264.

The back side conductive structure 266 may have the same shape as or a similar shape to any one of the front side conductive structures 66a, 66b, 66b', 66c, 66c', 166a, 166b, 166c, 166d, 166e, 166f, and 166g described with reference to FIGS. 1A, 2A, 2C, 3A, 3C, 5A, 6, 7, 8, 9, 10, and 11A, respectively. Accordingly, a detailed description of a shape of the back side conductive structure 266 or components of the back side conductive structure 266 is omitted.

Figure 13:
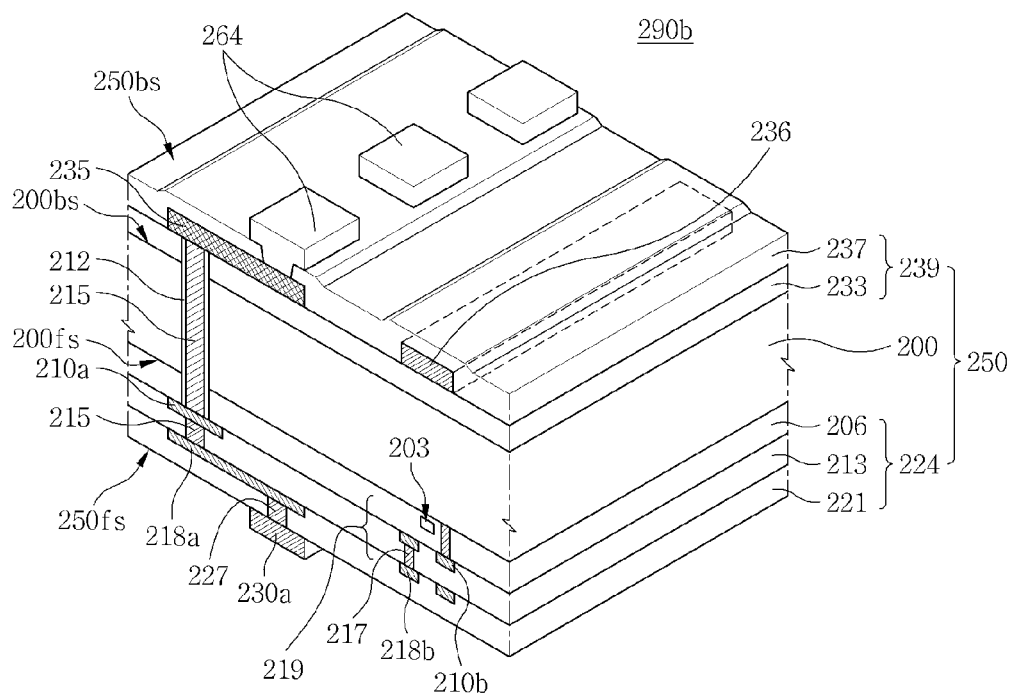
FIG. 13 is a perspective view of another semiconductor device according to exemplary embodiments of the present general inventive concept.

FIG. 13 is a perspective view of another modified example of a semiconductor device according to exemplary embodiments of the present general inventive concept.

Referring to FIG. 13, a semiconductor device according to an exemplary embodiment of the present general inventive concept may include a semiconductor chip 290b. As in FIG. 12, the semiconductor chip 290b may include a substrate 250 having a front side 250fs and a back side 250bs and a front side conductive pattern 230 disposed on the front side 250fs of the substrate 250. As in FIG. 12, the substrate 250 may include a semiconductor substrate 200 having a front side 200fs and a back side 200bs, a front side insulating layer 224 disposed on the front side 200fs of the semiconductor substrate 200, and a back side insulating layer 239 disposed on the back side 200bs of the semiconductor substrate 200. As in FIG. 12, the back side insulating layer 239 may include a first back side insulating layer 233 and a second back side insulating layer 237 sequentially stacked on the semiconductor substrate 200.

As in FIG. 12, the semiconductor chip 290b may include a first back side conductive pattern 235 and a second back side conductive patterns 264 disposed on the back side 200bs of the semiconductor substrate 200.

The semiconductor chip 290b may include a back side conductive structure 236 formed of the same material and thickness as the first back side conductive pattern 233. The first back side conductive pattern 235 and the back side conductive structure 236 may be interposed between the first back side insulating layer 233 and the second back side insulating layer 237.

The first back side conductive pattern 235 may be electrically connected to the through-via structure 215 formed through the semiconductor substrate 200 and the first back side insulating layer 233, while the back side conductive structure 236 may be electrically insulated from the through-via structure 215. The back side conductive structure 236 may be covered with the second back side insulating layer 237 and prevent deformation, such as warpage of the semiconductor chip 290b. The back side conductive structure 236 may have the same planar shape as the back side conductive structure 266 shown in FIG. 12.

Figure 14:
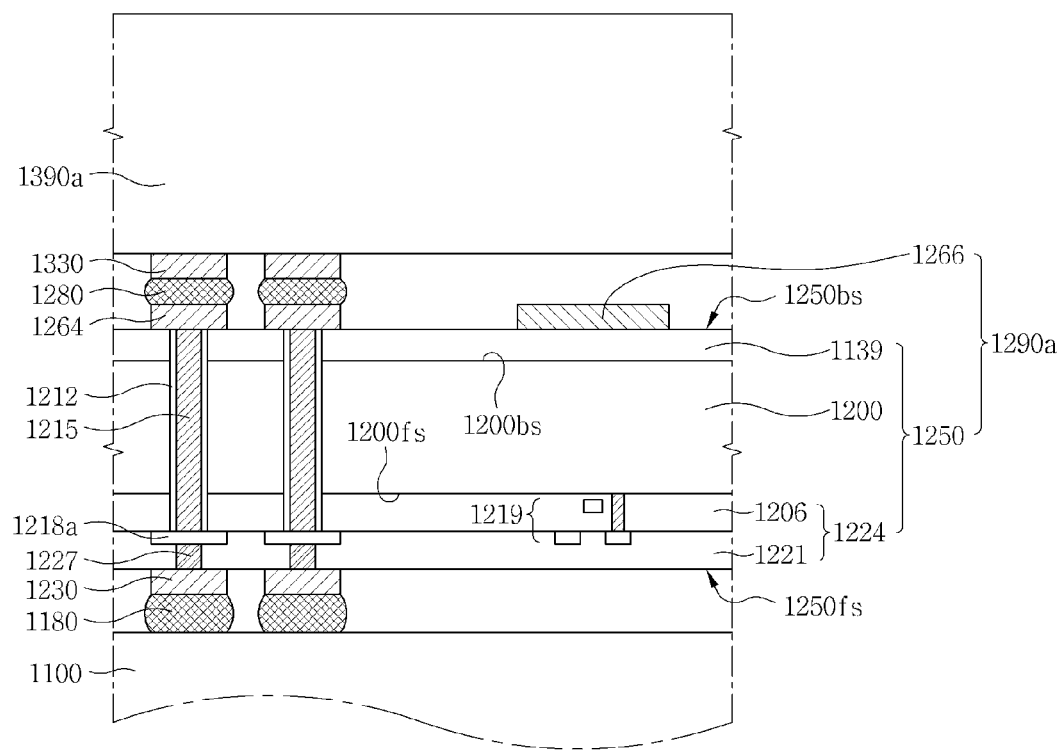
FIG. 14 is a conceptual cross-sectional view of a semiconductor device according to exemplary embodiments of the present general inventive concept.

FIG. 14 is a conceptual cross-sectional view of a semiconductor device 1000a according to exemplary embodiments of the present general inventive concept.

Referring to FIG. 14, the semiconductor device 1000a according to an exemplary embodiment of the present general inventive concept may include a first chip 1290a disposed on a package substrate 1100.

The first chip 1290a may be the same semiconductor chip as the semiconductor chip 90b shown in FIGS. 2A and 2B. However, the present general inventive concept is not limited thereto. For example, the first chip 1290a may be the same semiconductor chip as any one of the semiconductor chips 90a, 90c, 90d, 190a, 190b, 190c, 190d, 190e, 190f, 190g, 190h, 290a, and 290b described with reference to FIGS. 1A, 1B, and 3A through 13, respectively.

As in FIGS. 2A and 2B, the first chip 1290a may include a lower substrate 1250 having a front side 1250fs and a back side 1250bs disposed opposite the front side 1250fs, first front side conductive patterns 1230 disposed on the front side 1250fs of the lower substrate 1250, back side conductive patterns 1264 disposed on the back side 1250bs of the lower substrate 1250, and a back side conductive structure 1266 disposed on the back side 1250bs of the lower substrate 1250. The front side 1250fs of the lower substrate 1250 may face the package substrate 1100. The back side conductive structure 1266 may be formed of the same material and thickness as the back side conductive patterns 1264.

The back side conductive structure 1266 may have the same shape as any one of the back side conductive structures 66a, 66b, 66c, 166a, 166b, 166c, 166d, 166e, 166f, and 166g described with reference to FIGS. 1A, 2A, 3A, 5A, 6, 7, 8, 9, 10, and 11A, respectively. Accordingly, a detailed description of a shape of the back side conductive structure 1266 is omitted.

The lower substrate 1250 may include a semiconductor substrate 1200 having a front side 1200fs and a back side 1200bs, a front side insulating layer 1224 disposed on the front side 1200fs of the semiconductor substrate 1200, and a back side insulating layer 1139 disposed on the back side 1200bs of the semiconductor substrate 1200. The front side insulating layer 1224 may include a lower front side insulating layer 1206 and an upper front side insulating layer 1221 sequentially stacked on the front side 1200fs of the semiconductor substrate 1200. An internal circuit 1219 may be disposed on or near to the front side 1250fs of the lower substrate 1250. Since the internal circuit 1219 is the same as the internal circuit 19 described with reference to FIG. 1B, a detailed description thereof is omitted.

The first chip 1290a may include through-via structures 1215 configured to penetrate the semiconductor substrate 1200 and also penetrate the lower front side insulating layer 1206 and the back side insulating layer 1139. Via insulating patterns 1212 may be disposed to surround side surfaces of the through-via structures 1215. The through-via structures 1215 and the first front side conductive patterns 1230 may be electrically connected through a via pad 1218a and an internal via 1227 corresponding to the via pad 18a and the internal via 27 shown in FIG. 1B.

Substrate bumps 1180 may be disposed between the package substrate 1100 and the first front side conductive patterns 1230. The substrate bumps 1180 may include a solder material.

The semiconductor substrate 1000a may include a second chip 1390a disposed on the first chip 1290a. The second chip 1390a may include second front side conductive patterns 1330 facing the back side conductive patterns 1264 of the first chip 1290a.

Inter-chip bumps 1280 may be interposed between the back side conductive patterns 1264 of the first chip 1290a and the second front side conductive patterns 1330 of the second chip 1390a and electrically connect the back side conductive patterns 1264 with the second front side conductive patterns 1330. The inter-chip bumps 1280 may include a solder material. The back side conductive structure 1266 may inhibit deformation of the first chip 1290a during the formation of the substrate bumps 1180 and/or the inter-chip bumps 1280. For example, the inter-chip bumps 1280 may include a solder material. Also, while a thermal process for reflowing the solder material is being performed to physically adhere the inter-chip bumps 1280 including the solder material to the back side conductive patterns 1264 and the second front side conductive patterns 1330, the back side conductive structure 1266 may serve to inhibit deformation (e.g., warpage of the first chip 1290*a*) due to the thermal process. Similarly, the back side conductive structure 1266 may inhibit deformation of the first chip 1290*a* due to heat generated during the formation of the substrate bumps 1180 including the solder material.

Figure 15A:
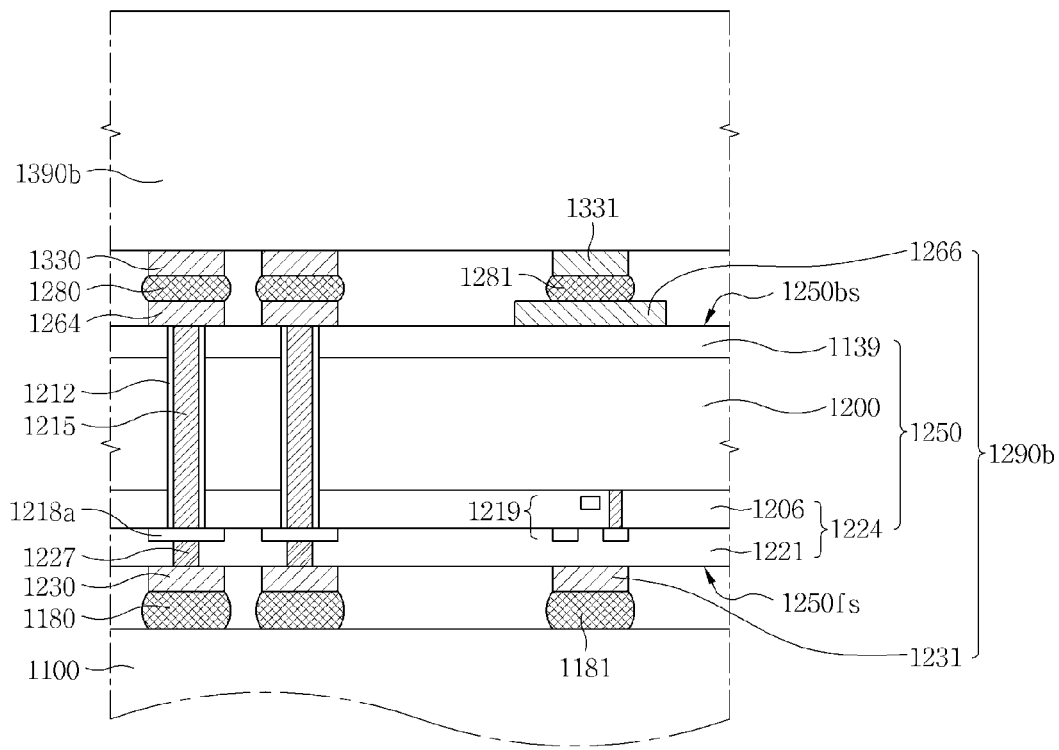
FIG. 15A is a conceptual cross-sectional view of another semiconductor device according to exemplary embodiments of the present general inventive concept.

FIG. 15A is a conceptual cross-sectional view of a semiconductor device according to exemplary embodiments of the present general inventive concept.

Referring to FIG. 15A, a semiconductor device 1000*b* according to an exemplary embodiment of the present general inventive concept may include a first chip 1290*b* and a second chip 1390*b* sequentially stacked on a package substrate 1100. As in FIG. 14, the first chip 1290*b* may include a lower substrate 1250 having a front side 1250*fs* and a back side 1250*bs*. The front side 1250*fs* of the lower substrate 1250 may face the package substrate 1100.

As in FIG. 14, the first chip 1290*b* may include through-via structures 1215 disposed in the lower substrate 1250. The through-via structures 1215 may include through-via structures configured to input/output signals to/from the semiconductor device.

The first chip 1290*b* may include first front side conductive patterns 1230 and first front side dummy pattern 1231 disposed on the front side 1250*fs* of the lower substrate 1250. The first front side conductive patterns 1230 and the first front side dummy pattern 1231 may be formed of the same material and thickness as each other. The first front side conductive patterns 1230 may be electrically connected to the through-via structures 1215 configured to input/output signals. The first front side dummy patterns 1231 may be electrically insulated from the through-via structures 1215 configured to input/output signals. The substrate bumps 1180 shown in FIG. 14 may be disposed between the first front side conductive patterns 1230 of the first chip 1290*b* and the package substrate 1100. A substrate dummy bump 1181 may be disposed between the first front side dummy pattern 1231 and the package substrate 1100.

The first chip 1290*b* may include the back side conductive patterns 1264 and the back side conductive structure 1266 as shown in FIG. 14. The back side conductive patterns 1264 and the back side conductive structure 1266 may be disposed on the back side 1250*bs* of the substrate 1250.

The second chip 1390*b* may include second front side conductive patterns 1330 and second front side dummy patterns 1331. The second front side conductive patterns 1330 and the second front side dummy patterns 1331 may be disposed on a front side of the second chip 1390*b* facing the first chip 1290*b*. The second front side conductive patterns 1330 of the second chip 1390*b* may face the back side conductive patterns 1264 of the first chip 1290*b*. The second front side dummy patterns 1331 may face the back side conductive structure 1266 of the first chip 1290*b*.

Inter-chip bumps 1280 may be interposed between the back side conductive patterns 1264 of the first chip 1290*b* and the second front side conductive patterns 1330 of the second chip 1390*b*. The inter-chip bumps 1280 may electrically connect the back side conductive patterns 1264 and the second front side conductive patterns 1330. Buffer bumps 1281 may be interposed between the back side conductive structure 1266 of the first chip 1290*b* and the second front side dummy patterns 1331 of the second chip 1390*b*. The inter-chip bumps 1280 and the buffer bumps 1281 may include a solder material.

Figure 15B:
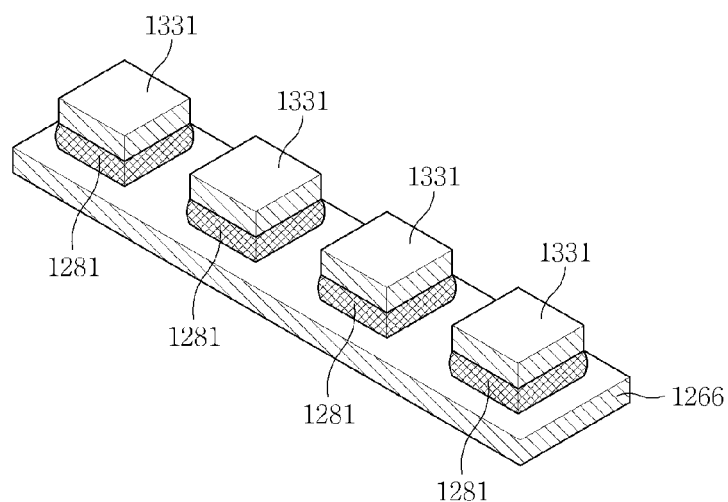
FIG. 15B is a schematic perspective view of some components of the semiconductor device shown in FIG. 15A.

FIG. 15B is a schematic perspective view of the second front side dummy patterns 1331, the back side conductive structure 1266, and the buffer bumps 1281.

Referring to FIG. 15B, the back side conductive structure 1266 may include the same bar-shaped or line-shaped portion as the back side conductive structures 66*a*, 66*b*, 66*c*, 166*a*, 166*b*, 166*c*, 166*d*, 166*e*, 166*f*, and 166*g* described with reference to FIGS. 1A, 2A, 3A, 5A, 6, 7, 8, 9, 10, and 11A, respectively. A plurality of second front side dummy patterns 1331 may face one another on the bar-shaped or line-shaped portion of the back side conductive structure 1266. The buffer bumps 1281 may be interposed between the integrally connected single back side conductive structure 1266 and the plurality of second front side dummy patterns 1331.

Figure 16:
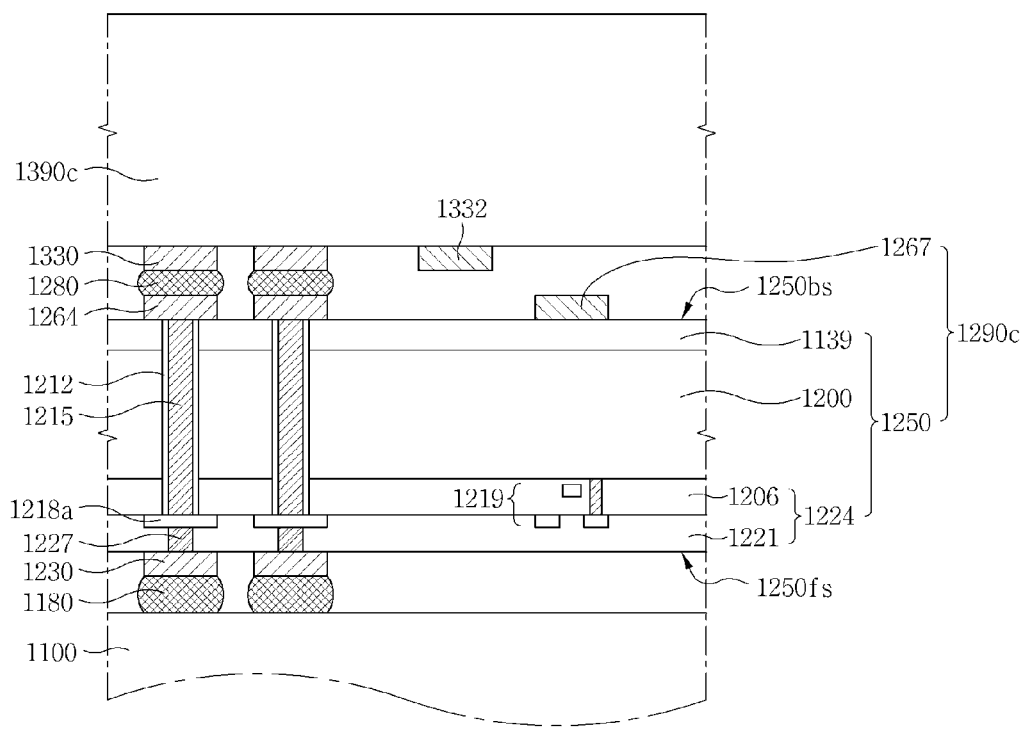
FIG. 16 is a conceptual cross-sectional view of a semiconductor device according to exemplary embodiments of the present general inventive concept.

FIG. 16 is a conceptual cross-sectional view of a semiconductor device according to exemplary embodiments of the present general inventive concept.

Referring to FIG. 16, a semiconductor device 1000*c* according to an exemplary embodiment of the present general inventive concept may include a first chip 1290*c* and a second chip 1390*c* sequentially stacked on a package substrate 1100. The first chip 1290*c* may include first front side conductive patterns 1230 disposed on a surface facing the package substrate 1100. Substrate bumps 1180 as shown in FIG. 14 may be interposed between the first front side conductive patterns 1230 and the package substrate 1100.

The first chip 1290*c* may include back side conductive patterns 1264 and a back side conductive structure 1267. The back side conductive structure 1267 may have the same shape as the back side conductive structure 66*a* shown in FIG. 1A. However, the present general inventive concept is not limited thereto. For example, the back side conductive structure 1267 may have the same shape as any one of the back side conductive structures 66*b*, 66*c*, 166*a*, 166*b*, 166*c*, 166*d*, 166*e*, 166*f*, and 166*g* described with reference to FIGS. 2A, 3A, 5A, 6, 7, 8, 9, 10, and 11A, respectively. The back side conductive patterns 1264 and the back side conductive structure 1267 may be disposed on a surface of the first chip 1290*c* facing the second chip 1390*c*. The back side conductive patterns 1264 and the back side conductive structure 1267 may be formed of the same material and thickness.

The second chip 1390*c* may include second front side conductive patterns 1330 and second front side dummy patterns 1332. The second front side conductive patterns 1330 and the second front side dummy patterns 1332 may be disposed on a front side of the second chip 1390*c* facing the first chip 1290*c*. The second front side conductive patterns 1330 of the second chip 1390*c* may face the back side conductive patterns 1264 of the first chip 1290*c*. The second front side dummy patterns 1332 may be arranged to be zigzag with respect to the back side conductive structure 1267 of the first chip 1290*c*. The second front side dummy patterns 1332 may be disposed not to overlap the back side conductive structure 1267 of the first chip 1290*c* in a vertical direction. Inter-chip bumps 1280 may be interposed between the back side conductive patterns 1264 and the second front side conductive patterns 1330 and electrically connect the back side conductive patterns 1264 and the second front side conductive patterns 1330.

Next, a method of fabricating a semiconductor device according to exemplary embodiments of the present general inventive concept will be described with reference to FIGS. 17A through 17H and 18A through 18D.

To begin with, an example of a method of fabricating a through-via structure 15 of a semiconductor device according to exemplary embodiments of the present general inventive concept will be described with reference to FIGS. 17A through 17H.

Figure 17A:
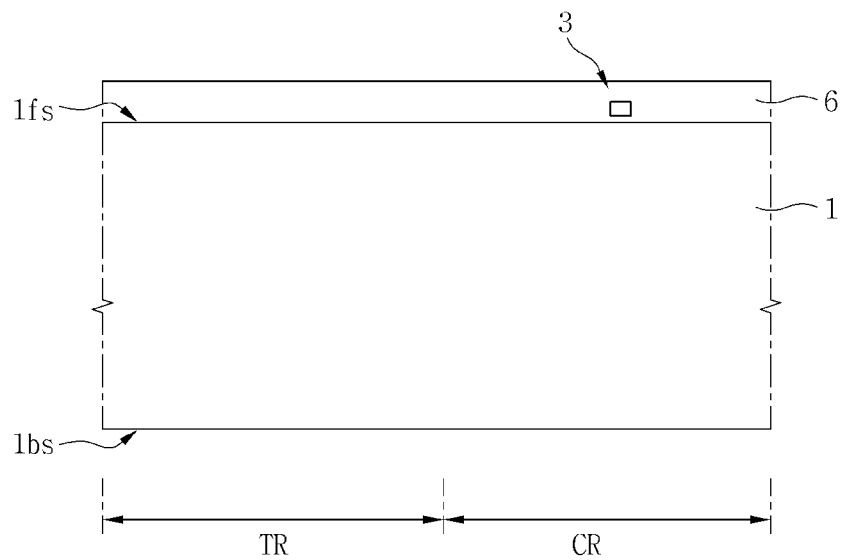
FIGS. 17A through 17H and 18A through 18D are schematic cross-sectional views illustrating a method of fabricating a semiconductor device according to exemplary embodiments of the present general inventive concept.

Referring to FIG. 17A, a semiconductor substrate 1 having a front side 1*fs* and a back side 1*bs* disposed opposite the front side 1*fs* may be prepared. The semiconductor substrate 1 may be formed of a semiconductor material, such as silicon. Unit elements 3 may be formed on the front side 1*fs* of the semiconductor substrate 1. The unit elements 3 may include elements, such as a MOS transistor. A lower front side insulating layer 6 may be formed on the front side 1*fs* of the semiconductor substrate 1 to cover the unit elements 3.

Figure 17B:
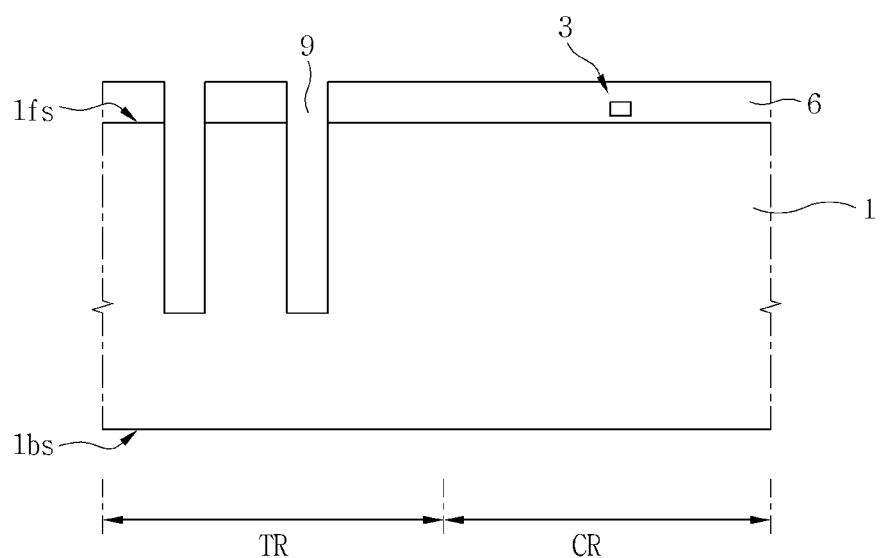

Referring to FIG. 17B, a through hole 9 may be formed through the lower front side insulating layer 6 and the front side 1*fs* of the semiconductor substrate 1 and have a bottom surface in the semiconductor substrate 1. The bottom surface of the through hole 9 may be spaced apart from the back side 1*bs* of the semiconductor substrate 1.

Figure 17C:
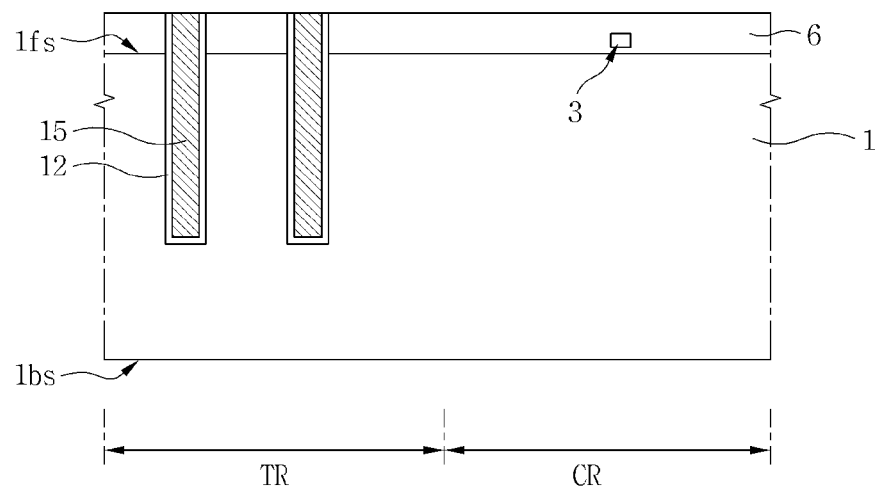

Referring to FIG. 17C, a via insulating pattern 12 and the through-via structure 15 may be formed within the through hole 9. The formation of the via insulating pattern 12 and the through-via structure 15 may include forming an insulating liner on the substrate having the through hole 9, forming a conductive material layer on the insulating liner to fill the through hole 9, and planarizing the conductive material layer. The formation of the conductive material layer may include forming a barrier layer on the substrate having the insulating liner, forming a metal seed layer on the barrier layer, and forming a core material layer on the seed layer using a plating process. The barrier layer may include a barrier metal material, such as, for example, titanium (Ti), titanium nitride (TiN), titanium tungsten (TiW), tantalum (Ta), tantalum nitride (TaN), or tungsten nitride (WN). The seed layer may include a seed metal material, such as, for example, copper (Cu), ruthenium (Ru), nickel (Ni), or tungsten (W). The core material layer may be formed of a metal material, such as, for example, copper. The conductive material layer may be planarized and left within the through hole 9. The conductive material layer left within the through hole 9 may be defined as the through-via structure 15. During the planarization of the conductive material layer, a portion of the insulating liner disposed on the lower front side insulating layer 6 may be removed, while a portion of the insulating liner disposed within the through hole 9 may be left. The insulating liner left within the through hole 9 may be defined as the via insulating pattern 12. The via insulating pattern 12 may be formed to surround a side surface of the through-via structure 15.

Figure 17D:
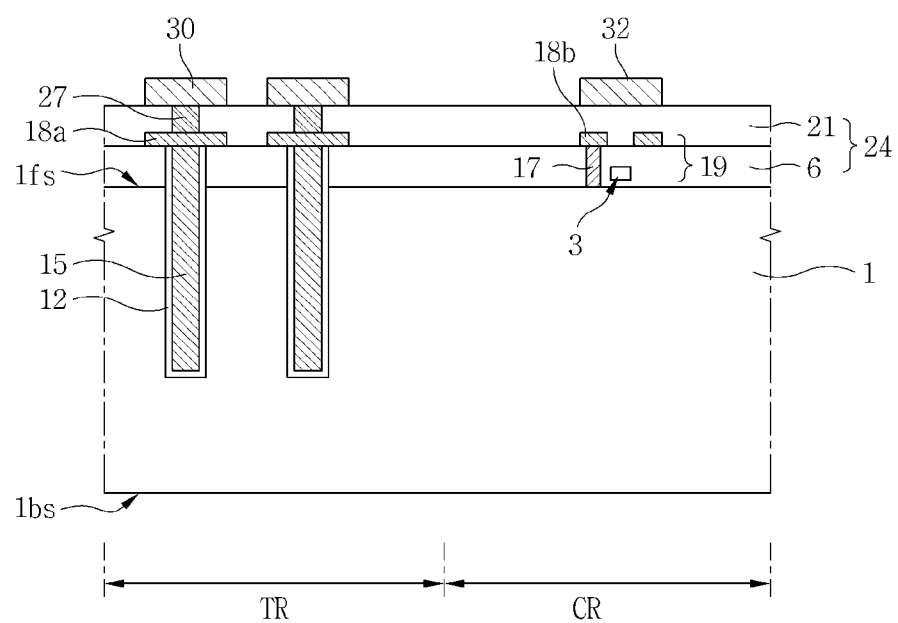

Referring to FIG. 17D, a via pad 18*a* may be formed to cover the through-via structure 15 and electrically connected to the through-via structure 15, and a line structure constituting an internal circuit 19 may be formed by electrically connecting the unit elements 3. The formation of the line structure may include forming a contact plug 17 through the lower front side insulating layer 6. The formation of the line structure may include forming an internal line 18*b* on the lower front side insulating layer 6 to cover the contact plug 17. The via pad 18*a* may be formed simultaneously with the internal line 18*b*. Accordingly, the via pad 18*a* and the internal line 18*b* may be formed of the same material and thickness as each other.

An upper front side insulating layer 21 may be formed on the lower front side insulating layer 6 to cover the via pad 18*a* and the internal line 18*b*. The lower front side insulating layer 6 and the upper front side insulating layer 21 may constitute a front side insulating layer 24. An internal via 27 may be formed in the upper front side insulating layer 21. The internal via 27 may be electrically connected to the via pad 18*a*. A front side conductive pattern 30 may be formed on the upper front side insulating layer 21.

In some embodiments, a front side dummy pattern 32 may be formed on the upper front side insulating layer 21 during the formation of the front side conductive pattern 30. The front side conductive pattern 30 and the front side dummy pattern 32 may be formed of the same material and thickness as each other.

Figure 17E:
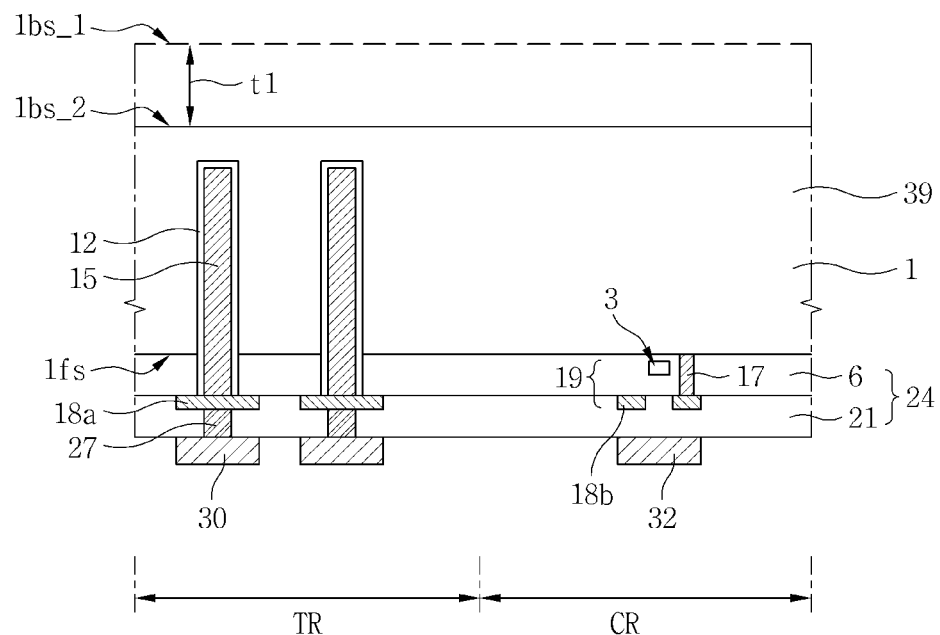

Referring to FIG. 17E, the semiconductor substrate 1 may be partially removed. The partial removal of the semiconductor substrate 1 may include removing a back side of the semiconductor substrate 1 to a first thickness t1 using a back-grinding process so as not to expose the through-via structure 15.

In FIG. 17E, reference numeral "1*bs*_1" denotes the back side of the semiconductor substrate 1 before the semiconductor substrate 1 is partially removed, while "1*bs*_2" denotes the back side of the semiconductor substrate 1 after the semiconductor substrate 1 is partially removed.

Figure 17F:
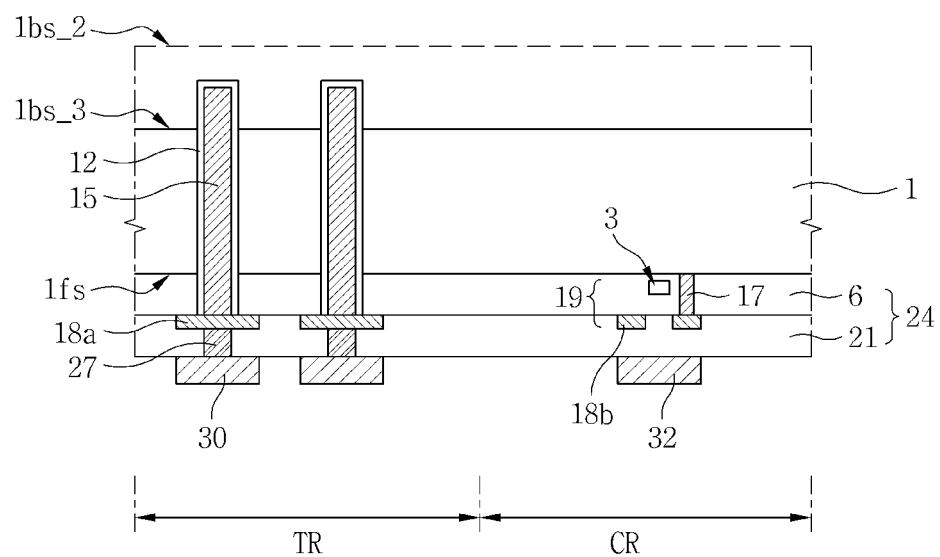

Referring to FIG. 17F, the back side of the semiconductor substrate 1 may be etched back so that the through-via structure 15 and the via insulating pattern 12 can protrude from the back side of the semiconductor substrate 1. In FIG. 17F, reference numeral "1*bs*_2" denotes the back side of the semiconductor substrate 1 before being etched back, while "1*bs*_3" denotes the back side of the semiconductor substrate 1 after being etched back.

Figure 17G:
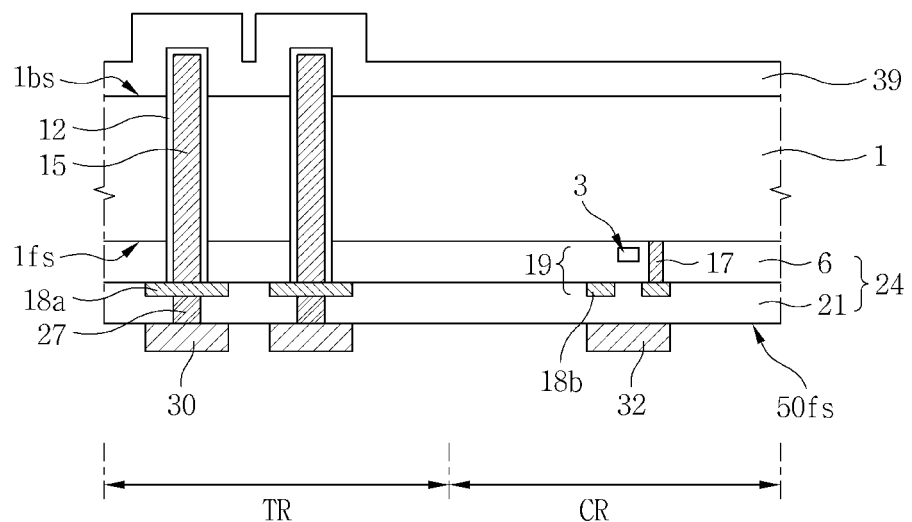

Referring to FIG. 17G, a back side insulating layer 39 may be formed on a back side 1*bs* of the semiconductor substrate 1. The back side insulating layer 39 may include, for example, silicon oxide, silicon nitride, silicon oxynitride, or a combination thereof.

Figure 17H:
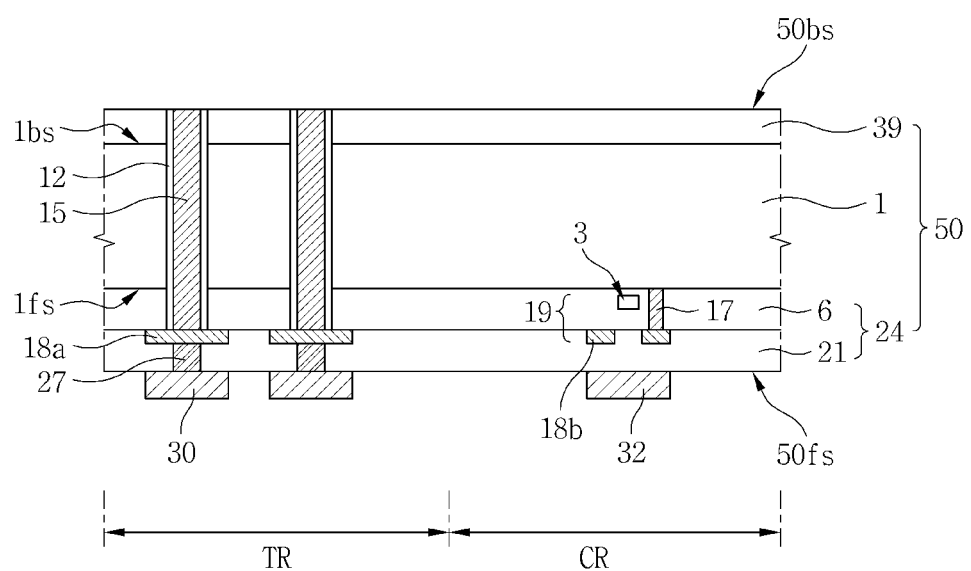

Referring to FIG. 17H, the through-via structure 15 may be exposed. The exposure of the through-via structure 15 may include planarizing the back side insulating layer 39 and removing the via insulating pattern 12 from an end of the through-via structure 15. Accordingly, the via insulating pattern 12 may remain on side surfaces of the through-via structure 15, and the back side insulating layer 39 may be planarized and formed on the back side 1*bs* of the semiconductor substrate 1 to surround a side surface of the end of the through-via structure 15. The semiconductor substrate 1, the front side insulating layer 24, the back side insulating layer 39, the through-via structure 15, and the internal circuit 19 may constitute a substrate 50.

Next, an example of a method of forming a back side conductive structure 66 capable of preventing deformation (e.g., warpage of the substrate 50) on a back side 50*bs* of the substrate 50 having the through-via structure 15 will be described with reference to FIGS. 18A through 18D.

Figure 18A:
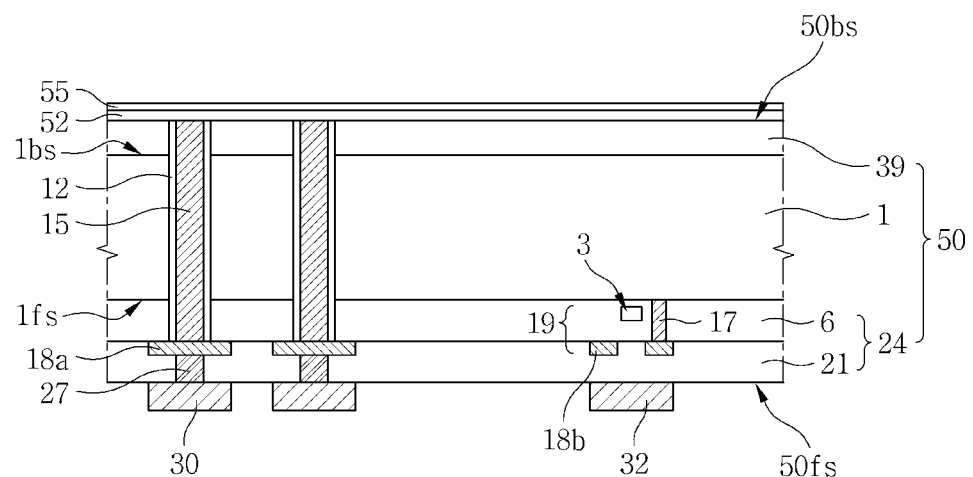

Referring to FIG. 18A, a back side barrier layer 52 and a back side seed layer 55 may be formed on the back side 50*bs* of the substrate 50. The back side barrier layer 52 may be formed of a conductive material, such as, for example, titanium, titanium nitride, titanium tungsten, tantalum, tantalum nitride, or tungsten nitride. The back side seed layer 55 may be formed of a metal, such as, for example, copper, ruthenium, nickel, or tungsten, using a deposition process.

Figure 18B:
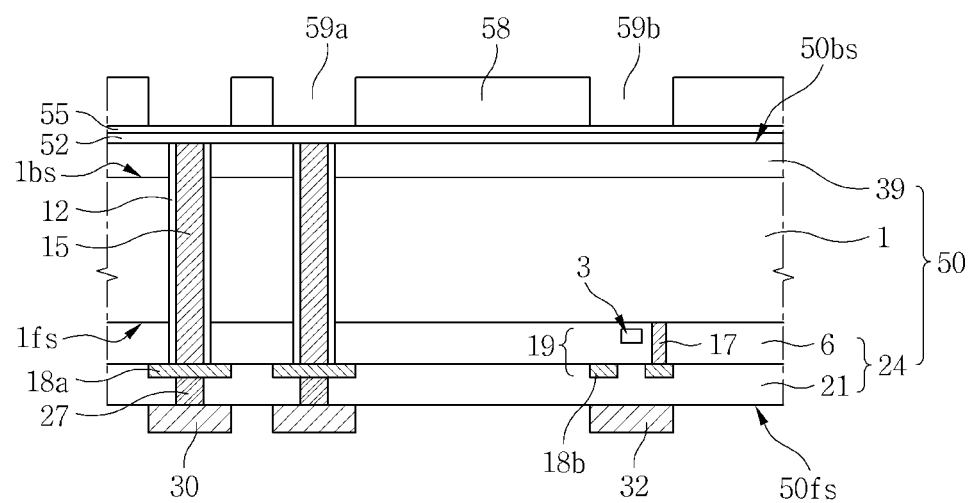

Referring to FIG. 18B, a mask pattern 58 may be formed on the back side seed layer 55. The mask pattern 58 may include a first opening 59*a* and a second opening 59*b* to expose the back side seed layer 55. The mask pattern 58 may include photoresist.

Figure 18C:
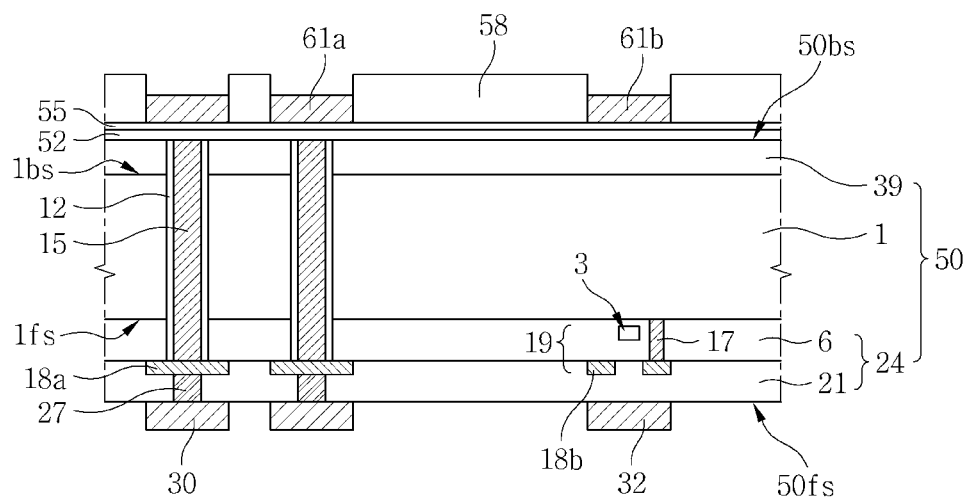

Referring to FIG. 18C, a first conductive pattern 61*a* may be formed within the first opening 59*a*, and a second conductive pattern 61b may be formed within the second opening 59b. The formation of the first and second conductive patterns 61a and 61b may include forming a metal, such as nickel and copper, using a plating process.

Figure 18D:
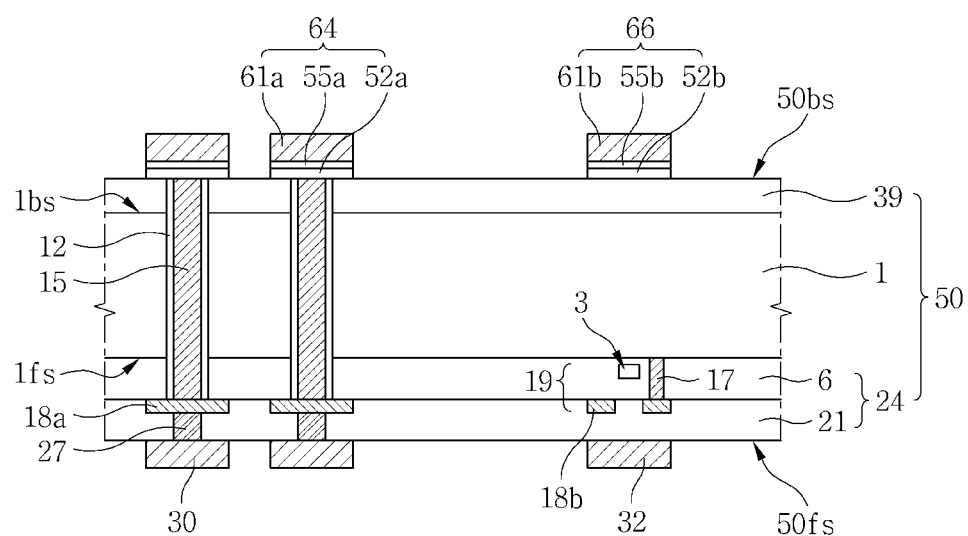

Referring to FIG. 18D, the mask pattern (58 in FIG. 18C) may be removed. Thereafter, the back side seed layer 55 and the back side barrier layer 52 disposed under the mask pattern 58 may be sequentially etched. Also, a back side seed layer disposed under the first conductive pattern 61a may remain and be defined as a first back side seed pattern 55a, while a back side seed layer disposed under the second conductive pattern 61b may remain and be defined as a second back side seed pattern 55b. Also, a back side barrier layer disposed under the first conductive pattern 61a may remain and be defined as a first back side barrier pattern 52a, while a back side barrier layer disposed under the second conductive pattern 61b may remain and be defined as a second back side barrier pattern 52b. The first back side barrier pattern 52a, the first back side seed pattern 55a, and the first conductive pattern 61a, which are stacked sequentially, may constitute a back side conductive pattern 64. The second back side barrier pattern 52b, the second back side seed pattern 55b, and the second conductive pattern 61b, which are stacked sequentially, may constitute a back side conductive structure 66.

In some embodiments, when the first and second back side seed patterns 55a and 55b and the first and second conductive patterns 61a and 61b are formed of the same material, boundaries between the first and second back side seed patterns 55a and 55b and the first and second conductive patterns 61a and 61b may disappear or become unclear.

FIGS. 19A through 19E are schematic cross-sectional views of a semiconductor device according to exemplary embodiments of the present general inventive concept.

A semiconductor device according to an exemplary embodiment of the present general inventive concept will now be described with reference to each of FIGS. 19A through 19E.

Figure 19A:
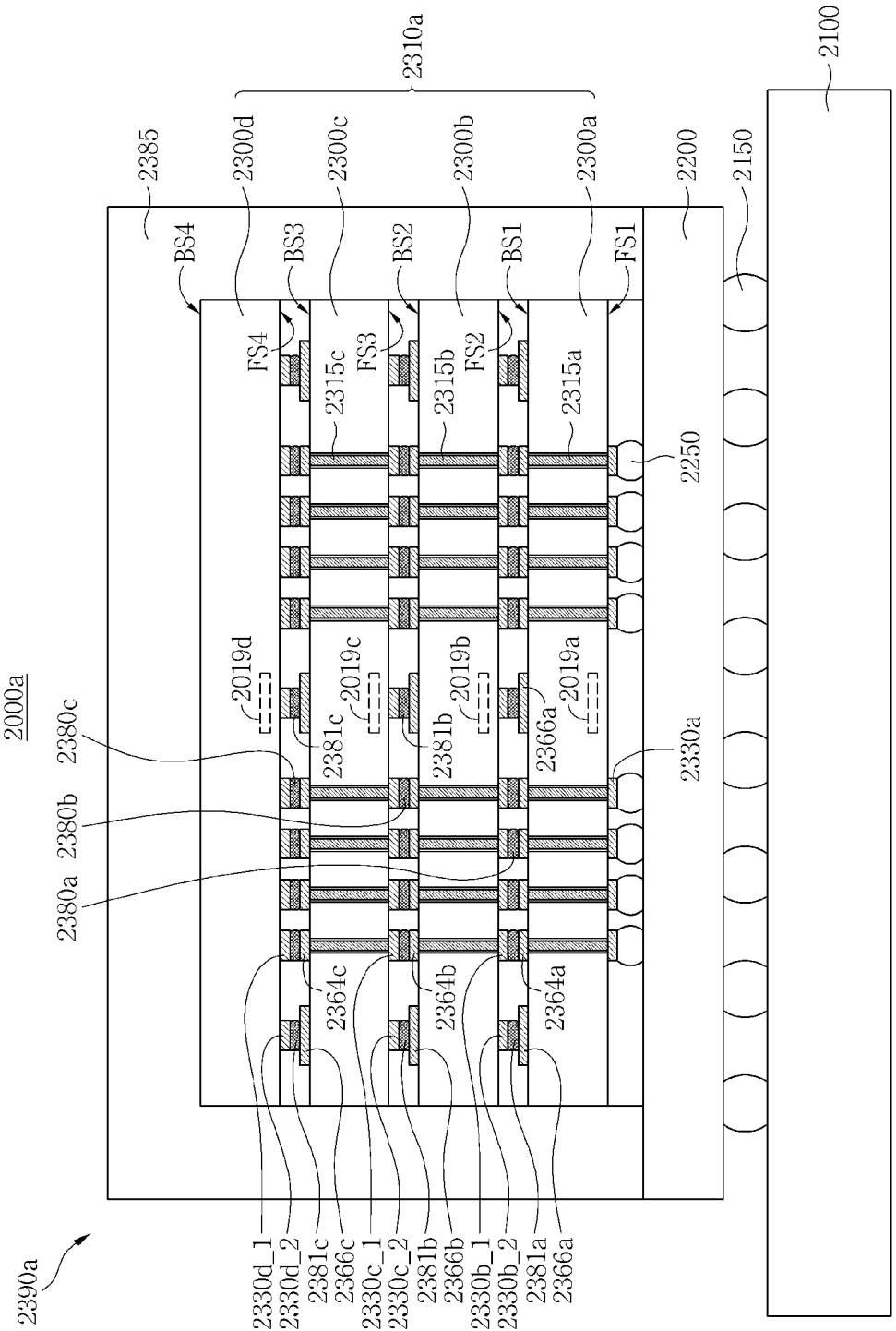
FIGS. 19A through 19E are respectively schematic cross-sectional views of semiconductor devices according to exemplary embodiments of the present general inventive concept.

Referring to FIG. 19A, a semiconductor device 2000a may include a semiconductor package 2390a mounted on a substrate 2100. The substrate 2100 and the semiconductor package 2390a may be physically connected using a connection structure 2150. The connection structure 2150 may include a solder material. The substrate 2100 may include a module board or a mother board.

The semiconductor package 2390a may include a stack chip structure 2310a disposed on a package substrate 2200. An insulating molding portion 2385 may be disposed to cover the stack chip structure 2310a. The stack chip structure 2310a may include a plurality of chips stacked on the package substrate 2200. For example, the stack chip structure 2310a may include a first chip 2300a, a second chip 2300b, a third chip 2300c, and a fourth chip 2300d, which are stacked sequentially. At least one of the chips 2300a, 2300b, 2300c, and 2300d may be any one of the semiconductor chips described with reference to FIGS. 1A through 18D. The stack chip structure 2310a and the package substrate 2200 may be electrically connected using substrate bumps 2250. The substrate bumps 2250 may include solders.

The first chip 2300a may have a front side FS1 facing the package substrate 2200 and a back side BS1 disposed opposite the front side FS1. The first chip 2300a may include a first internal circuit 2019a, first front side conductive patterns 2330a, first back side conductive patterns 2364a, a first back side conductive structure 2366a, and first through-via structures 2315a.

The first internal circuit 2019a may be substantially the same as the internal circuit 19 described with reference to FIGS. 1A through 18D. For example, the first internal circuit 2019a may be formed near to the front side FS1 in the first chip 2300a.

The first front side conductive patterns 2330a may be disposed on the front side FS1 of the first chip 2300a and electrically connected to the substrate bumps 2250.

The first back side conductive patterns 2364a and the first back side conductive structure 2366a may be disposed on the back side BS1 of the first chip 2300a and formed of the same material and thickness as each other. The first back side conductive structure 2366a may have the same shape as or a similar shape to any one of the back side conductive structures 66a, 66b, 66c, 166a, 166b, 166c, 166d, 166e, 166f, and 166g described with reference to FIGS. 1A, 2A, 3A, 5A, 6, 7, 8, 9, 10, and 11A, respectively. The first back side conductive structure 2366a may prevent deformation, such as warpage of the first chip 2300a, and serve to radiate heat, thereby improving reliability of the semiconductor device.

The first through-via structures 2315a may penetrate the first chip 2300a, penetrate the first chip 2300a interposed between the first front side conductive patterns 2330a and the first back side conductive patterns 2364a, and electrically connect the first front side conductive patterns 2330a and the first back side conductive patterns 2364a. The first through-via structures 2315a may include through-via structures configured to transmit I/O signals.

The second chip 2300b may have a front side FS2 facing the first chip 2300a and a back side BS2 disposed opposite the front side FS2. The second chip 2300b may include a second internal circuit 2019b, second front side conductive patterns 2330b_1, second front side dummy patterns 2330b_2, second back side conductive patterns 2364b, a second back side conductive structure 2366b, and second through-via structures 2315b. The second internal circuit 2019b may be formed near to the front side FS2 in the second chip 2300b. The second front side conductive patterns 2330b_1 and the second front side dummy patterns 2330b_2 may be disposed on the front side FS2 of the second chip 2300b and formed of the same material and thickness as each other.

The second back side conductive structure 2366b and the second back side conductive patterns 2364b may be disposed on the back side BS2 of the second chip 2300b and formed of the same material and thickness as each other. The second back side conductive structure 2366b may have the same shape as or a similar shape to any one of the back side conductive structures 66a, 66b, 66c, 166a, 166b, 166c, 166d, 166e, 166f, and 166g described with reference to FIGS. 1, 2A, 3A, 5A, 6, 7, 8, 9, 10, and 11A, respectively. The second back side conductive structure 2366b may prevent deformation, such as warpage of the second chip 2300b, and serve to radiate heat, thereby improving reliability of the semiconductor device.

The second through-via structures 2315b may penetrate the second chip 2300b interposed between the second front side conductive patterns 2330b_1 and the second back side conductive patterns 2364b and electrically connect the second front side conductive patterns 2330b_1 and the second back side conductive patterns 2364b. The second through-via structures 2315b may include through-via structures configured to transmit I/O signals.

The third chip 2300c may include a front side FS3 facing the second chip 2300b and a back side BS3 disposed opposite the front side FS3. The third chip 2300c may include a third internal circuit 2019c, a third front side conductive patterns 2330c_1, third front side dummy patterns 2330c_2, third back side conductive patterns 2364c, a third back side conductive structure 2366c, and third through-via structures 2315c. The third internal circuit 2019c may be formed near to the front side FS3 in the third chip 2300c. The third front side conductive patterns 2330c_1 and the third front side dummy patterns 2330c_2 may be disposed on the front side FS3 of the third chip 2300c and formed of the same material and thickness as each other.

The third back side conductive structure 2366c and the third back side conductive patterns 2364c may be disposed on the back side BS3 of the third chip 2300c and formed of the same material and thickness as each other. The third back side conductive structure 2366c may have the same shape as or a similar shape to the back side conductive structures 66a, 66b, 66c, 166a, 166b, 166c, 166d, 166e, 166f, and 166g described with reference to FIGS. 1A, 2A, 3A, 5A, 6, 7, 8, 9, 10, and 11A, respectively. The third back side conductive structure 2366c may prevent deformation, such as warpage of the third chip 2300c, and serve to radiate heat, thereby improving reliability of the semiconductor device.

The third through-via structures 2315c may penetrate the third chip 2300c interposed between the third front side conductive patterns 2330c_1 and the third back side conductive patterns 2364c and electrically connect the third front side conductive patterns 2330c_1 and the third back side conductive patterns 2364c. The third through-via structures 2315c may include through-via structures configured to transmit I/O signals.

The fourth chip 2300d may include a front side FS4 facing the third chip 2300c and a back side BS4 disposed opposite the front side FS4. The fourth chip 2300d may include a fourth internal circuit 2019d, fourth front side conductive patterns 2330d_1, and fourth front side dummy patterns 2330d_2. The fourth internal circuit 2019d may be formed near to the front side FS4 in the fourth chip 2300d. The fourth front side conductive patterns 2330d_1 and the fourth front side dummy patterns 2330d_2 may be disposed on the front side FS4 of the fourth chip 2300d and formed of the same material and thickness as each other. Among the first, second, and third through-via structures 2315a, 2315b, and 2315c, through-via structures configured to transmit I/O signals may be spaced apart from or electrically insulated from the second, third, and fourth front side dummy patterns 2330b_2, 2330c_2, and 2330d_2 and the first, second and third back side conductive structures 2366a, 2366b, and 2366c.

The stack chip structure 2310a may include first inter-chip bumps 2380a configured to electrically connect the first chip 2300a and the second chip 2300b, second inter-chip bumps 2380b configured to electrically connect the second chip 2300b and the third chip 2300c, and third inter-chip bumps 2380c configured to electrically connect the third chip 2300c and the fourth chip 2300d.

The first inter-chip bumps 2380a may be interposed between the first back side conductive patterns 2364a and the second front side conductive patterns 2330b_1, and electrically connect the first back side conductive patterns 2364a and the second front side conductive patterns 2330b_1. The second inter-chip bumps 2380b may be interposed between the second back side conductive patterns 2364b and the third front side conductive patterns 2330c_1, and electrically connect the second back side conductive patterns 2364b and the third front side conductive patterns 2330c_1. The third inter-chip bumps 2380c may be interposed between the third back side conductive patterns 2364c and the fourth front side conductive patterns 2330d_1, and electrically connect the third back side conductive patterns 2364c and the fourth front side conductive patterns 2330d_1.

The stack chip structure 2310a may include first buffer bumps 2381a interposed between the first back side conductive structure 2366a and the second front side dummy patterns 2330b_2, second buffer bumps 2381b interposed between the second back side conductive structure 2366b and the third front side dummy patterns 2330c_2, and third buffer bumps 2381c interposed between the third back side conductive structure 2366c and the fourth front side dummy patterns 2330d_2. The first through third buffer bumps 2381a, 2381b, and 2381c and the first through third inter-chip bumps 2380a, 2380b, and 2380c may comprise the same material, such as, for example, a solder material.

When the first through third buffer bumps 2381a, 2381b, and 2381c and the first through third inter-chip bumps 2380a, 2380b, and 2380c are formed using a solder process or solder reflow process performed at a higher temperature than room temperature, the first, second, and third back side conductive structures 2366a, 2366b, and 2366c may prevent or inhibit deformation, such as warpage of the chips 2300a, 2300b, and 2300c. Also, the first, second, and third back side conductive structures 2366a, 2366b, and 2366c may serve to radiate heat generated due to operations of the semiconductor substrate 2000.

At least one of the first, second, and third back side conductive structures 2366a, 2366b, and 2366c may have the same shape as or a similar shape to any one of the back side conductive structures 66a, 66b, 66c, 166a, 166b, 166c, 166d, 166e, 166f, and 166g described with reference to FIGS. 1A, 2A, 3A, 5A, 6, 7, 8, 9, 10, and 11A, respectively. However, the present general inventive concept is not limited thereto. For instance, at least one of the first, second, and third back side conductive structures 2366a, 2366b, and 2366c may be modified and have the same shape as or a similar shape to the back side conductive structure 66b' described with reference to FIGS. 2C and 2D or the back side conductive structure 66c' described with reference to FIGS. 3C and 3D.

A semiconductor device 2000b including a semiconductor chip having a back side conductive structure having the same shape as or a similar shape to the back side conductive structure 66b' described with reference to FIGS. 2C and 2D will now be described with reference to FIG. 19B.

Figure 19B:
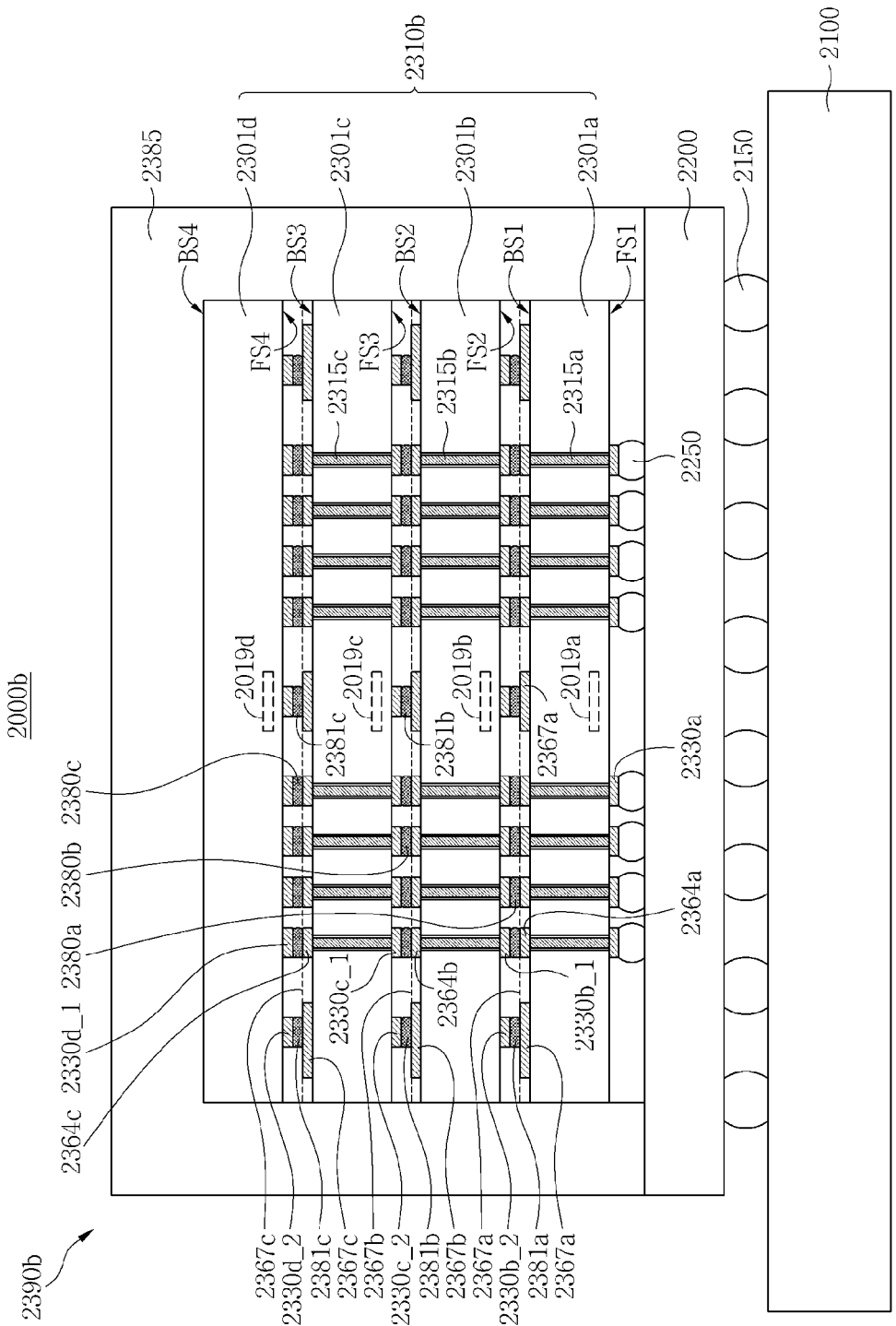

Referring to FIG. 19B, the semiconductor device 2000b according to an exemplary embodiment of the present general inventive concept may include a semiconductor package 2390b mounted on a substrate 2100. The semiconductor package 2390b may include a stack chip structure 2310b disposed on a package substrate 2200.

The stack chip structure 2310b may include a plurality of chips stacked on the package substrate 2200. For example, the stack chip structure 2310b may include a first chip 2301a, a second chip 2301b, a third chip 2301c, and a fourth chip 2301d, which may be sequentially stacked on the package substrate 2200. At least one of the chips 2301a, 2301b, 2301c, and 2301d may include the same structure as the back side conductive structure 66b' of the semiconductor chip 90b' described with reference to FIG. 2C.

The first chip 2301a may have a front side FS1 facing the package substrate 2200 and a back side BS1 disposed opposite the front side FS1. Like the first chip 2300a of FIG. 19A, the first chip 2301a may include a first internal circuit 2019a, first front side conductive patterns 2330a, first back side conductive patterns 2364a, and first through-via structures 2315a.

Furthermore, the first chip 2301a may include a first back side conductive structure 2367a, which may be formed of the same material and thickness as the first back side conductive patterns 2364a and disposed on the back side BS1 of the first chip 2301a, and extend to at least one of side surfaces of the first chip 2301a. For example, the first back side conductive structure 2367a may have the same shape as the back side conductive structure 66b' described with reference to FIGS. 2C and 2D.

The second chip 2301b may have a front side FS2 facing the first chip 2301a and a back side BS2 disposed opposite the front side FS2. Like the second chip 2300b of FIG. 19A, the second chip 2301b may include a second internal circuit 2019b, second front side conductive patterns 2330b_1, second front side dummy patterns 2330b_2, second back side conductive patterns 2364b, and second through-via structures 2315b.

Furthermore, the second chip 2301b may include a second back side conductive structure 2367b, which may be formed of the same material and thickness as the second back side conductive patterns 2364b and disposed on the back side BS2 of the second chip 2301b, and extend to at least one of side surfaces of the second chip 2301b. For instance, the second back side conductive structure 2367b may have the same shape as the back side conductive structure 66b' described with reference to FIGS. 2C and 2D.

Like the third chip 2300c of FIG. 19A, the third chip 2301c may include a third internal circuit 2019c, third front side conductive patterns 2330c_1, third front side dummy patterns 2330c_2, third back side conductive patterns 2364c, and third through-via structures 2315c.

Furthermore, the third chip 2301c may include a third back side conductive structure 2367c, which may be formed of the same material and thickness as the third back side conductive patterns 2364c and disposed on the back side BS3 of the third chip 2301c, and extend to at least one of side surfaces of the third chip 2301c. For example, the third back side conductive structure 2367c may have the same shape as the back side conductive structure 66b' described with reference to FIGS. 2C and 2D.

Like the fourth chip 2300d of FIG. 19A, the fourth chip 2301d may include a fourth internal circuit 2019d, fourth front side conductive patterns 2330d_1, and fourth front side dummy patterns 2330d_2.

The stack chip structure 2310b may include first through third inter-chip bumps 2380a, 2380b, and 2380c and first through third buffer bumps 2381a, 2381b, and 2381c as described with reference to FIG. 19A.

At least one of the first through third back side conductive structures 2367a, 2367b, and 2367c of the stack chip structure 2310b may have the same shape as or a similar shape to the back side conductive structure 66b' described with reference to FIGS. 2C and 2D.

In other embodiments, at least one of the back side conductive structures 2366a, 2366b, 2366c, 2367a, 2367b, and 2367c described with reference to FIGS. 19A and 19B may be grounded like at least one of the back side conductive structures 66c, 66c', and 166g of FIGS. 3A, 3B, 3C, 3D, 11A, and 11B. An example of a semiconductor device including a semiconductor chip having the grounded back side conductive structure will now be described with reference to FIG. 19C.

Figure 19C:
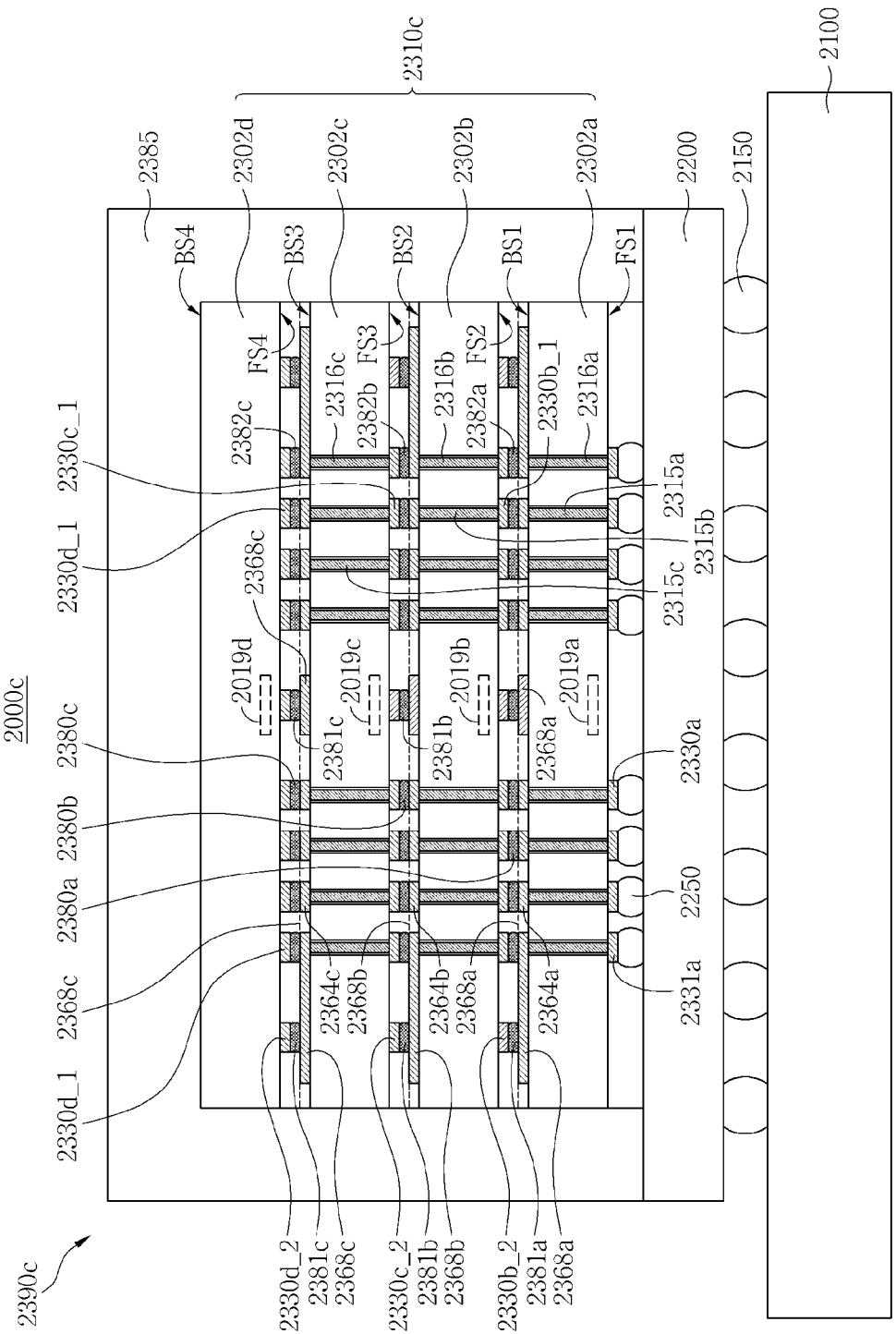

Referring to FIG. 19C, a semiconductor device 2000c according to an exemplary embodiment of the present general inventive concept may include a semiconductor package 2390c mounted on a substrate 2100. The semiconductor package 2390c may include a stack chip structure 2310c disposed on a package substrate 2200.

The stack chip structure 2310c may include a first chip 2302a, a second chip 2302b, a third chip 2303c, and a fourth chip 2302d, which may be sequentially stacked on the package substrate 2200. At least one of the chips 2302a, 2302b, 2302c, and 2303d may include a grounded back side conductive structure.

The first chip 2302a may include a front side FS1 facing the package substrate 2200 and a back side BS1 disposed opposite the front side FS1. The first chip 2302a may include a first internal circuit 2019a, first front side conductive patterns 2330a and 2331a, first back side conductive patterns 2364a, a first back side conductive structure 2368a, first signal I/O through-via structures 2315a, and a first ground through-via structure 2316a.

The first front side conductive patterns 2330a and 2331a may be disposed on the front side FS1 of the first chip 2302a. The first front side conductive patterns may include first front side signal I/O connection patterns 2330a and first front side ground connection patterns 2331a.

The first back side conductive patterns 2364a and the first back side conductive structure 2368a may be disposed on the back side BS1 of the first chip 2302a and formed of the same material and thickness as each other. Like the signal I/O through-via structure 15io of FIG. 3B, the first signal I/O through-via structure 2315a may electrically connect the first front side signal I/O connection patterns 2330a and the first back side conductive patterns 2364a.

Like the ground through-via structure 15g of FIG. 3B, the first ground through-via structure 2316a may electrically connect the first front side ground connection pattern 2331a and the first back side conductive structure 2368a. Accordingly, the first back side conductive structure 2368a may be grounded, like the back side conductive structure 66c' of FIGS. 3C and 3D.

The second chip 2302b may have a front side FS2 facing the first chip 2302a and a back side BS2 disposed opposite the front side FS2. The second chip 2302b may include a second internal circuit 2019b, second front side conductive patterns 2330b_1 and 2330b_3, second front side dummy patterns 2330b_2, second back side conductive patterns 2364b, a second back side conductive structure 2368b, a second signal I/O through-via structure 2315b, and a second ground through-via structure 2316b.

The second front side conductive patterns may include second front side signal I/O connection patterns 2330b_1 and second front side ground connection patterns 2330b_3, which may be disposed on the front side FS2 of the second chip 2302b.

The second back side conductive patterns 2364b and the second back side conductive structure 2368b may be disposed on the back side BS2 of the second chip 2302b and formed of the same material and thickness as each other.

Like the signal I/O through-via structure 15io of FIG. 3B, the second signal I/O through-via structure 2315b may electrically connect the second front side signal I/O connection patterns 2330b_1 and the second back side conductive patterns 2364b.

Like the ground through-via structure 15g of FIG. 3B, the second ground through-via structure 2316b may electrically connect the second front side ground connection pattern 2330b_3 and the second back side conductive structure 2368b. Accordingly, the second back side conductive structure 2368b may be grounded like the back side conductive structure 66c of FIGS. 3A and 3B or the back side conductive structure 66c' of FIGS. 3C and 3D.

The third chip 2302c may have a front side FS3 facing the second chip 2302b and a back side BS3 disposed opposite the front side FS3. The third chip 2303c may include third internal circuit 2019c, third front side conductive patterns 2330c_1 and 2330c_3, third front side dummy patterns 2330c_2, third back side conductive patterns 2364c, a third back side conductive structure 2368c, a third signal I/O through-via structure 2315c, and a third ground through-via structure 2316c.

The third front side conductive patterns may include third front side signal I/O connection patterns 2330c_1 and third front side ground connection patterns 2330c_3, which may be disposed on the front side FS3 of the third chip 2302c.

The third back side conductive patterns 2364c and the third back side conductive structure 2368c may be disposed on the back side BS3 of the third chip 2302c and formed of the same material and thickness as each other.

Like the signal I/O through-via structure 15io of FIG. 3B, the third signal I/O through-via structure 2315c may electrically connect the third front side signal I/O connection patterns 2330c_1 and the third back side conductive patterns 2364c.

Like the ground through-via structure 15g of FIG. 3B, the third ground through-via structure 2316c may electrically connect the third front side ground connection pattern 2330c_3 and the third back side conductive structure 2368c. Accordingly, the third back side conductive structure 2368c may be grounded like the back side conductive structure 66c of FIGS. 3A and 3B or the back side conductive structure 66c' of FIGS. 3C and 3D.

The fourth chip 2302d may have a front side FS4 facing the third chip 2302c and a back side BS4 disposed opposite the front side FS4. The fourth chip 2302d may include a fourth internal circuit 2019d, fourth front side conductive patterns 2330d_1 and 2330d_3, and fourth front side dummy patterns 2330d_2. The fourth front side conductive patterns may include fourth front side signal I/O connection patterns 2330d_1 and fourth front side ground connection patterns 2330d_3, which may be disposed on the front side FS4 of the fourth chip 2302d.

The stack chip structure 2310c may include first through third inter-chip bumps 2380a, 2380b, and 2380c and first through third buffer bumps 2381a, 2381b, and 2381c as described with reference to FIG. 19A.

Furthermore, the stack chip structure 2310c may include a first ground bump 2382a interposed between the first back side conductive structure 2368a and the second front side ground connection pattern 2330b_3, a second ground bump 2382b interposed between the second back side conductive structure 2368b and the third front side ground connection pattern 2330c_3, and a third ground bump 2382c interposed between the third back side conductive structure 2368c and the fourth front side ground connection pattern 2330d_3.

The first through third inter-chip bumps 2380a, 2380b, and 2380c, the first through third buffer bumps 2381a, 2381b, and 2381c, and the first through third ground bumps 2382a, 2382b, and 2382c may comprise a solder material.

Another semiconductor device according to exemplary embodiments of the present general inventive concept will now be described with reference to FIG. 19D.

Figure 19D:
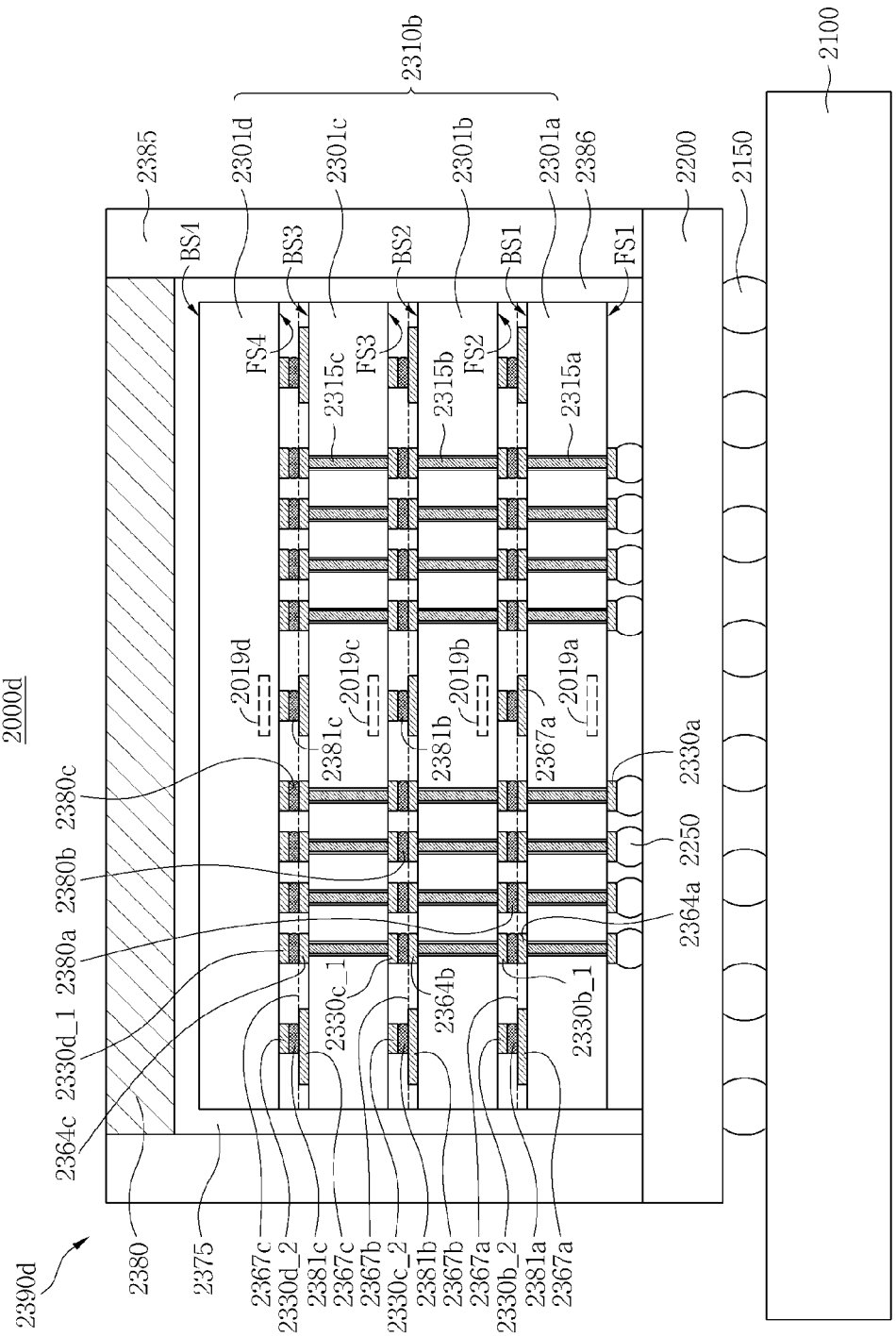

Referring to FIG. 19D, a semiconductor device 2000d according to an exemplary embodiment of the present general inventive concept may include a semiconductor package 2390d mounted on a substrate 2100. The substrate 2100 and the semiconductor package 2390d may be physically connected using a connection structure 2150. The connection structure 2150 may include a solder material. The substrate 2100 may include a module board or a mother board.

The semiconductor package 2390d may include a stack chip structure 2310b, a thermal interface material (TIM) layer 2375 contacted by a side surface of the stack chip structure 2310b, and a heat spreader 2380 disposed on the stack chip structure 2310b. The TIM layer 2375 and the heat spreader 2380 may be in contact with each other. The TIM layer 2375 and the heat spreader 2380 may serve to radiate heat along with the first through third back side conductive structures 2367a, 2367b, and 2367c to improve reliability of the semiconductor device.

In some embodiments, the TIM layer 2375 may include a portion extending between an upper portion of the stack chip structure 2310b and the heat spreader 2380.

In some embodiments, the stack chip structure 2310b may substantially be a stack chip structure as described with reference to FIG. 19B. The first through third back side conductive structures 2367a, 2367b, and 2367c of the stack chip structure 2310b may be in contact with the TIM layer 2375. Accordingly, heat generated due to operations of the internal circuits 2019a, 2019b, and 2019c may be radiated through the first through third back side conductive structures 2367a, 2367b, and 2367c, the TIM layer 2375, and the heat spreader 2380.

In some embodiments, a molding portion 2385 may be disposed to surround side surfaces of the TIM layer 2375 and the heat spreader 2380.

Another semiconductor device according to exemplary embodiments of the present general inventive concept will now be described with reference to FIG. 19E.

Figure 19E:
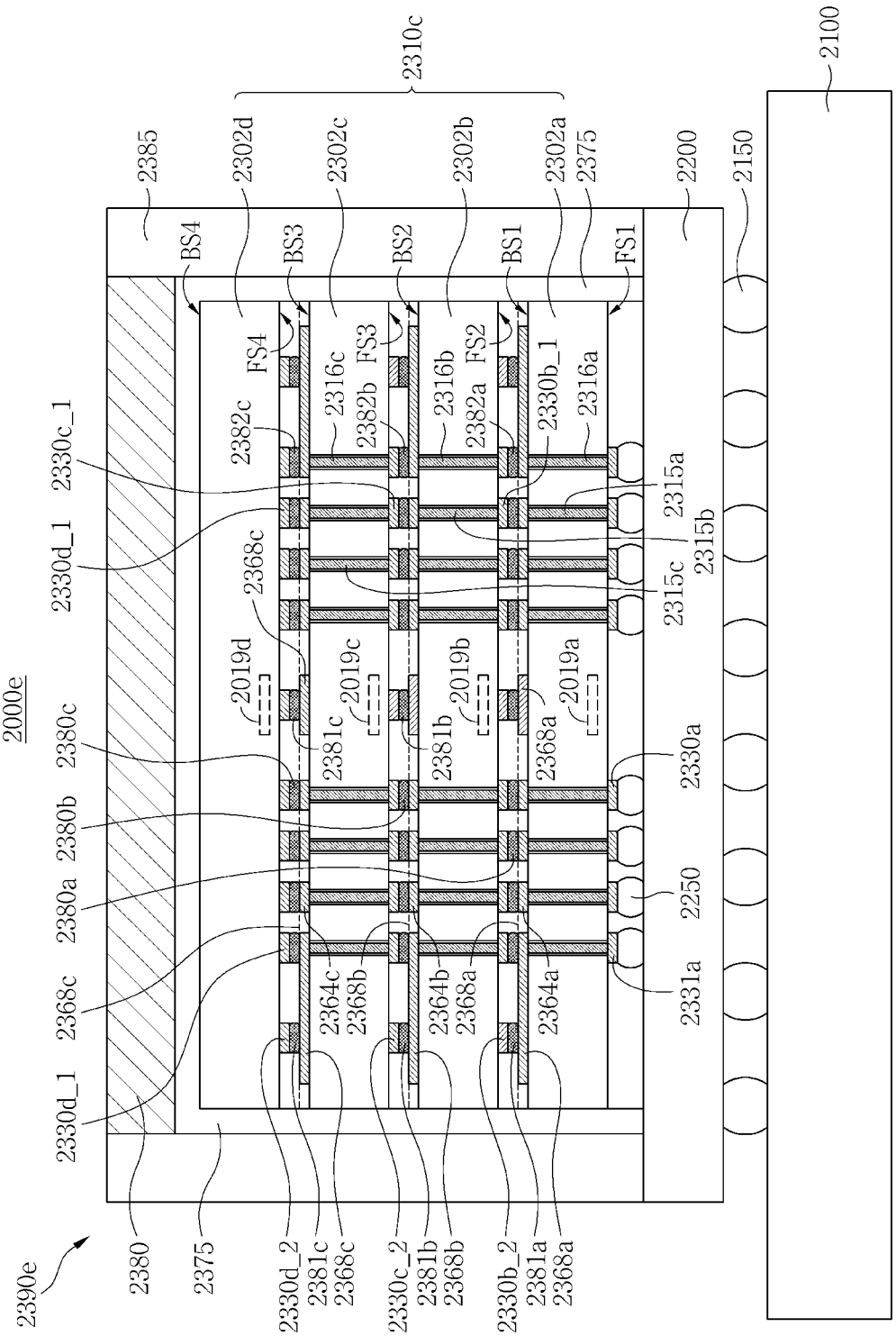

Referring to FIG. 19E, a semiconductor device 2000e according an exemplary embodiment of the present general inventive concept may include a semiconductor package 2390e mounted on a substrate 2100. The substrate 2100 and the semiconductor package 2390e may be physically connected using a connection structure 2150.

The semiconductor package 2390e may include a stack chip structure 2310c, a TIM layer 2375 contacted by a side surface of the stack chip structure 2310c, and a heat spreader 2380 disposed on the stack chip structure 2310c. The TIM layer 2375 and the heat spreader 2380 may be in contact with each other. The TIM layer 2375 may include a portion extending between an upper portion of the stack chip structure 2310b and the heat spreader 2380. A molding portion 2385 may be disposed to surround side surfaces of the TIM layer 2375 and the heat spreader 2380.

In some embodiments, the stack chip structure 2310c may be substantially the same stack chip structure as described with reference to FIG. 19C. The first through third back side conductive structures 2368a, 2368b, and 2368c of the stack chip structure 2310c may be in contact with the TIM layer 2375.

The first through third back side conductive structures 2368a, 2368b, and 2368c may serve to radiate heat along with the TIM layer 2375 and the heat spreader 2380 to improve reliability of the semiconductor device.

In addition, since the first through third back side conductive structures 2368a, 2368b, and 2368c may prevent or inhibit deformation, such as warpage of the chips 2302a, 2302b, and 2302c, solder material layers formed between the chips 2302a, 2302b, 2302c, and 2302d, for example, the first through third inter-chip bumps 2380a, 2380b, and 2380c, the first through third buffer bumps 2381a, 2381b, and 2381c, and the first through third ground bumps 2382a, 2382b, and 2382c may be formed stably and reliably.

Furthermore, the first through third back side conductive structures 2368a, 2368b, and 2368c may serve to shield electromagnetic waves (EMWs), which are externally generated and deteriorate the internal circuits 2019a, 2019b, and 2019c, or serve to shield EMWs generated by the internal circuits 2019a, 2019b, and 2019c, thereby improving reliability of the semiconductor device.

In addition, the first through third back side conductive structures 2368a, 2368b, and 2368c may be connected to the ground through-via structures 2316a, 2316b, and 2316c and grounded, so that noise between lines configured to transmit signals of the semiconductor device can be removed. As a result, performance and reliability of the semiconductor device can be enhanced.

Figure 20:
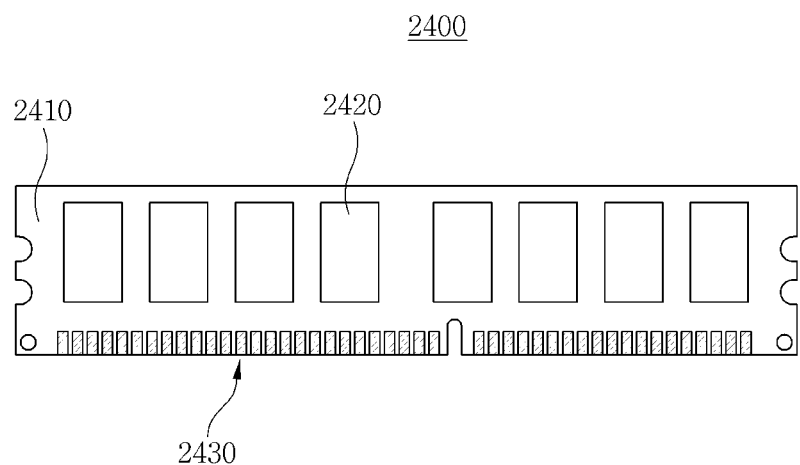
FIG. 20 is a schematic diagram of a memory module including a semiconductor device according to exemplary embodiments of the present general inventive concept.

FIG. 20 is a schematic diagram of a memory module 2400 including a semiconductor device according to exemplary embodiments of the present general inventive concept.

Referring to FIG. 20, the memory module 2400 may include a memory module substrate 2410 and a plurality of memory devices 2420 and a plurality of terminals 2430 disposed on the memory module substrate 2410.

The memory module substrate 2410 may include a printed circuit board (PCB) or a wafer. Each of the memory devices 2420 may be any one of the semiconductor devices described with reference to FIGS. 1A through 19E according to exemplary embodiments of the present general inventive concept or a semiconductor package including the semiconductor devices. The terminals 2430 may include a conductive metal. The terminals 2430 may be electrically connected to the memory devices 2420.

Figure 21:
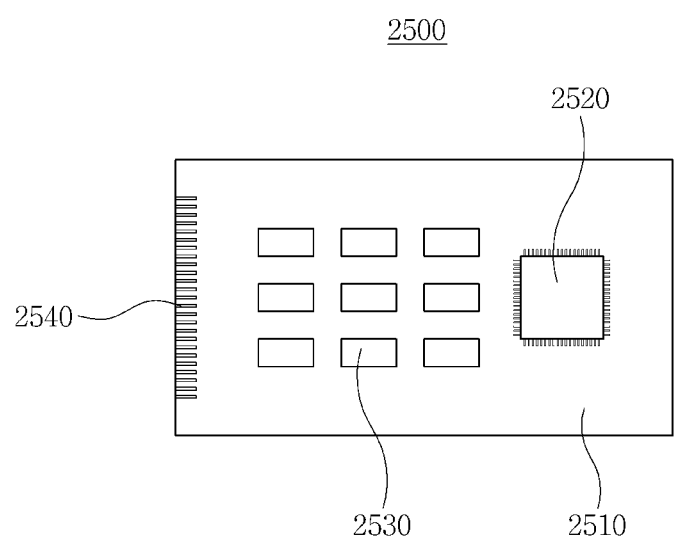
FIG. 21 is a schematic diagram of a semiconductor module including a semiconductor device according to exemplary embodiments of the present general inventive concept.

FIG. 21 is a schematic diagram of a semiconductor module 2500 including a semiconductor device according to exemplary embodiments of the present general inventive concept.

Referring to FIG. 21, the semiconductor module 2500 may include a semiconductor substrate 2530 formed on a module substrate 2510. The semiconductor substrate 2530 may be any one of the semiconductor devices described with reference to FIGS. 1A through 19E according to exemplary embodiments of the present general inventive concept or a semiconductor package including the semiconductor devices.

The semiconductor module 2500 may further include a microprocessor (MP) 2520 mounted on the module substrate 2510. I/O terminals 2540 may be disposed on at least one side of the module substrate 2510.

Figure 22:
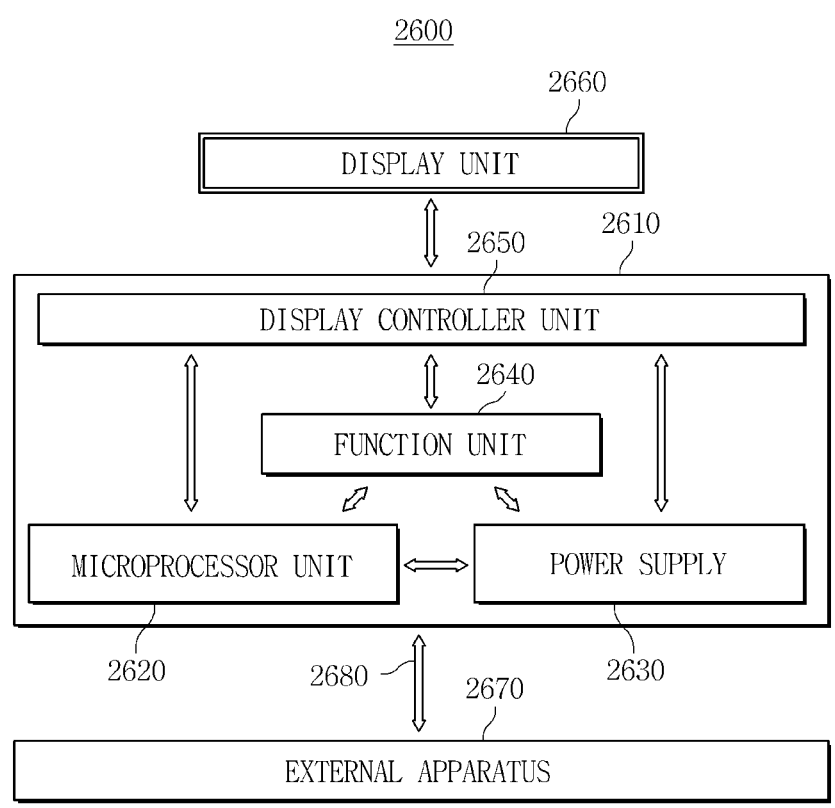
FIG. 22 is a conceptual block diagram of an electronic system including a semiconductor device according to exemplary embodiments of the present general inventive concept.

FIG. 22 is a conceptual block diagram of an electronic system 2600 including a semiconductor device according to exemplary embodiments of the present general inventive concept.

Referring to FIG. 22, the electronic system 2600 may include a body 2610. The body 2610 may include a microprocessor (MP) unit 2620, a power supply 2630, a function unit 2640, and/or a display controller unit 2650. The body 2610 may be a system board or mother board having a PCB.

The MP unit 2620, the power supply 2630, the function unit 2640, and the display controller unit 2650 may be mounted on the body 2610.

A display unit 2660 may be disposed on a top surface of the body 2610 or outside the body 2610. For example, the display unit 2660 may be disposed on a surface of the body 2610 and display an image processed by the display controller 2650.

The power supply 2630 may receive a predetermined voltage from an external power source, divide the predetermined voltage into various voltage levels, and transmit divided voltages to the MP unit 2620, the function unit 2640, and the display controller 2650.

The MP unit 2620 may receive a voltage from the power supply 2630 and control the function unit 2640 and the display unit 2660.

The function unit 2640 may implement various functions of the electronic system 2600. For instance, when the electronic system 2600 is a mobile electronic product, such as a portable phone, the function unit 2640 may include several elements capable of wireless communication functions, such as output of an image to the display 2660 or output of a voice to a speaker, by dialing or communication with an external apparatus 2670. When the function unit 2640 includes a camera, the function unit 2640 may serve as an image processor.

In other embodiments, when the electronic system 2600 is connected to a memory card to increase capacity, the function unit 2640 may be a memory card controller. The function unit 2640 may transmit and receive signals to/from the external apparatus 2670 through a wired or wireless communication unit 2680.

In addition, when the electronic system 2600 needs a universal serial bus (USB) to expand functions thereof, the function unit 2640 may serve as an interface controller.

A semiconductor device according to exemplary embodiments of the present general inventive concept may be included in at least one of the function unit 2640 or the MP unit 2620.

Figure 23:
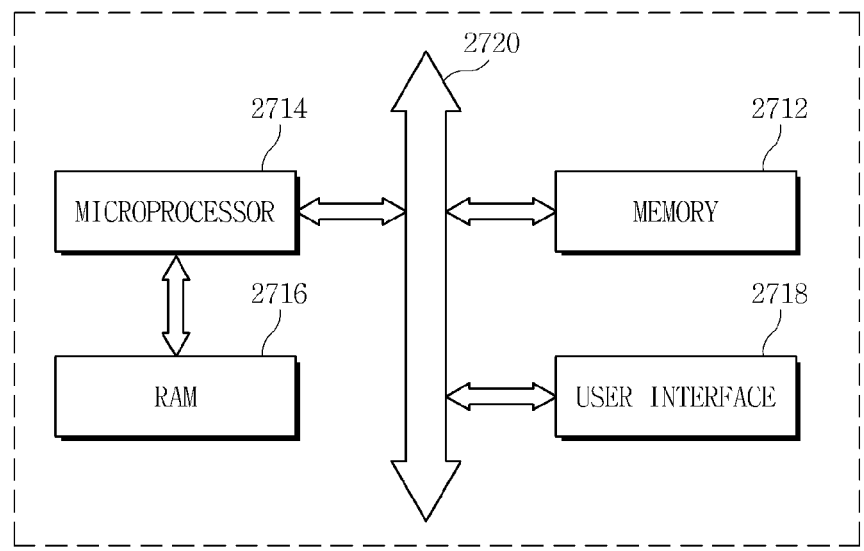
FIG. 23 is a schematic block diagram of another electronic system including a semiconductor device according to exemplary embodiments of the present general inventive concept.

FIG. 23 is a schematic block diagram of another electronic system 2700 including a semiconductor device according to exemplary embodiments of the present general inventive concept.

Referring to FIG. 23, the electronic system 2700 may include a semiconductor device according to exemplary embodiments of the present general inventive concept. The electronic system 2700 may be used to fabricate a mobile device or computer. For example, the electronic system 2700 may include a memory system 2712, a MP 2714, a random access memory (RAM) 2716, and a user interface 2718, which may communicate data using a bus 2720. The MP 2714 may program and control the electronic system 2700. The RAM 2716 may be used as an operation memory of the MP 2714. The MP 2714, the RAM 2716, and/or other elements may be assembled within a single package. For instance, the MP 2714, the memory system 2712, and/or the RAM 2716 may include a semiconductor device according to exemplary embodiments of the present general inventive concept.

The user interface 2718 may be used to input data to the electronic system 2700 or output data from the electronic system 2700. The memory system 2712 may store codes for operating the MP 2714, data processed by the MP 2714, or external input data. The memory system 2712 may include a controller and a memory.

Figure 24:
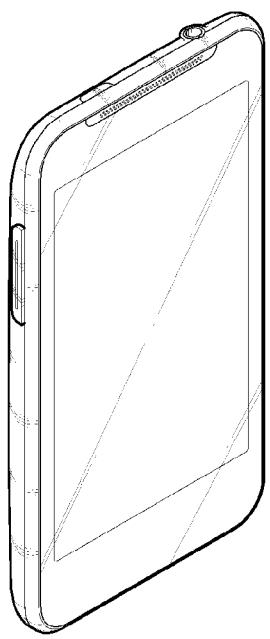
FIG. 24 is a schematic diagram of a mobile wireless phone including a semiconductor device according to exemplary embodiments of the present general inventive concept.

FIG. 24 is a schematic diagram of a mobile wireless phone 2800 including a semiconductor device according to exemplary embodiments of the present general inventive concept. The mobile wireless phone 2800 may be interpreted as a tablet personal computer (PC). Furthermore, a semiconductor device according to embodiments of the present general inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and/or household uses.

According to exemplary embodiments of the present general inventive concept, a semiconductor chip including a back side conductive structure can be provided. The back side conductive structure may be formed on a back side of the semiconductor chip simultaneously with back side conductive patterns (e.g., pads or bumps) configured to transmit signals. The back side conductive structure may prevent deformation, such as warpage of the semiconductor chip, and serve to radiate heat. Furthermore, the back side conductive structure can be grounded to remove noise between metal lines and also serve to radiate heat, thereby improving reliability of the semiconductor chip or a device. In addition, to radiate heat of the semiconductor chip, a TIM layer can be formed on a side surface of the semiconductor chip. The TIM layer can serve to radiate heat along with the back side conductive structure of the semiconductor chip. Thus, the back side conductive structure serving as a heat radiator and the TIM layer can improve the reliability of the device. Moreover, in a stack chip structure formed using the semiconductor chip having the back side conductive structure, inter-chip bumps physically contacted by a plurality of semiconductor chips can be formed stably and reliability.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this general inventive concept as defined in the claims. In the claims, means-plus-function clauses are intended to cover the structures described herein as performing the recited function, and not only structural equivalents but also equivalent structures.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor device comprising:
a substrate having a front side and a back side disposed opposite the front side;
an internal circuit disposed on or near to the front side of the substrate;
signal input/output (I/O) through-via structures disposed in the substrate;
back side conductive patterns disposed on the back side of the substrate and electrically connected to the signal I/O through-via structures; and
a back side conductive structure disposed on the back side of the substrate and spaced apart from the signal I/O through-via structures disposed in the substrate,
wherein the back side conductive structure includes parallel supporter portions, and the back side conductive patterns are disposed between the parallel supporter portions of the back side conductive structure.

2. The device of claim 1, wherein the back side conductive structure is formed of the same material and thickness as the back side conductive patterns.

3. The device of claim 1, wherein the parallel supporter portions of the back side conductive structure are parallel to opposite side surfaces of the substrate.

4. The device of claim 1, wherein the back side conductive structure further comprises a middle supporter portion interposed between the parallel supporter portions.

5. The device of claim 4, wherein the middle supporter portion passes between the back side conductive patterns.

6. The device of claim 4, wherein the middle supporter portion is interposed between middle portions of the parallel supporter portions.

7. A semiconductor device comprising:
a substrate having a front side and a back side disposed opposite the front side;
an internal circuit disposed on or near to the front side of the substrate;
signal input/output (I/O) through-via structures disposed in the substrate;
front signal I/O connection patterns disposed on the front side of the substrate and electrically connected to the signal I/O through-via structures; and
back side conductive patterns and a back side conductive structure disposed on the back side of the substrate,
wherein the back side conductive patterns are electrically connected to the signal I/O through-via structures,
the back side conductive structure is electrically insulated from the signal I/O through-via structures and formed of the same material and thickness as the back side conductive patterns,
the back side conductive structure includes a first portion, and
the first portion of the back side conductive structure is interposed between opposite first and second side surfaces of the substrate and passes between a middle portion of the first side surface and a middle portion of the second side surface.

8. The device of claim 7, wherein the first portion of the back side conductive structure includes a bar or line shape.

9. The device of claim 7, wherein the back side conductive structure comprises:
the first portion disposed parallel to opposite first and second side surfaces of the substrate;
a second portion disposed perpendicular to the first portion; and
a third portion disposed perpendicular to the first portion and parallel to the second portion.

10. The device of claim 7, wherein the substrate comprises:
a semiconductor substrate having a front side and a back side;
a front side insulating layer disposed on the front side of the semiconductor substrate; and
a first back side insulating layer and a second back side insulating layer sequentially stacked on the back side of the semiconductor substrate.

11. The device of claim 7, further comprising a ground through-via structure disposed in the substrate,
wherein the ground through-via structure is connected to the back side conductive structure and spaced apart from the signal I/O through-via structures.

12. The device of claim 11, wherein the back side conductive structure comprises:
a ground portion electrically connected to the ground through-via structure; and
a supporter portion disposed parallel to any one of side surfaces of the substrate,
wherein the ground portion and the supporter portion of the back side conductive structure are electrically connected.

13. The device of claim 9, wherein the first portion is interposed between the second and third portions.

14. The device of claim 10, wherein the through-via structures penetrate the semiconductor substrate and penetrate the first back side insulating layer, and the back side conductive patterns and the back side conductive structure are interposed between the first back side insulating layer and the second back side insulating layer.

15. The device of claim 14, further comprising back side signal I/O connection patterns disposed on the second back side insulating layer,
wherein the back side signal I/O connection patterns are electrically connected to the back side conductive patterns.

16. A semiconductor package comprising:
a first semiconductor chip disposed on a package substrate and having a first front side and a first back side disposed opposite the first front side;
a second semiconductor chip disposed on the first semiconductor chip and having a second front side facing the first semiconductor chip and a second back side disposed opposite the second front side; and an inter-chip bump interposed between the first semiconductor chip and the second semiconductor chip, wherein the first semiconductor chip comprises:

a signal input/output (I/O) through-via structure disposed in the first semiconductor chip;

a back side conductive pattern disposed on the first back side of the first semiconductor chip and electrically connected to the signal I/O through-via structure; and a back side conductive structure disposed on the first back side of the first semiconductor chip and spaced apart from the signal I/O through-via structure, wherein the second semiconductor chip comprises:

a front side conductive pattern disposed on the second front side of the second semiconductor chip, the front side conductive pattern facing the back side conductive pattern, wherein the inter-chip bump is interposed between the front side conductive pattern and the back side conductive pattern, and wherein the back side conductive structure includes supporter portions disposed parallel to one another, the supporter portions having the same length.

17. The package of claim 16, wherein the back side conductive structure is formed of the same material and thickness as the back side conductive pattern.

18. The package of claim 16, further comprising a plurality of front side dummy patterns disposed on the second front side of the second semiconductor chip.

19. The package of claim 18, further comprising buffer bumps interposed between the plurality of front side dummy patterns and the back side conductive structure, wherein the back side conductive structure faces the plurality of front side dummy patterns, and the buffer bumps physically connect the plurality of front side dummy patterns and the back side conductive structure.

20. The package of claim 19, wherein the back side conductive structure has a greater width than the front side dummy patterns.

21. A semiconductor package, comprising:

a first chip having a plurality of through-via structures electrically connected to a first plurality of conductive patterns on a first side of the first chip and to a second plurality of conductive patterns on a second side of the first chip, and further having a conductive structure formed on the second side of the first chip isolated from the second plurality of conductive patterns, wherein the conductive structure includes a portion contacting a third side of the first chip and extending to contact an opposite fourth side of the first chip;

a second chip having a third plurality of conductive patterns on a first side of the second chip, wherein the third plurality of conductive patterns is electrically connected to the second plurality of conductive patterns; and a thermal interface material (TIM) layer in contact with the third and fourth sides of the first chip such that the TIM layer is in contact with the conductive structure.

22. The semiconductor package of claim 21, wherein at least one of the plurality of through-via structures is connected to ground and connected to the conductive structure.

23. The semiconductor package of claim 21, further comprising a heat spreader in contact with the TIM layer.

* * * * *